(12) United States Patent
Or-Bach et al.

(10) Patent No.: US 9,691,869 B2
(45) Date of Patent: Jun. 27, 2017

(54) SEMICONDUCTOR DEVICES AND STRUCTURES

(71) Applicant: Monolithic 3D Inc., San Jose, CA (US)

(72) Inventors: Zvi Or-Bach, San Jose, CA (US); Deepak C. Sekar, San Jose, CA (US); Brian Cronquist, San Jose, CA (US)

(73) Assignee: Monolithic 3D Inc., San Jose, CA (US)

( * ) Notice: Subject to any disclaimer, the term of this patent is extended or adjusted under 35 U.S.C. 154(b) by 0 days.

(21) Appl. No.: 14/880,276

(22) Filed: Oct. 11, 2015

(65) Prior Publication Data

US 2016/0035722 A1 Feb. 4, 2016

Related U.S. Application Data

(63) Continuation-in-part of application No. 14/472,108, filed on Aug. 28, 2014, now Pat. No. 9,305,867, (Continued)

(51) Int. Cl.
| | |
|---|---|
| *H01L 29/76* | (2006.01) |
| *H01L 29/94* | (2006.01) |
| *H01L 31/062* | (2012.01) |
| *H01L 31/113* | (2006.01) |
| *H01L 31/119* | (2006.01) |
| *H01L 29/00* | (2006.01) |
| *H01L 29/45* | (2006.01) |
| *H01L 29/66* | (2006.01) |
| *H01L 23/544* | (2006.01) |
| *H01L 21/8234* | (2006.01) |
| *H01L 27/06* | (2006.01) |
| *H01L 27/092* | (2006.01) |
| *H01L 21/768* | (2006.01) |
| *H01L 23/48* | (2006.01) |

(Continued)

(52) U.S. Cl.
 CPC ...... *H01L 29/456* (2013.01); *H01L 21/76898* (2013.01); *H01L 21/823475* (2013.01); *H01L 23/481* (2013.01); *H01L 23/544* (2013.01); *H01L 27/0688* (2013.01); *H01L 27/088* (2013.01); *H01L 27/092* (2013.01); *H01L 29/66704* (2013.01); *H01L 27/0886* (2013.01); *H01L 27/1203* (2013.01); *H01L 2924/0002* (2013.01)

(58) Field of Classification Search
 CPC ................ H01L 23/544; H01L 27/088; H01L 29/66704; H01L 29/456
 USPC ................................................ 257/369, 499
 See application file for complete search history.

(56) References Cited

U.S. PATENT DOCUMENTS 5,563,084 A * 10/1996 Ramm ................ H01L 21/6835
 148/DIG. 135
7,521,806 B2 * 4/2009 Trezza .............. H01L 21/76898
 257/774
(Continued)

OTHER PUBLICATIONS

Stanley Wolf, Silicon Processing for the VSLI ERA, vol. 4, 2002, Lattice Press p. 604.*

*Primary Examiner* — David S Blum
(74) *Attorney, Agent, or Firm* — Tran & Associates

(57) ABSTRACT

An Integrated Circuit device, including: a first layer including first transistors; and a second layer including second transistors overlaying the first layer, where the first transistors are facing down and the second transistors are facing up, and where the second layer includes a through layer via of less than 300 nm diameter.

19 Claims, 76 Drawing Sheets

Related U.S. Application Data which is a continuation of application No. 13/959,994, filed on Aug. 6, 2013, now Pat. No. 8,836,073, which is a continuation of application No. 13/441,923, filed on Apr. 9, 2012, now Pat. No. 8,557,632.

(51) Int. Cl.
*H01L 27/088* (2006.01)
*H01L 27/12* (2006.01)

(56) References Cited

U.S. PATENT DOCUMENTS 8,841,777 B2 * 9/2014 Farooq ............... H01L 21/2007
257/777
9,000,557 B2 * 4/2015 Or-Bach ............ H01L 21/8221
257/506

* cited by examiner

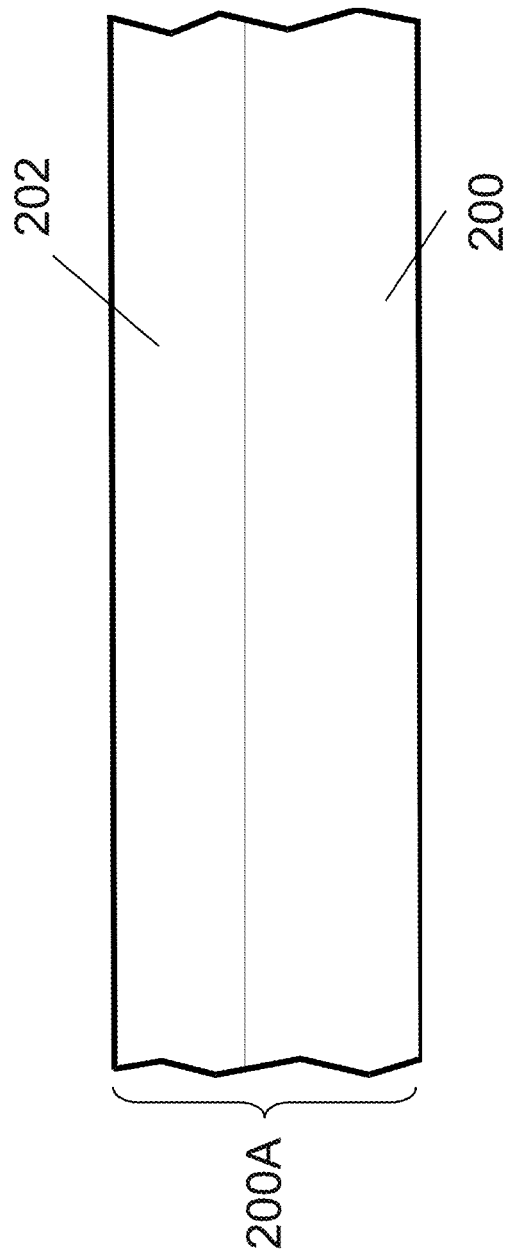

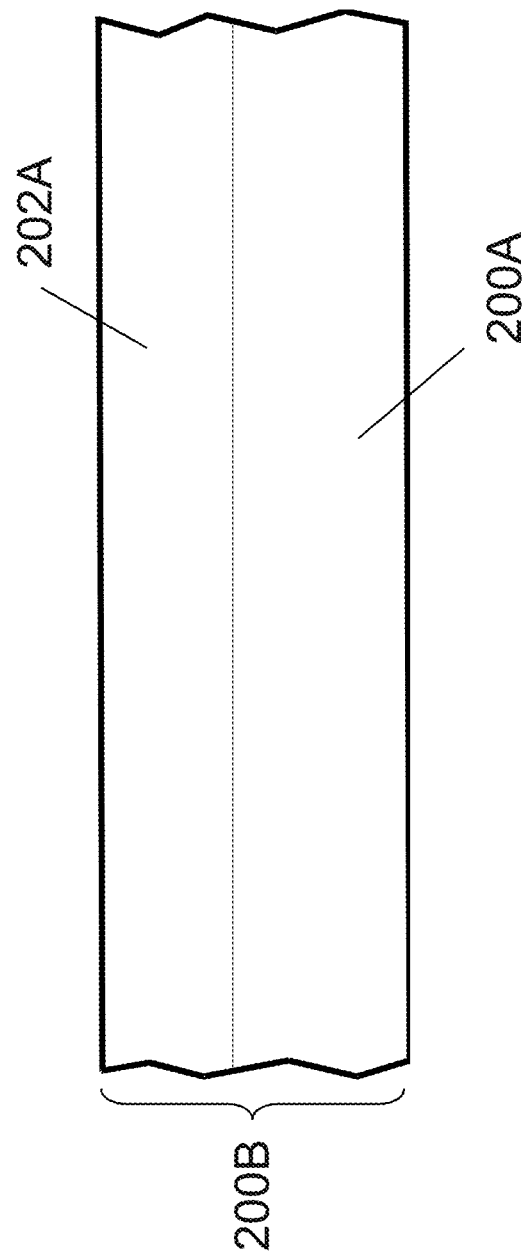

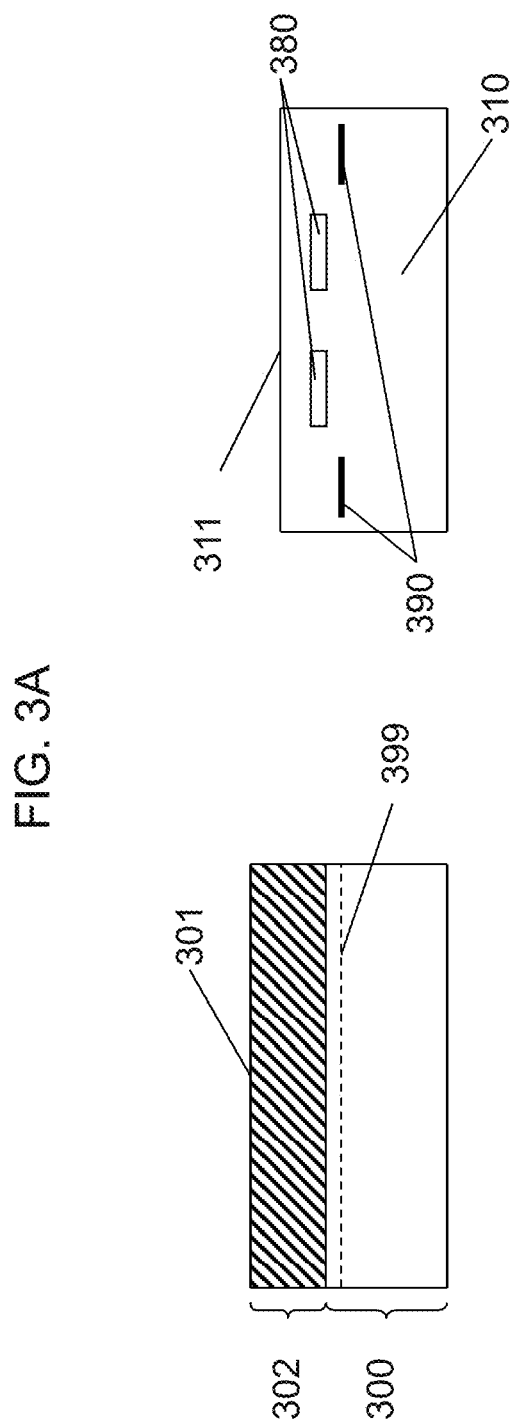

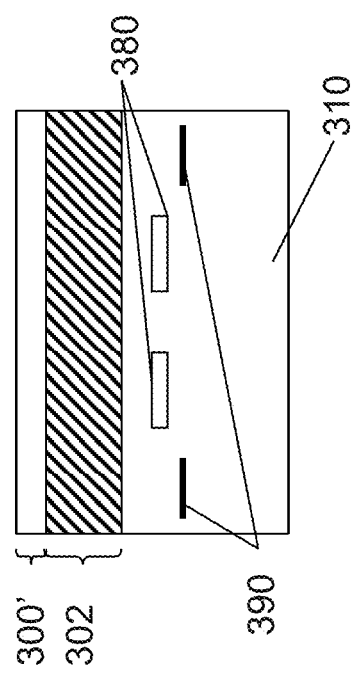

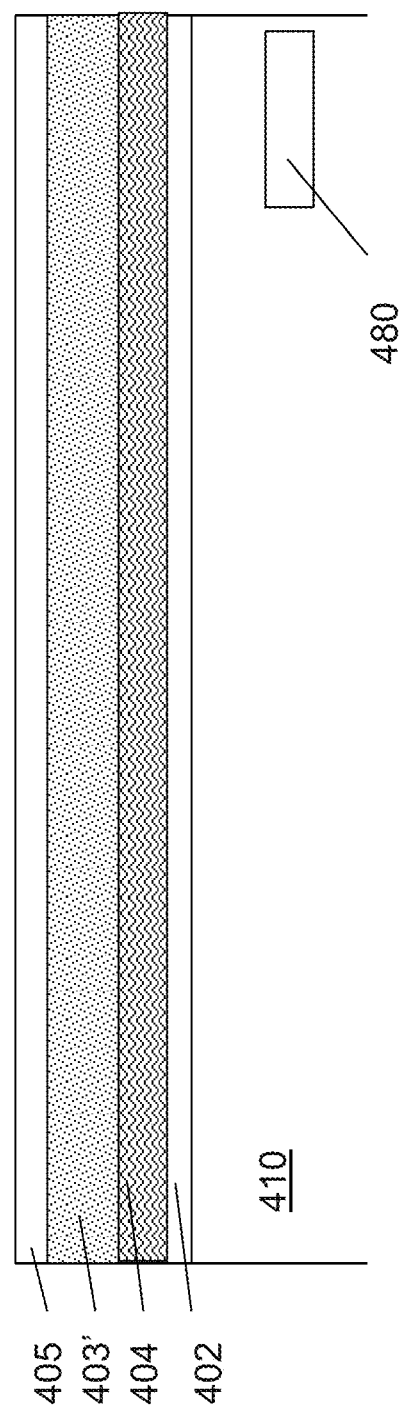

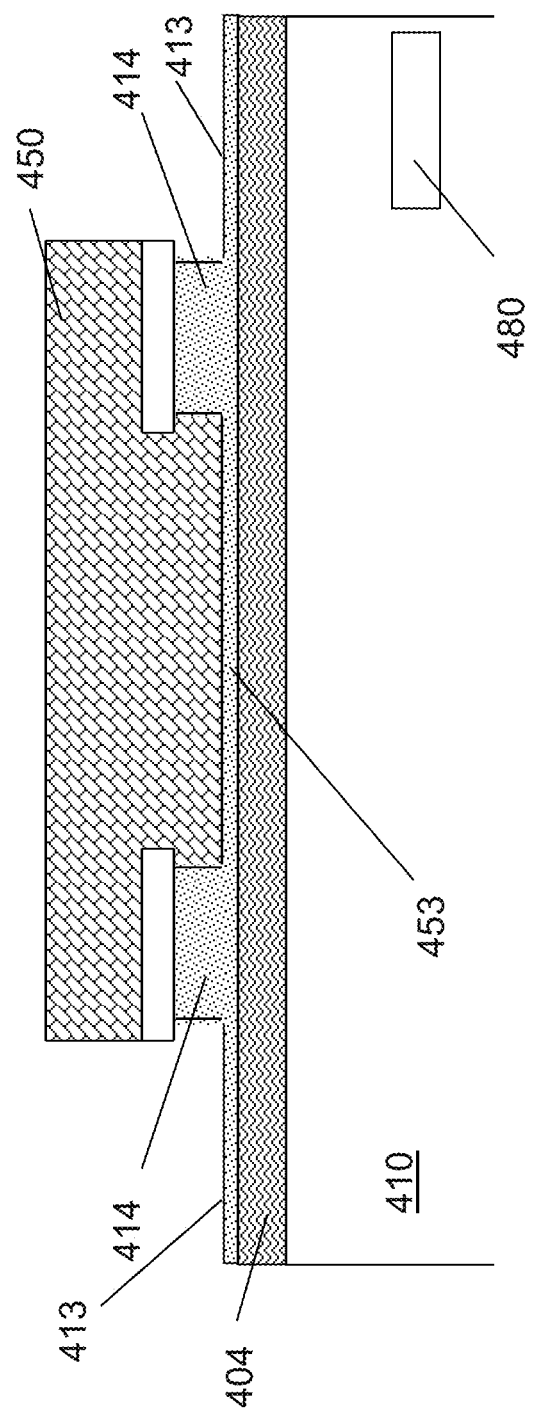

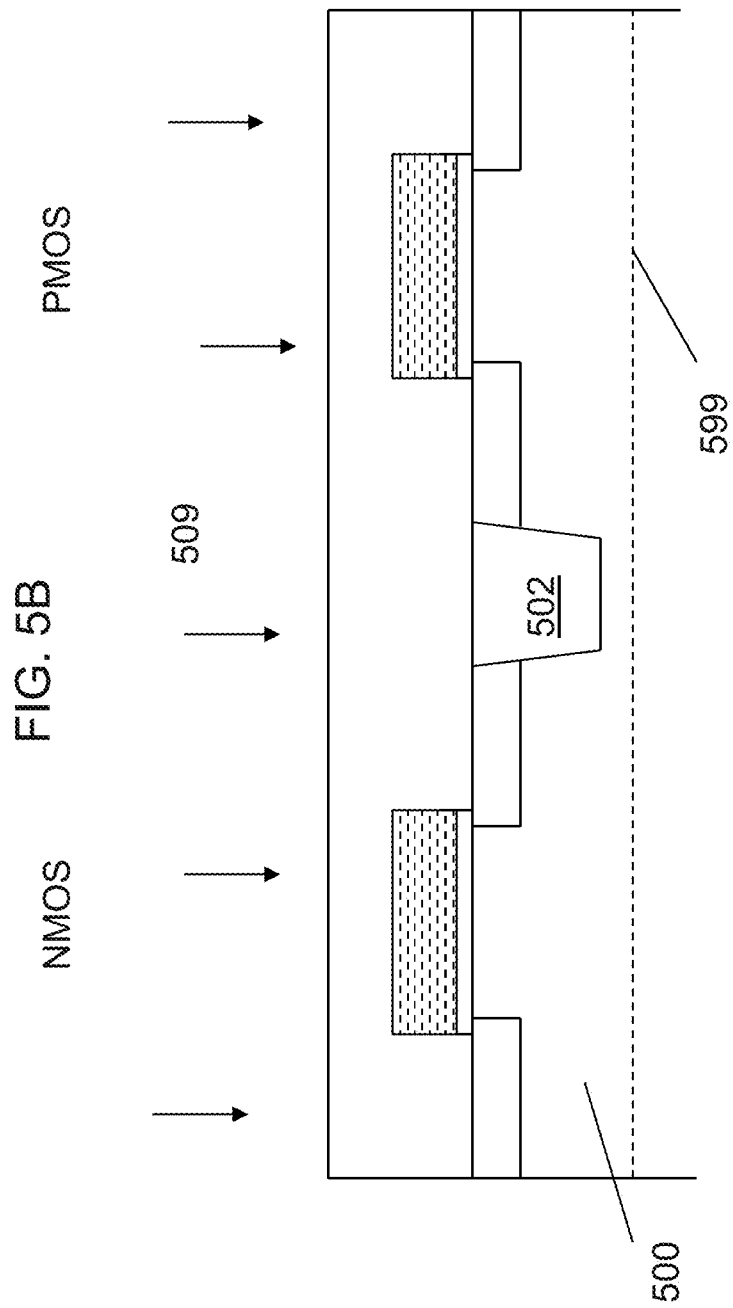

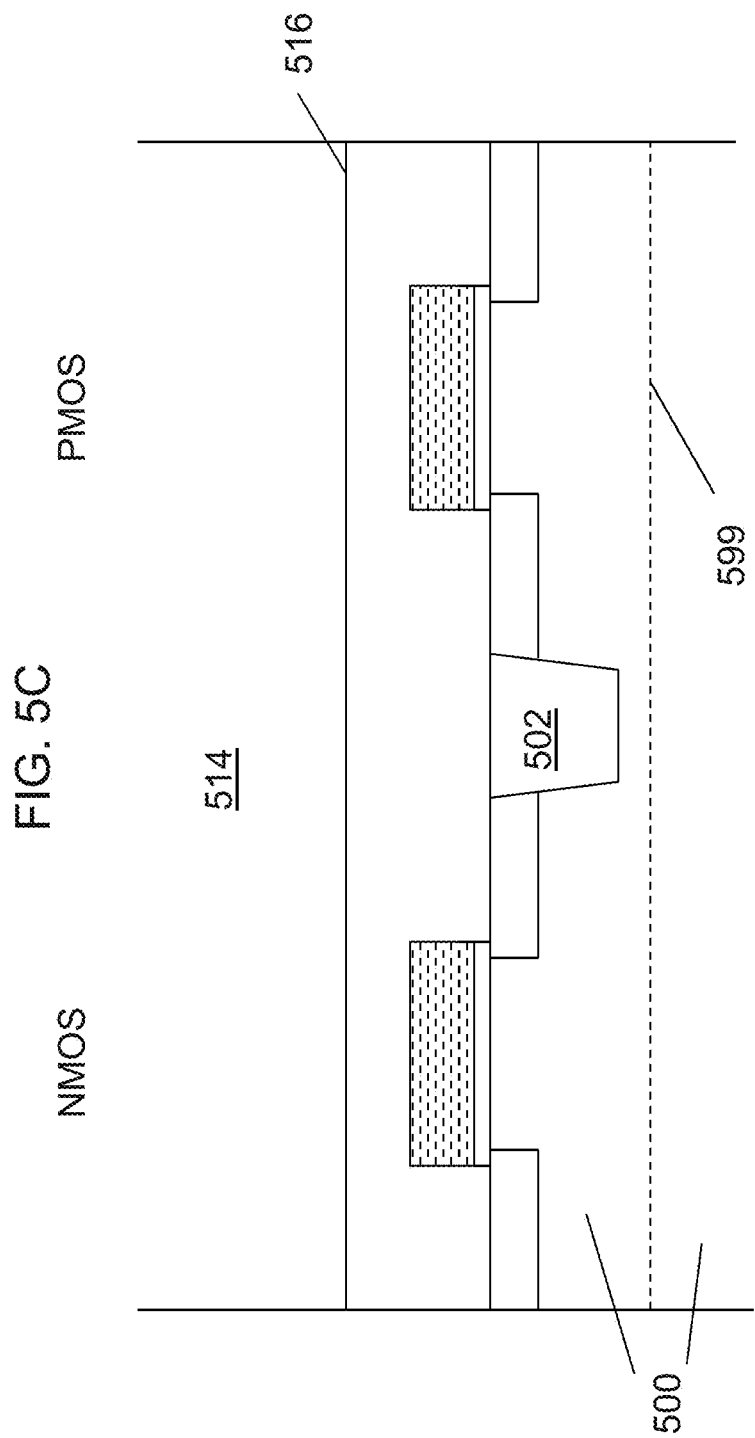

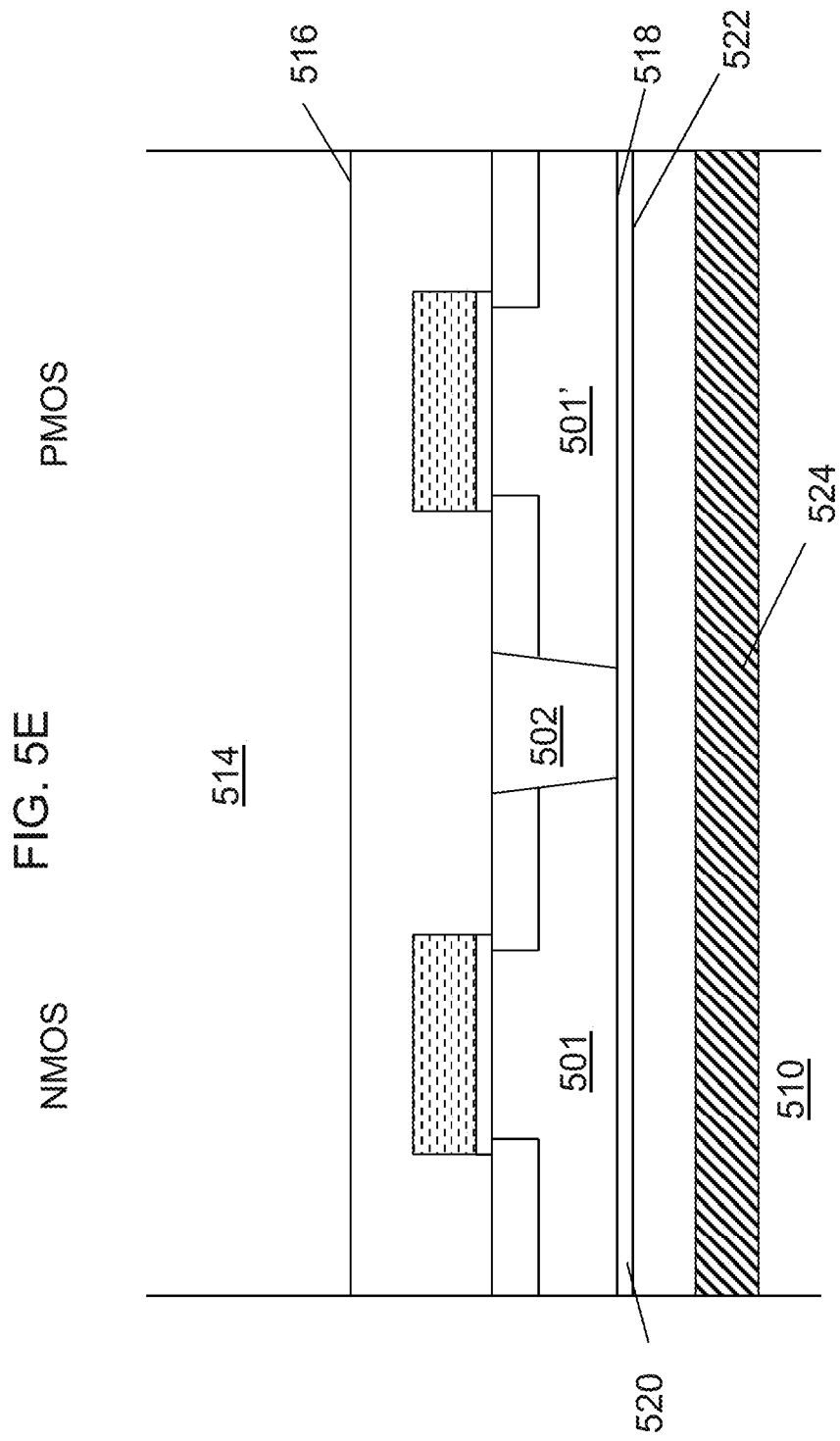

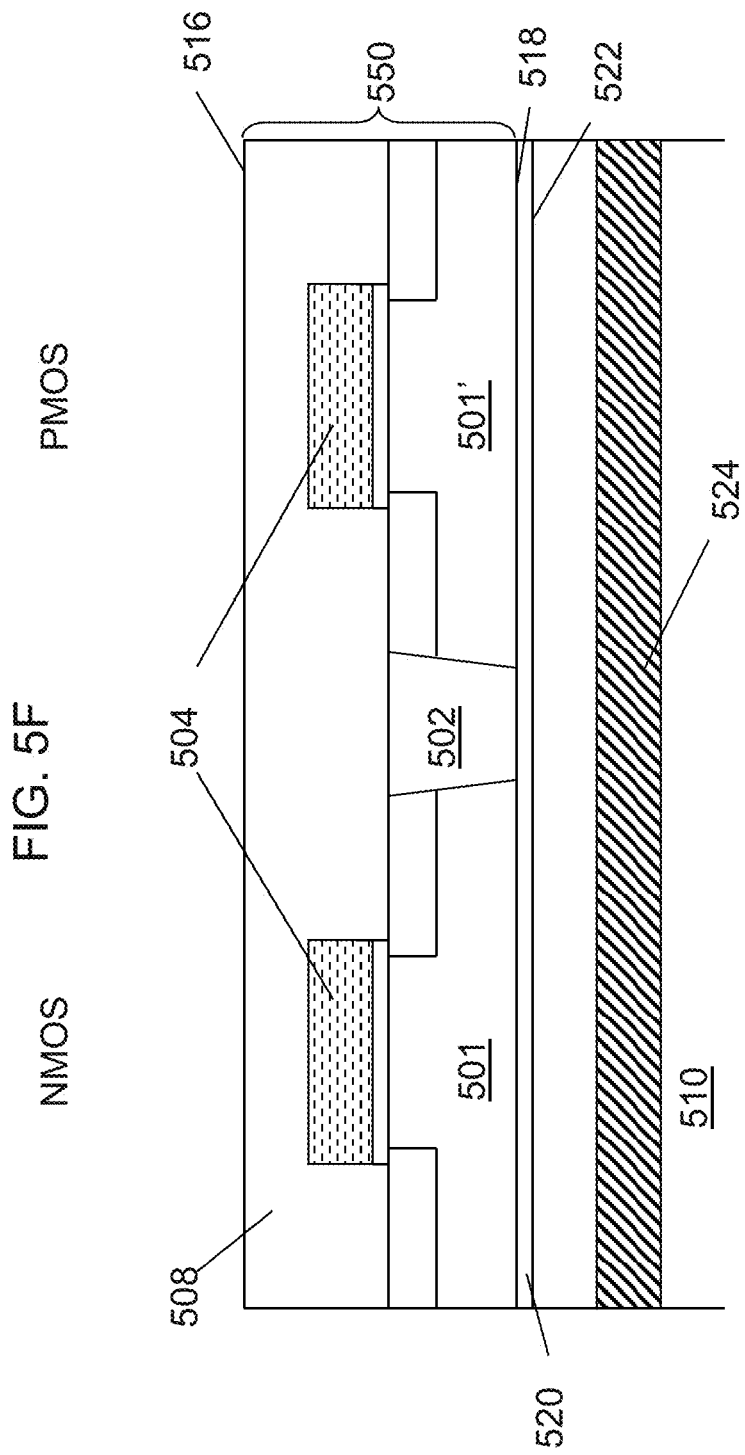

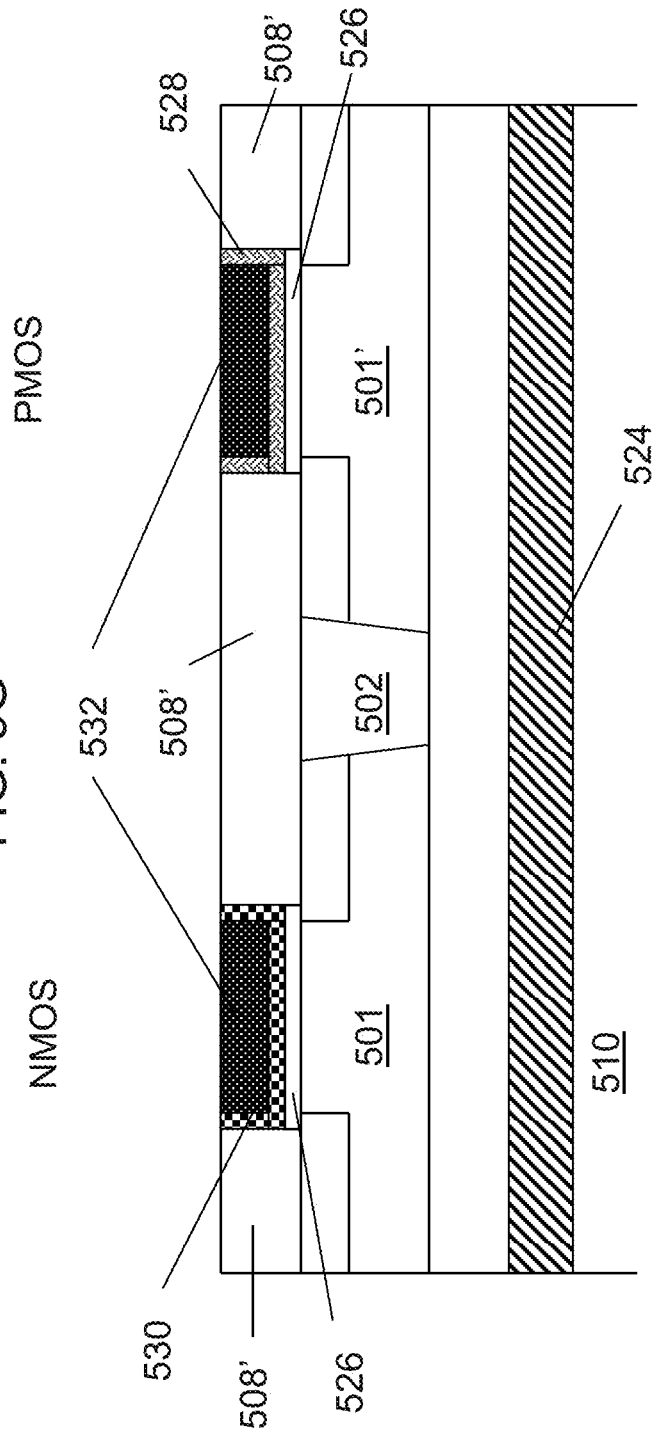

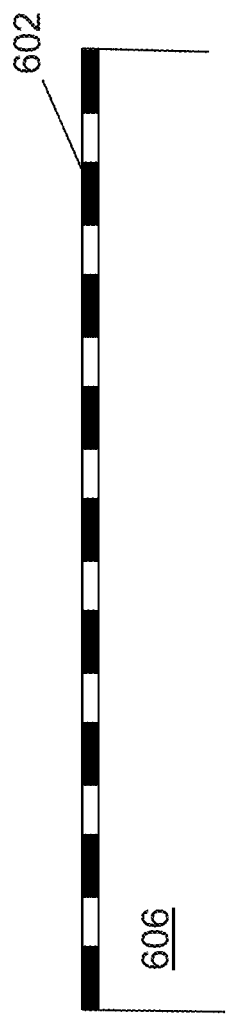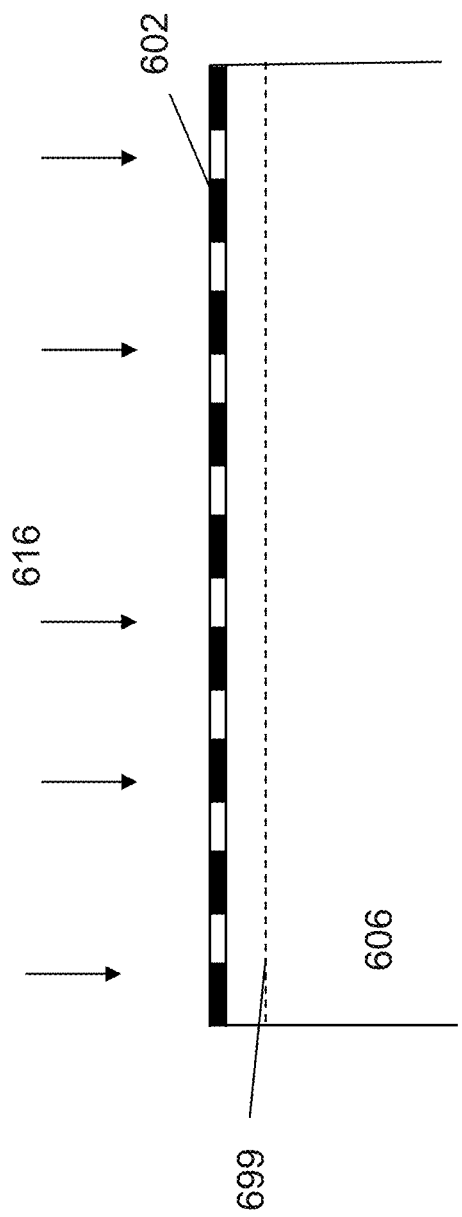

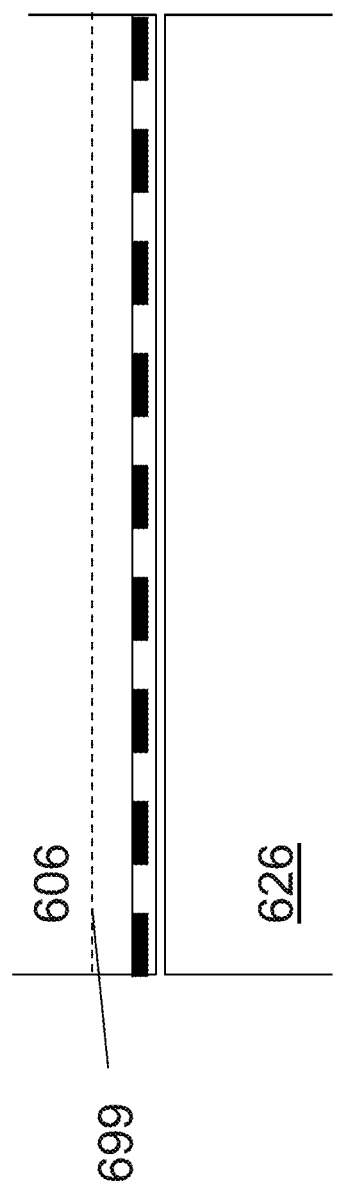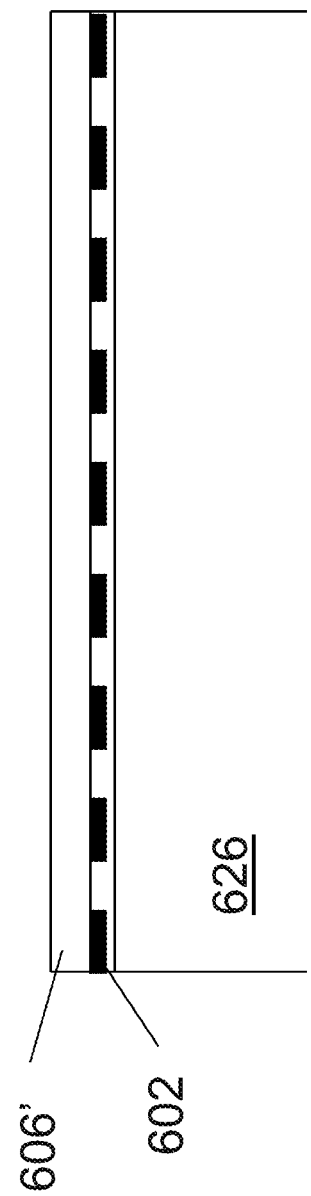

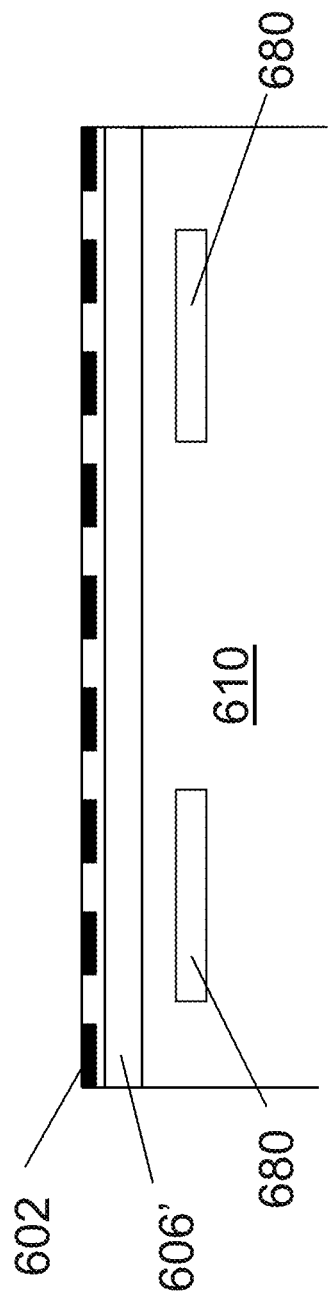

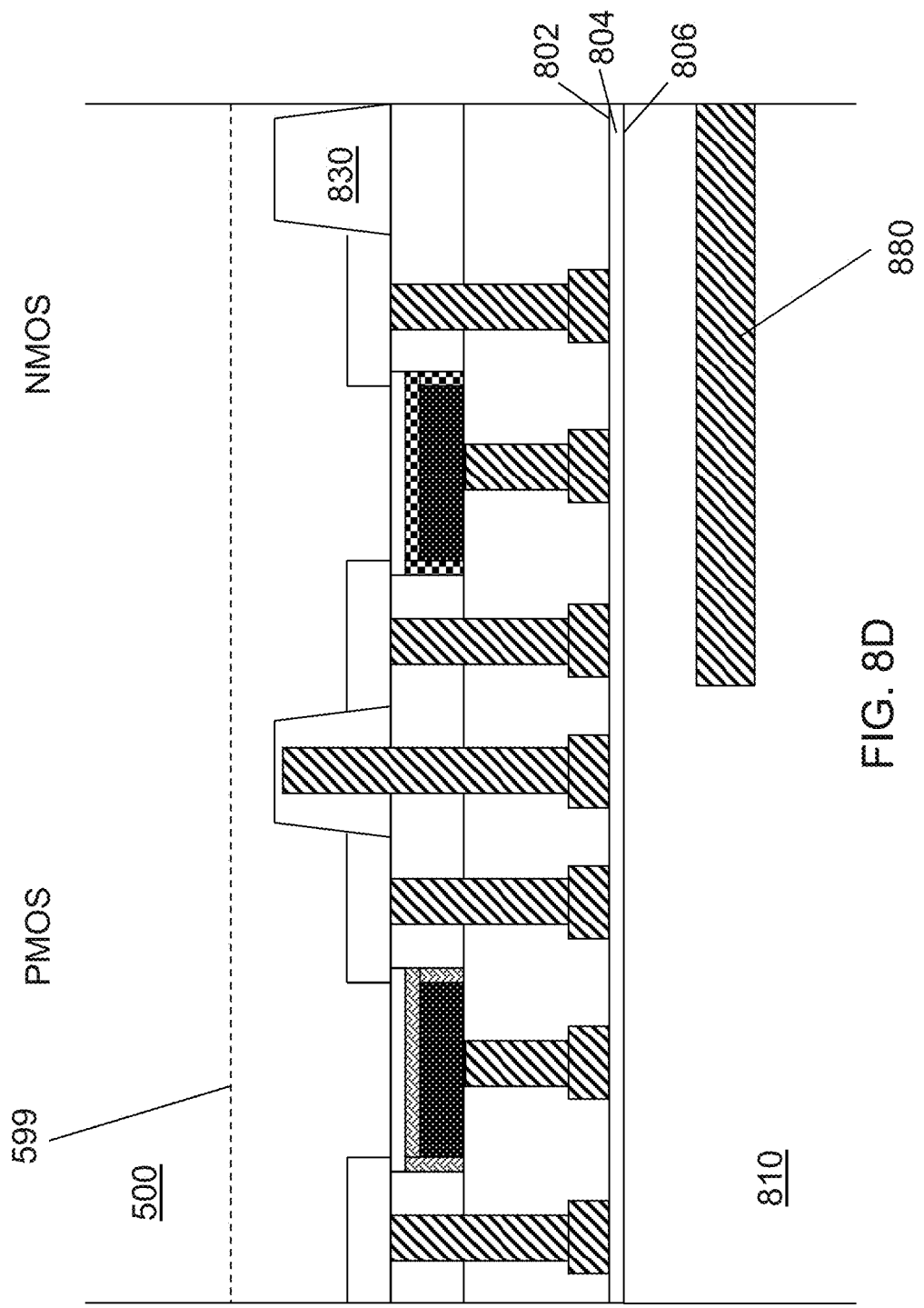

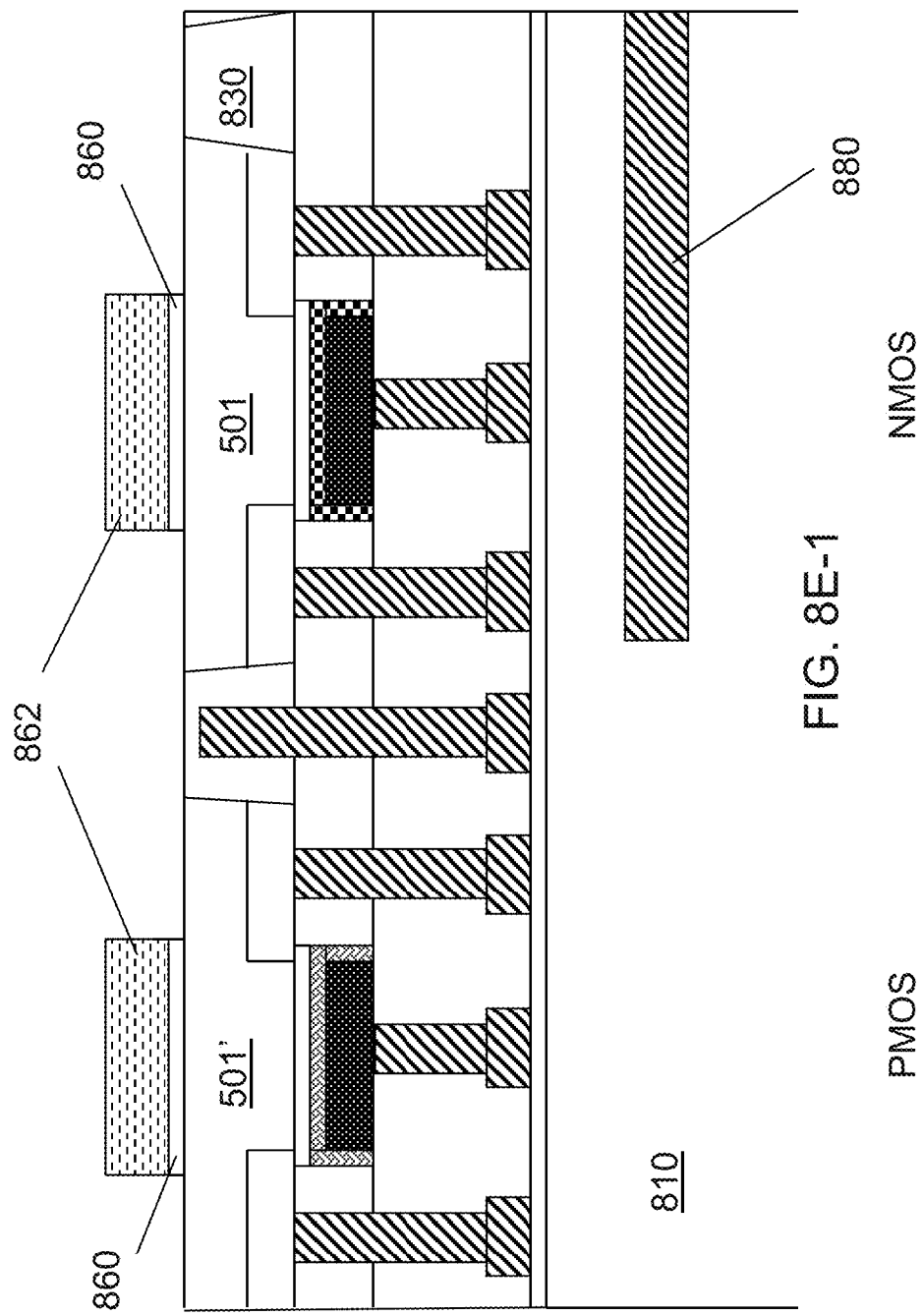

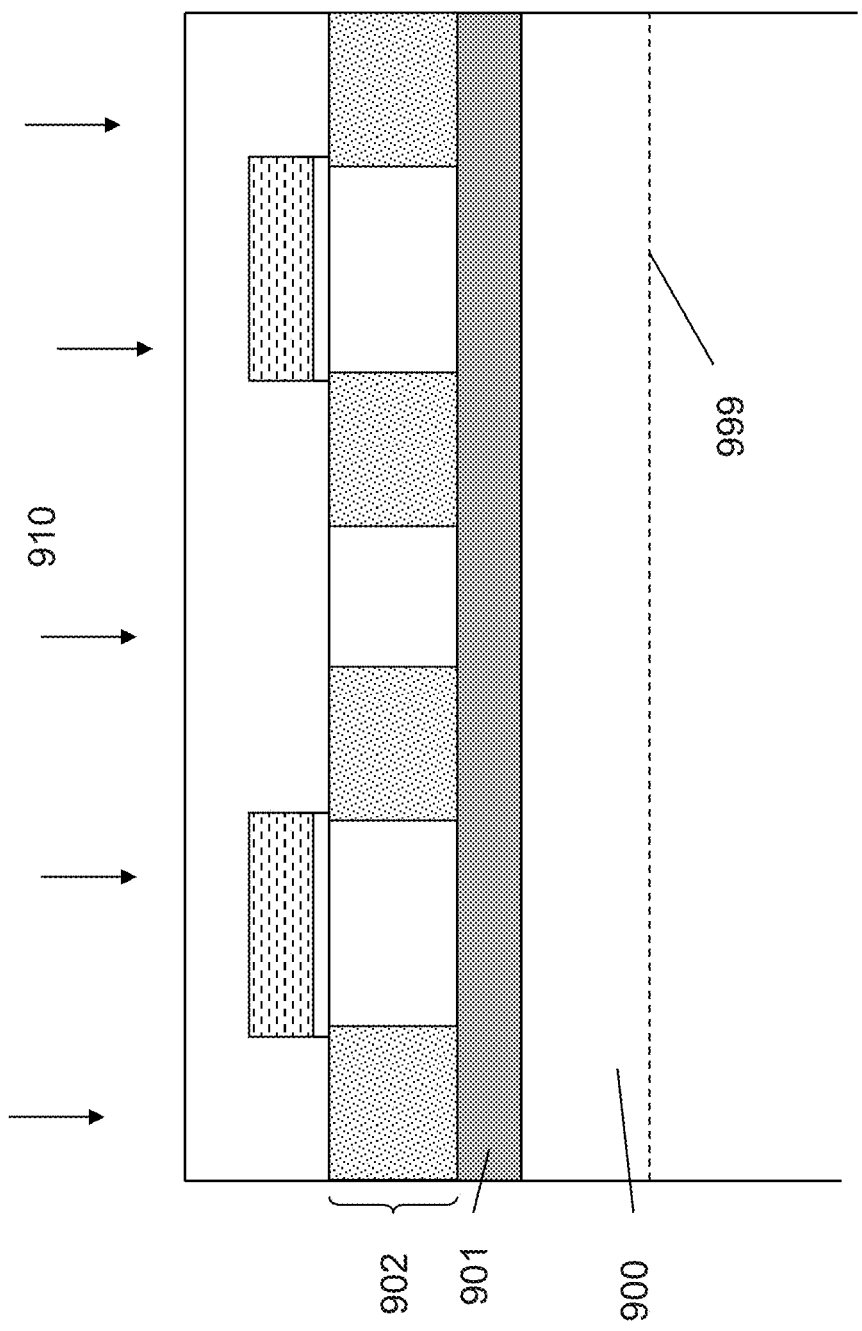

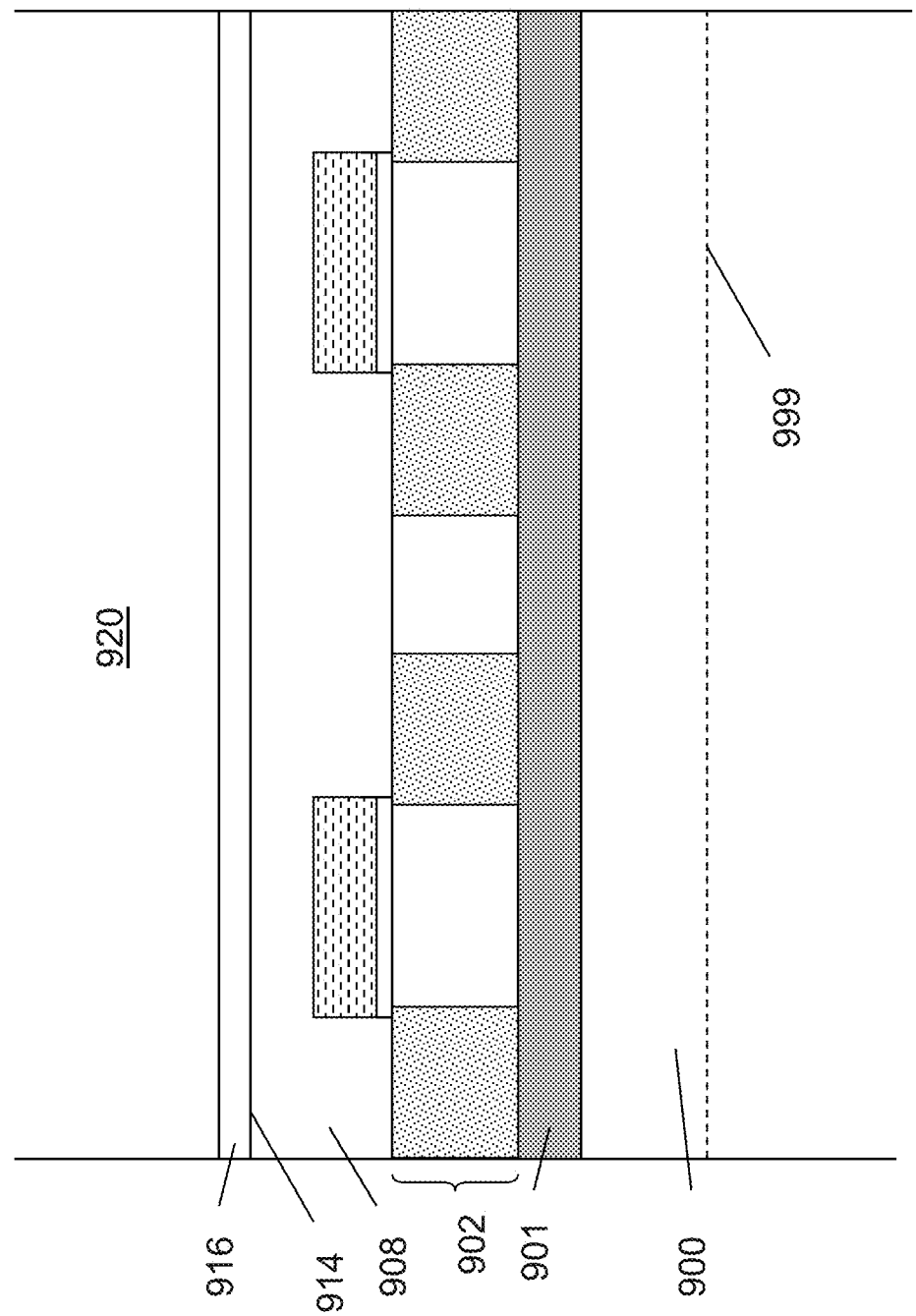

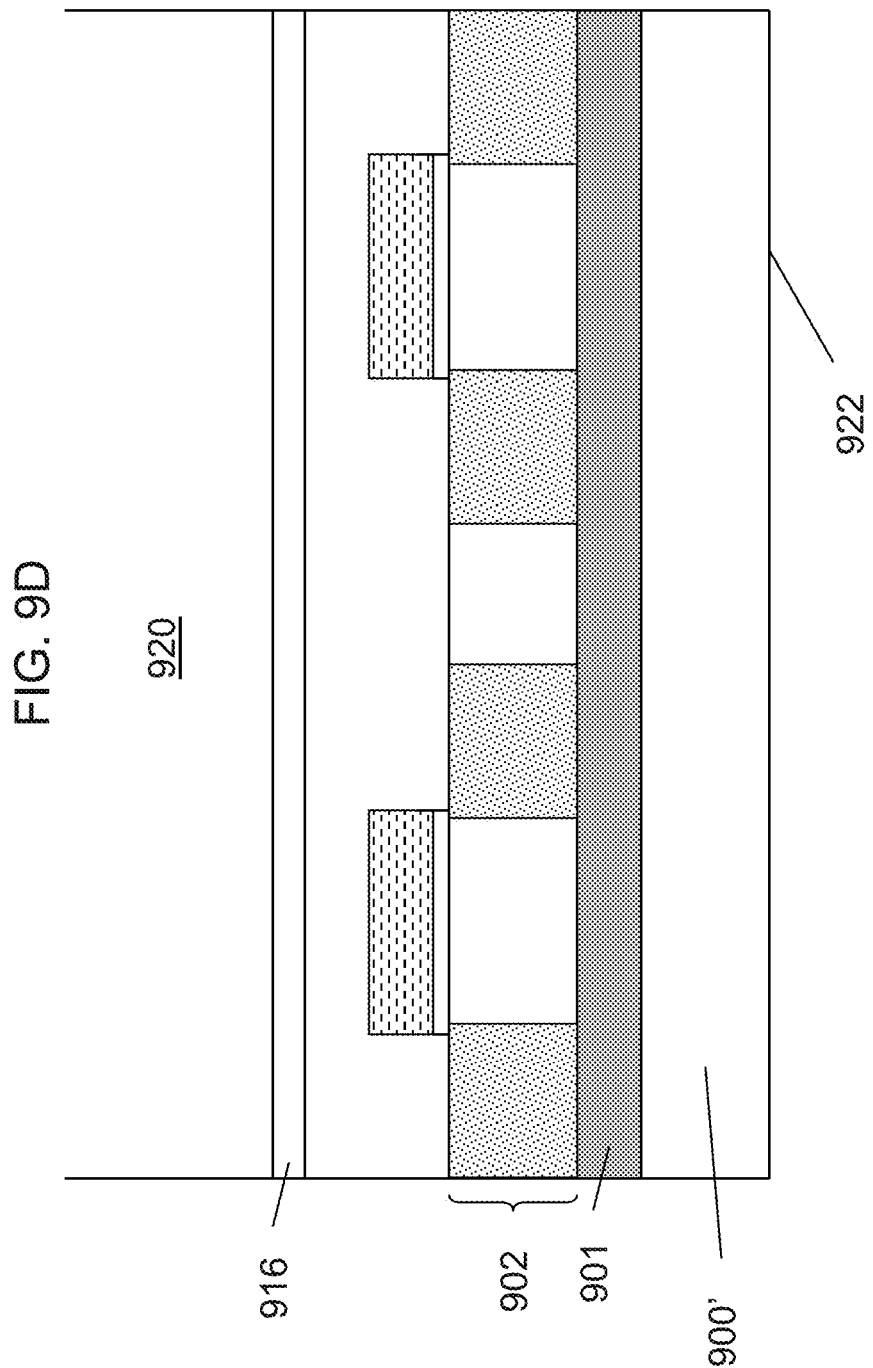

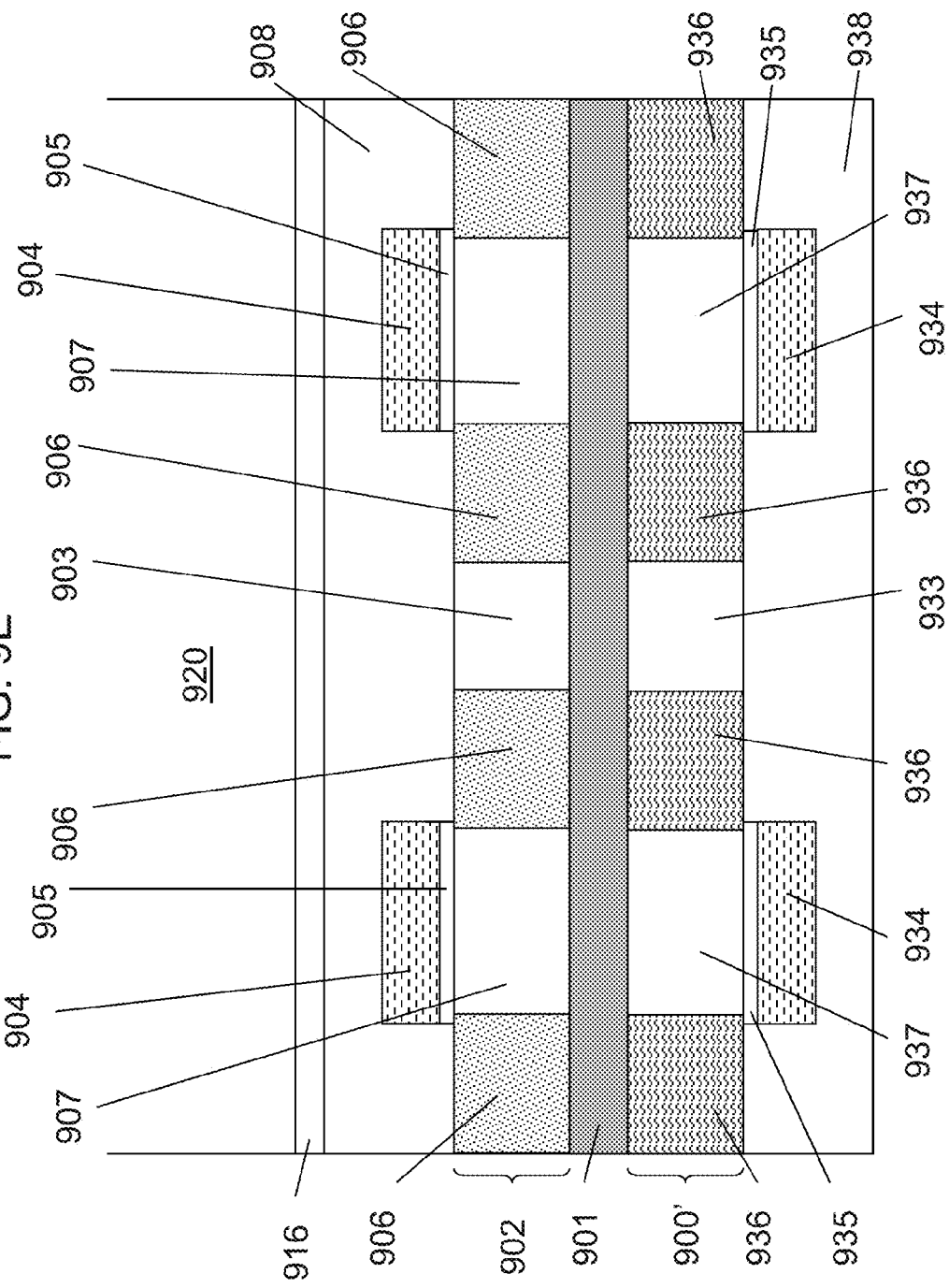

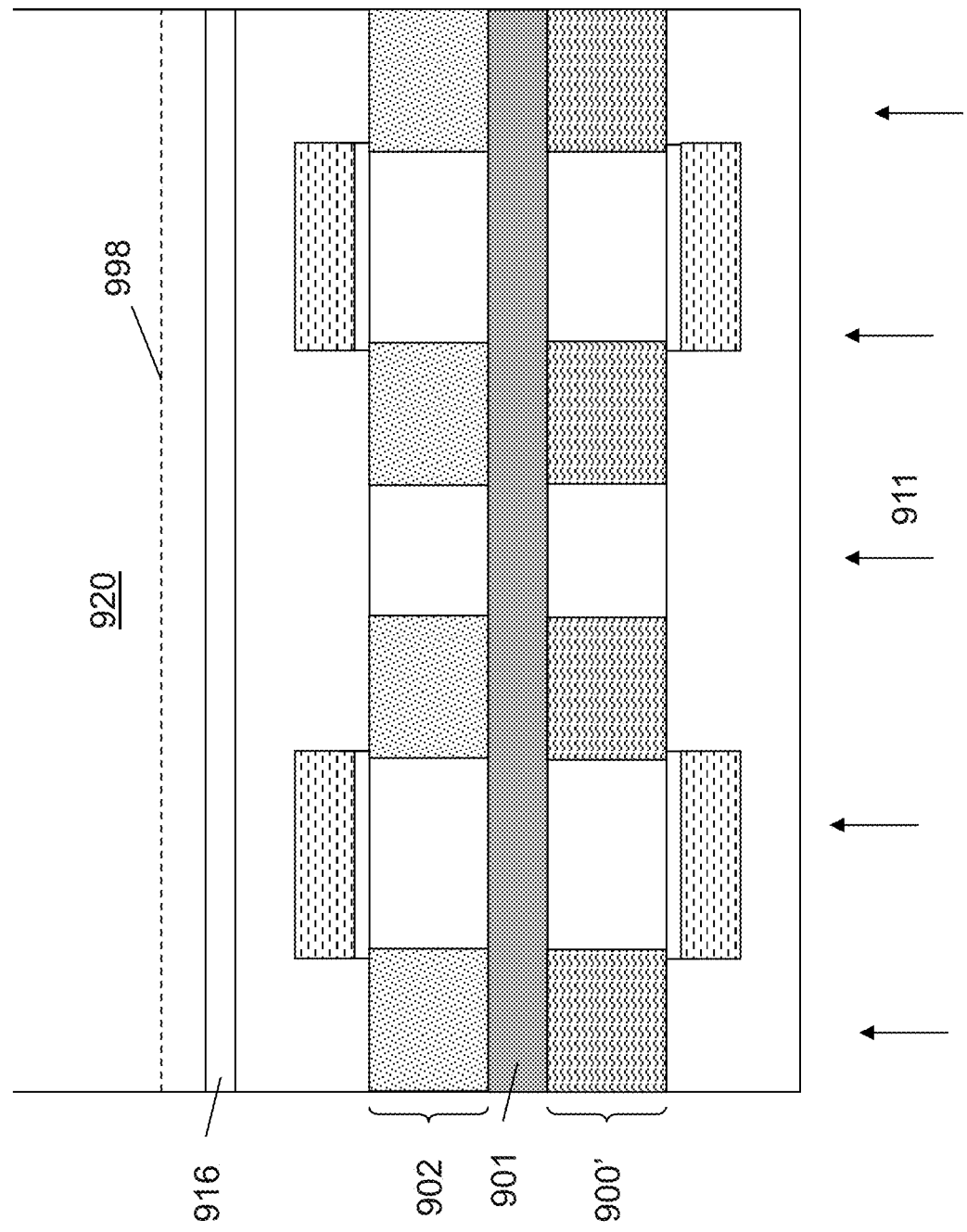

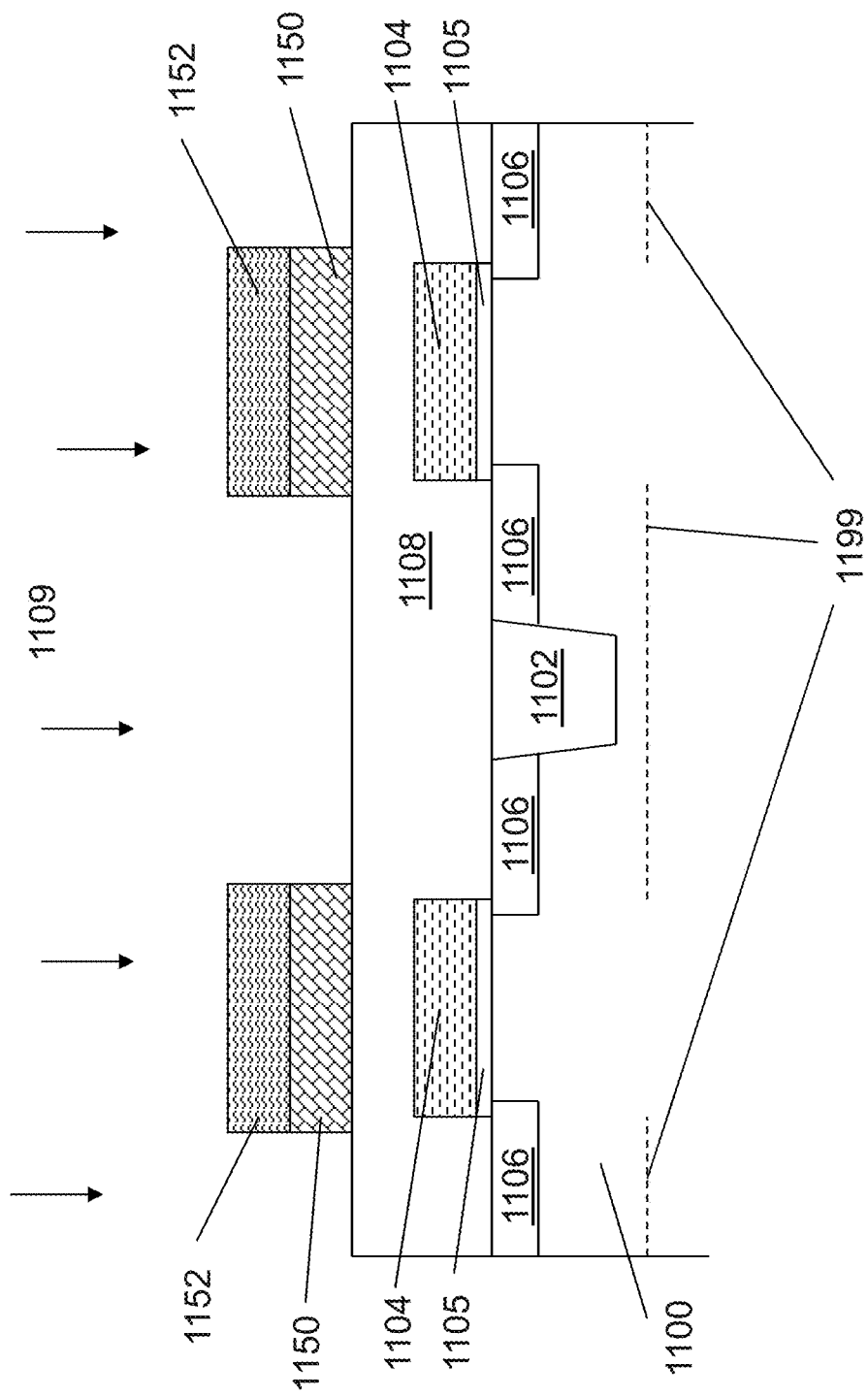

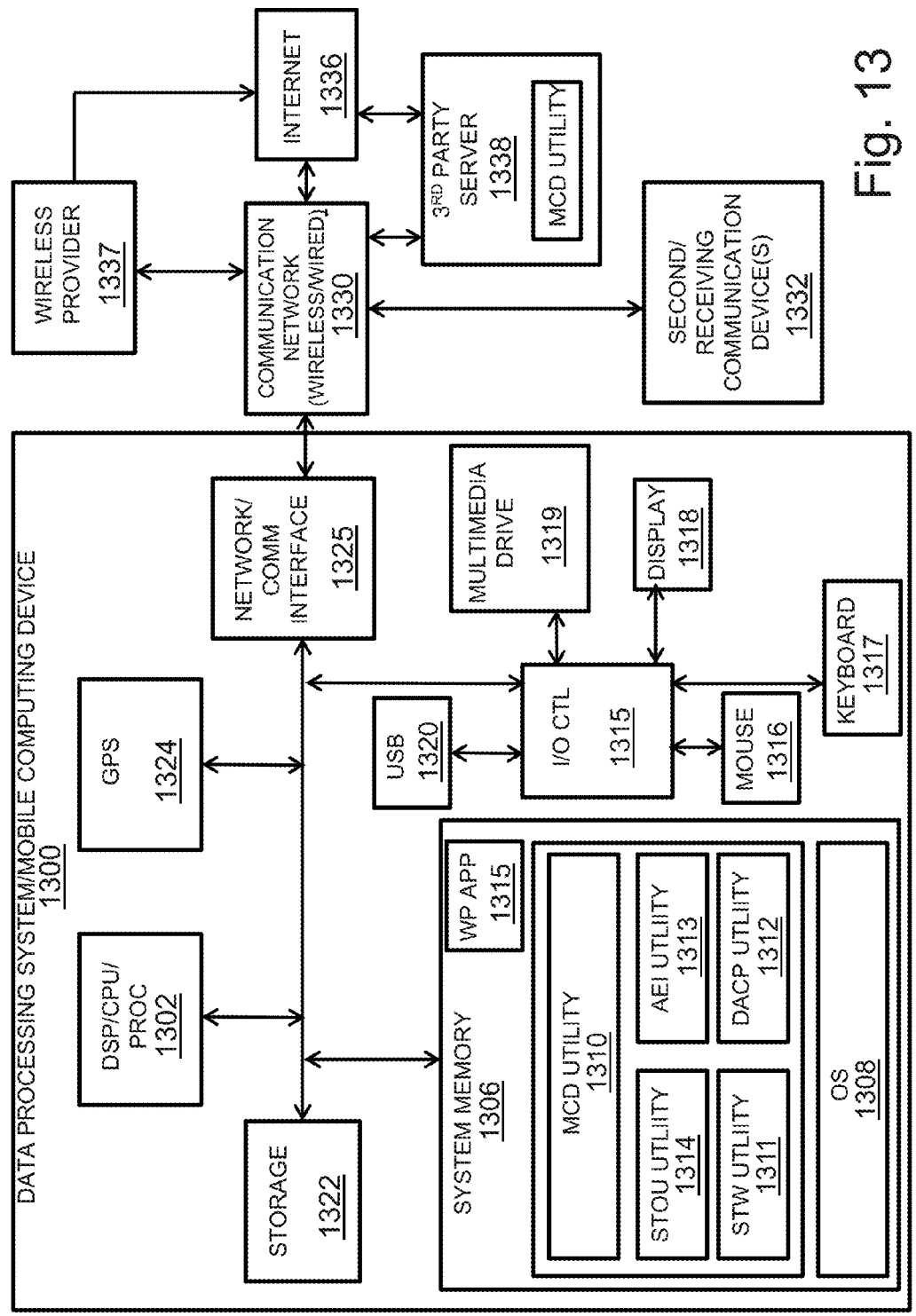

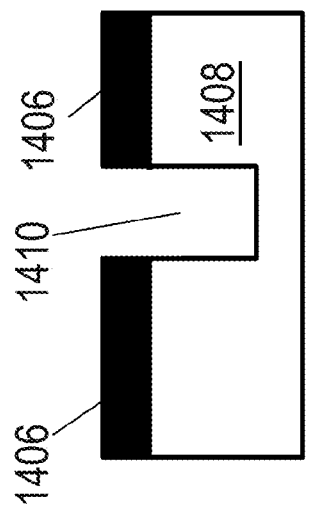
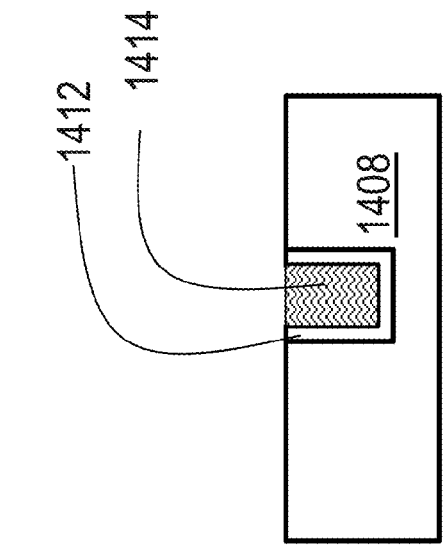
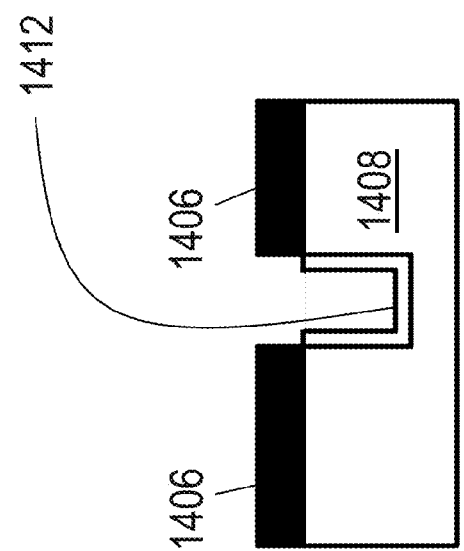

SEMICONDUCTOR DEVICES AND STRUCTURES

CROSS-REFERENCE OF RELATED APPLICATION

This application is a continuation-in-part application of U.S. patent application Ser. No. 14/472,108, which was filed on Aug. 28, 2014 (now U.S. Pat. No. 9,305,867 issues on Apr. 5, 2016), which is a continuation application of U.S. patent application Ser. No. 13/959,994, which was filed on Aug. 6, 2013 (now U.S. Pat. No. 8,836,073 issued on Sep. 25, 2014), which is a continuation application of U.S. patent application Ser. No. 13/441,923, which was filed on Apr. 9, 2012 (now U.S. Pat. No. 8,557,632 issued on Oct. 15, 2013), the entire contents of the foregoing are incorporated herein by reference.

BACKGROUND OF THE INVENTION

1. Field of the Invention

This application relates to the general field of Integrated Circuit (IC) devices and fabrication methods, and more particularly to multilayer or Three Dimensional Integrated Circuit (3D IC) devices and fabrication methods.

2. Discussion of Background Art

Performance enhancements and cost reductions in generations of electronic device technology has generally been achieved by reducing the size of the device, resulting in an enhancement in device speed and a reduction in the area of the device, and hence, its cost. This may be generally referred to as 'device scaling'. The dominant electronic device technology in use today may be the Metal-Oxide-Semiconductor field effect transistor (MOSFET) technology.

Performance and cost are driven by transistor scaling and the interconnection, or wiring, between those transistors. As the dimensions of the device elements have approached the nanometer scale, the interconnection wiring now dominates the performance, power, and density of integrated circuit devices as described in J. A. Davis, et. al., Proc. IEEE, vol. 89, no. 3, pp. 305-324, March 2001 (Davis).

Davis further teaches that three dimensional integrated circuits (3D ICs), i.e. electronic chips in which active layers of transistors are stacked one above the other, separated by insulating oxides and connected to each other by metal interconnect wires, may be the best way to continue Moore's Law, especially as device scaling slows, stops, or becomes too costly to continue. 3D integration would provide shorter interconnect wiring and hence improved performance, lower power consumption, and higher density devices.

One approach to a practical implementation of a 3D IC independently processes two fully interconnected integrated circuits including transistors and wiring, thins one of the wafers, bonds the two wafers together, and then makes electrical connections between the bonded wafers with Thru Silicon Vias (TSV) that may be fabricated prior to or after the bonding. This approach may be less than satisfactory as the density of TSVs may be limited, because they may require large landing pads for the TSVs to overcome the poor wafer to wafer alignment and to allow for the large (about one to ten micron) diameter of the TSVs as a result of the thickness of the wafers bonded together. Additionally, handling and processing thinned silicon wafers may be very difficult and prone to yield loss. Current prototypes of this approach only obtain TSV densities of 10,000s per chip, in comparison to the millions of interconnections currently obtainable within a single chip.

By utilizing Silicon On Insulator (SOI) wafers and glass handle wafers, A. W. Topol, et. al, in the IEDM Tech Digest, p 363-5 (2005), describe attaining TSVs of tenths of microns. The TSV density may be still limited as a result from misalignment issues resulting from pre-forming the random circuitry on both wafers prior to wafer bonding. In addition, SOI wafers are more costly than bulk silicon wafers.

Another approach may be to monolithically build transistors on top of a wafer of interconnected transistors. The utility of this approach may be limited by the requirement to maintain the reliability of the high performance lower layer interconnect metallization, such as, for example, aluminum and copper, and low-k intermetal dielectrics, and hence limits the allowable temperature exposure to below approximately 400° C. Some of the processing steps to create useful transistor elements may require temperatures above about 700° C., such as activating semiconductor doping or crystallization of a previously deposited amorphous material such as silicon to create a poly-crystalline silicon (polysilicon or poly) layer. It may be very difficult to achieve high performance transistors with only low temperature processing and without mono-crystalline silicon channels. However, this approach may be useful to construct memory devices where the transistor performance may not be critical.

Bakir and Meindl in the textbook "Integrated Interconnect Technologies for 3D Nanosystems", Artech House, 2009, Chapter 13, illustrate a 3D stacked Dynamic Random Access Memory (DRAM) where the silicon for the stacked transistors is produced using selective epitaxy technology or laser recrystallization. This concept may be unsatisfactory as the silicon processed in this manner may have a higher defect density when compared to single crystal silicon and hence may suffer in performance, stability, and control. It may also require higher temperatures than the underlying metallization or low-k intermetal dielectric could be exposed to without reliability concerns.

Sang-Yun Lee in U.S. Pat. No. 7,052,941 discloses methods to construct vertical transistors by preprocessing a single crystal silicon wafer with doping layers activated at high temperature, layer transferring the wafer to another wafer with preprocessed circuitry and metallization, and then forming vertical transistors from those doping layers with low temperature processing, such as etching silicon. This may be less than satisfactory as the semiconductor devices in the market today utilize horizontal or horizontally oriented transistors and it would be very difficult to convince the industry to move away from the horizontal. Additionally, the transistor performance may be less than satisfactory as a result from large parasitic capacitances and resistances in the vertical structures, and the lack of self-alignment of the transistor gate.

A key technology for 3D IC construction may be layer transfer, whereby a thin layer of a silicon wafer, called the donor wafer, may be transferred to another wafer, called the acceptor wafer, or target wafer. As described by L. DiCioccio, et. al., at ICICDT 2010 pg 110, the transfer of a thin (about tens of microns to tens of nanometers) layer of mono-crystalline silicon at low temperatures (below approximately 400° C.) may be performed with low temperature direct oxide-oxide bonding, wafer thinning, and surface conditioning. This process is called "Smart Stacking" by Soitec (Crolles, France). In addition, the "SmartCut" process is a well understood technology used for fabrication of SOI wafers. The "SmartCut" process employs a hydrogen implant to enable cleaving of the donor wafer after the layer transfer. These processes with some variations and under different names may be commercially available from SiGen (Silicon Genesis Corporation, San Jose, Calif.). A room temperature wafer bonding process utilizing ion-beam preparation of the wafer surfaces in a vacuum has been recently demonstrated by Mitsubishi Heavy Industries Ltd., Tokyo, Japan. This process allows room temperature layer transfer. There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D approaches are described in U.S. Pat. Nos. 8,273,610, 8,557,632, 8,298,875, 8,642,416, 8,362,482, 8,378,715, 8,379,458, 8,450,804, 8,574,929, 8,581,349, 8,642,416, 8,687,399, 8,742,476, 8,674,470, 8,803,206, 8,902,663, 8,994,404, 9,021,414, 9,023,688, 9,030,858, 9,117,749; US patent publications 2011/0092030 and 2013/0020707; and pending U.S. patent applications, 62/077,280, 62/042,229, Ser. Nos. 13/803,437, 61/932,617, 14/607,077, 14/642,724, 62/139,636, 62/149,651, and 62/198,126. The entire contents of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, and U.S. patent application Ser. Nos. 13/274,161 and 14/461,539. The entire contents of the foregoing patents, publications, and applications are incorporated herein by reference.

Additionally the 3D technology according to some embodiments of the invention may enable some very innovative IC alternatives with reduced development costs, increased yield, and other illustrative benefits.

SUMMARY

The invention may be directed to multilayer or Three Dimensional Integrated Circuit (3D IC) devices and fabrication methods.

In one aspect, An Integrated Circuit device, including: a first layer including first transistors; and a second layer including second transistors overlaying the first layer, where the first transistors are facing down and the second transistors are facing up, and where the second layer includes a through layer via of less than 300 nm diameter.

In an additional aspect, an Integrated Circuit device, including: a first layer including first transistors; a second layer including second transistors overlaying the first layer; and a first metal layer providing interconnection for the first transistors, the first metal layer is disposed either between the first layer and the second layer, or underneath the first layer, where the first metal layer includes aluminum or copper, where at least one of the second transistors is aligned to the first transistor with a less than 40 nm alignment error, where the second layer includes a region of high quality oxide isolation, and where the high quality oxide isolation has a leakage current of less than one picoamp per micron at device power supply and 25° C.

In an additional aspect, an Integrated Circuit device, including: a first layer including first transistors; a second layer including second transistors overlaying the first layer; and a first metal layer providing interconnection for the first transistors, the first metal layer is disposed either between the first layer and the second layer or underneath the first layer, where the first metal layer includes aluminum or copper, where at least one of the second transistors is aligned to the first transistor with a less than 40 nm alignment error, and where the second transistor includes silicided contacts.

BRIEF DESCRIPTION OF THE DRAWINGS

Various embodiments of the invention will be understood and appreciated more fully from the following detailed description, taken in conjunction with the drawings in which:

FIG. 2A-2H are exemplary drawing illustrations of the preprocessed wafers and layers and generalized layer transfer;

FIG. 3A-3D are exemplary drawing illustrations of a generalized layer transfer process flow;

FIG. 4A-4I are exemplary drawing illustrations of the formation of a junction-less transistor;

FIG. 5A-5H are exemplary drawing illustrations of the formation of top planar transistors;

FIG. 6A-6G are exemplary drawing illustrations of the formation of top planar transistors;

FIG. 8A-8E, 8E-1, 8F, 8F-1, 8F-2 are exemplary drawing illustrations of the formation of top planar transistors;

FIG. 9A-9K are exemplary drawing illustrations of a formation of top planar transistors;

FIG. 11 is an exemplary drawing illustration of an implant shield structure;

FIG. 13 is a block diagram representation of an exemplary mobile computing device (MCD);

FIG. 14A-14D are exemplary drawing illustrations of a sub-400° C. process to construct shallow trench isolation regions.

DETAILED DESCRIPTION

Figure 1:
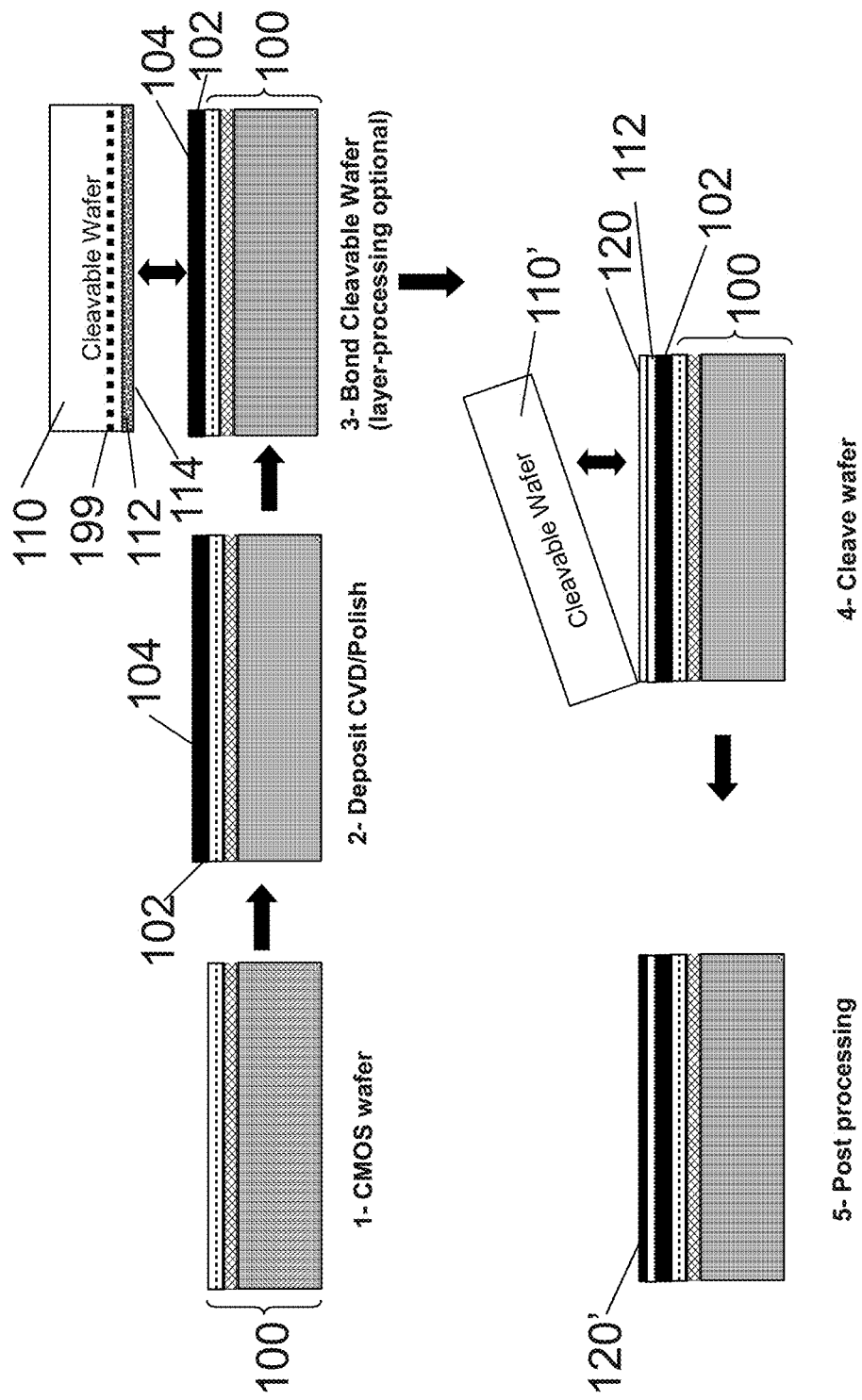
FIG. 1 is an exemplary drawing illustration of a layer transfer process flow.

Some embodiments of the invention are described herein with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Many figures may describe process flows for building devices. These process flows, which may be a sequence of steps for building a device, may have many structures, numerals and labels that may be common between two or more adjacent steps. In such cases, some labels, numerals and structures used for a certain step's figure may have been described in the previous steps' figures.

As illustrated in FIG. 1, a generalized single layer transfer procedure that utilizes the above techniques may begin with acceptor substrate 100, which may be a preprocessed CMOS silicon wafer, or a partially processed CMOS, or other prepared silicon or semiconductor substrate. CMOS may include n-type transistors and p-type transistors. Acceptor substrate 100 may include elements such as, for example, transistors, alignment marks, metal layers, and metal connection strips. The metal layers may be utilized to interconnect the transistors. The acceptor substrate may also be called target wafer. The acceptor substrate 100 may be prepared for oxide to oxide wafer bonding by a deposition of an oxide 102, and the acceptor substrate surface 104 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that changes the oxide surfaces so to lower the oxide to oxide bonding energy. In addition, polishes may be employed to achieve satisfactory flatness.

A donor wafer or substrate 110 may be prepared for cleaving by an implant or implants of atomic species, such as, for example, Hydrogen and Helium, to form a layer transfer demarcation plane 199, shown as a dashed line. Layer transfer demarcation plane 199 may be formed before or after other processing on the donor wafer or substrate 110. The donor wafer or substrate 110 may be prepared for oxide to oxide wafer bonding by a deposition of an oxide 112, and the donor wafer surface 114 may be made ready for low temperature bonding by various surface treatments, such as, for example, an RCA pre-clean that may include dilute ammonium hydroxide or hydrochloric acid, and may include plasma surface preparations, wherein gases such as oxygen, argon, and other gases or combinations of gases and plasma energies that change the oxide surfaces so to lower the oxide to oxide bonding energy. In addition, polishes may be employed to achieve satisfactory flatness. The donor wafer or substrate 110 may have prefabricated layers, structures, alignment marks, transistors or circuits.

Donor wafer or substrate 110 may be bonded to acceptor substrate 100, or target wafer, by bringing the donor wafer surface 114 in physical contact with acceptor substrate surface 104, and then applying mechanical force and/or thermal annealing to strengthen the oxide to oxide bond. Alignment of the donor wafer or substrate 110 with the acceptor substrate 100 may be performed immediately prior to the wafer bonding. Acceptable bond strengths may be obtained with bonding thermal cycles that do not exceed approximately 400° C.

The donor wafer or substrate 110 may be cleaved at or near the layer transfer demarcation plane 199 and removed leaving transferred layer 120 bonded and attached to acceptor substrate 100, or target wafer. The cleaving may be accomplished by various applications of energy to the layer transfer demarcation plane, such as, for example, a mechanical strike by a knife, or jet of liquid or jet of air, or by local laser heating, or other suitable cleaving methods that propagate a fracture or separation approximately at the layer transfer demarcation plane 199. The transferred layer 120 may be polished chemically and mechanically to provide a suitable surface for further processing. The transferred layer 120 may be of thickness approximately 200 nm or less to enable formation of nanometer sized thru layer vias and create a high density of interconnects between the donor wafer and acceptor wafer. The thinner the transferred layer 120, the smaller the thru layer via diameter obtainable, as a result of maintaining manufacturable via aspect ratios. Thus, the transferred layer 120 may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable lithographic resolution capability of the manufacturing process employed to create the thru layer vias or any other structures on the transferred layer or layers. The donor wafer or substrate 110 may now also be processed and reused for more layer transfers.

Transferred layer 120 may then be further processed to create a monolithic layer of interconnected devices 120' and the formation of thru layer vias (TLVs, or through-layer vias) to electrically couple (connection path) donor wafer circuitry with acceptor wafer circuitry. Alignment marks in acceptor substrate 100 and/or in transferred layer 120 may be utilized to contact transistors and circuitry in transferred layer 120 and electrically couple them to transistors and circuitry in the acceptor substrate 100. The use of an implanted atomic species, such as, for example, Hydrogen or Helium or a combination, to create a cleaving plane, such as, for example, layer transfer demarcation plane 199, and the subsequent cleaving at or near the cleaving plane as described above may be referred to in this document as "ion-cut", and may be the typically illustrated layer transfer method. As the TLVs are formed through the transferred layer 120, the thickness of the TLVs may be, for example, less than about 2 microns thick, less than about 1 micron thick, less than about 0.4 microns thick, less than about 200 nm thick, less than about 150 nm thick, or less than about 100 nm thick. TLVs may be constructed mostly out of electrically conductive materials including, for example, copper, aluminum, conductive carbon, or tungsten. Barrier metals, including, for example, TiN and TaN, may be utilized to form TLVs.

Persons of ordinary skill in the art will appreciate that the illustrations in FIG. 1 are exemplary only and are not drawn to scale. Such skilled persons will further appreciate that many variations are possible such as, for example, a heavily doped (greater than 1e20 atoms/cm3) boron layer or a silicon germanium (SiGe) layer may be utilized as an etch stop layer either within the ion-cut process flow, wherein the layer transfer demarcation plane may be placed within the etch stop layer or into the substrate material below, or the etch stop layers may be utilized without an implant cleave or ion-cut process and the donor wafer may be preferentially etched away until the etch stop layer may be reached. Such skilled persons will further appreciate that the oxide layer within an SOI or GeOI donor wafer may serve as the etch stop layer. Many other modifications within the scope of the invention will suggest themselves to such skilled persons after reading this specification. Thus the invention is to be limited only by the appended claims.

Alternatively, other technologies and techniques may be utilized for layer transfer as described in, for example, IBM's layer transfer method shown at IEDM 2005 by A. W. Topol, et. al. The IBM's layer transfer method employs a SOI technology and utilizes glass handle wafers. The donor circuit may be high-temperature processed on an SOI wafer, temporarily bonded to a borosilicate glass handle wafer, backside thinned by chemical mechanical polishing of the silicon and then the Buried Oxide (BOX) may be selectively etched off. The now thinned donor wafer may be subsequently aligned and low-temperature oxide-to-oxide bonded to the acceptor wafer topside. A low temperature release of the glass handle wafer from the thinned donor wafer may be next performed, and then thru layer via (or layer to layer) connections may be made.

Additionally, the inventors contemplate that other technology can be used. For example, an epitaxial liftoff (ELO) technology as shown by P. Demeester, et. al, of IMEC in Semiconductor Science Technology 1993 may be utilized for layer transfer. ELO makes use of the selective removal of a very thin sacrificial layer between the substrate and the layer structure to be transferred. The to-be-transferred layer of GaAs or silicon may be adhesively 'rolled' up on a cylinder or removed from the substrate by utilizing a flexible carrier, such as, for example, black wax, to bow up the to-be-transferred layer structure when the selective etch, such as, for example, diluted Hydrofluoric (HF) Acid, etches the exposed release layer, such as, for example, the silicon oxide in SOI or a layer of AlAs. After liftoff, the transferred layer may be then aligned and bonded to the desired acceptor substrate or wafer. The manufacturability of the ELO process for multilayer layer transfer use was recently improved by J. Yoon, et. al., of the University of Illinois at Urbana-Champaign as described in Nature May 20, 2010.

Canon developed a layer transfer technology called ELTRAN—Epitaxial Layer TRANsfer from porous silicon. ELTRAN may be utilized as a layer transfer method. The Electrochemical Society Meeting abstract No. 438 from year 2000 and the JSAP International July 2001 paper show a seed wafer being anodized in an HF/ethanol solution to create pores in the top layer of silicon, the pores may be treated with a low temperature oxidation and then high temperature hydrogen annealed to seal the pores. Epitaxial silicon may then be deposited on top of the porous silicon and then oxidized to form the SOI BOX. The seed wafer may be bonded to a handle wafer and the seed wafer may be split off by high pressure water directed at the porous silicon layer. The porous silicon may then be selectively etched off leaving a uniform silicon layer.

Figure 2A:
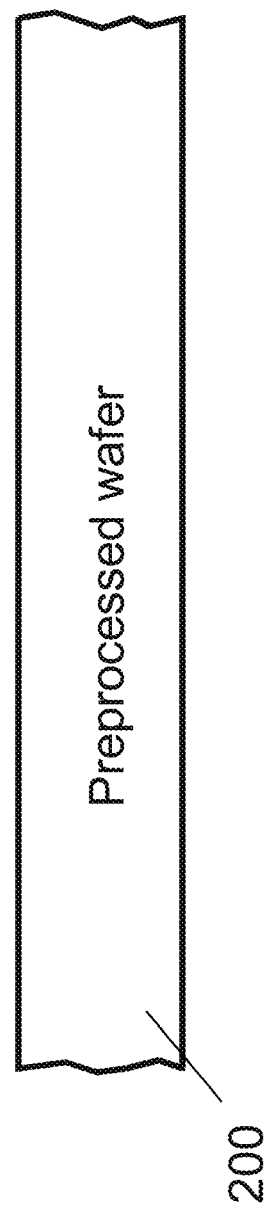

FIG. 2A is a drawing illustration of a generalized preprocessed wafer or layer 200. The wafer or layer 200 may have preprocessed circuitry, such as, for example, logic circuitry, microprocessors, circuitry including transistors of various types, and other types of digital or analog circuitry including, but not limited to, the various embodiments described herein. Preprocessed wafer or layer 200 may have preprocessed metal interconnects, such as, for example, of copper or aluminum. The preprocessed metal interconnects, such as, for example, metal strips pads, or lines, may be designed and prepared for layer transfer and electrical coupling from preprocessed wafer or layer 200 to the layer or layers to be transferred.

Figure 2B:
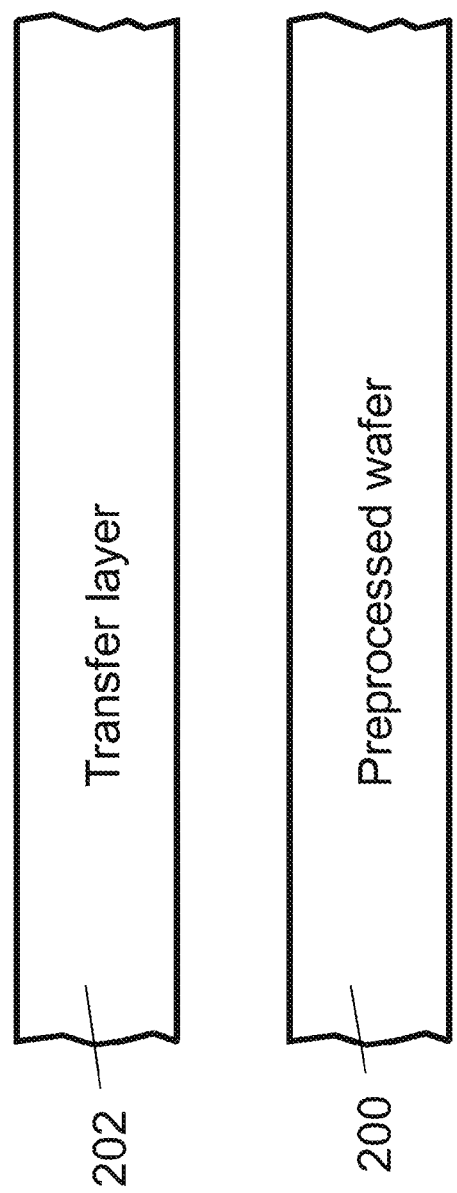

FIG. 2B is a drawing illustration of a generalized transfer layer 202 prior to being attached to preprocessed wafer or layer 200. Preprocessed wafer or layer 200 may be called a target wafer or acceptor substrate. Transfer layer 202 may be attached to a carrier wafer or substrate during layer transfer. Transfer layer 202 may have metal interconnects, such as, for example, metal strips, pads, or lines, designed and prepared for layer transfer and electrical coupling to preprocessed wafer or layer 200. Transfer layer 202, which may also be called the second semiconductor layer, may include mono-crystalline silicon, or doped mono-crystalline silicon layer or layers, or other semiconductor, metal (including such as aluminum or copper interconnect layers), and insulator materials, layers; or multiple regions of single crystal silicon, or mono-crystalline silicon, or dope mono-crystal- line silicon, or other semiconductor, metal, or insulator materials. A preprocessed wafer that can withstand subsequent processing of transistors on top at high temperatures may be a called the "Foundation" or a foundation wafer, layer or circuitry. The terms 'mono-crystalline silicon' and 'single crystal silicon' may be used interchangeably.

FIG. 2C is a drawing illustration of a preprocessed wafer or layer 200A created by the layer transfer of transfer layer 202 on top of preprocessed wafer or layer 200. The top of preprocessed wafer or layer 200A may be further processed with metal interconnects, such as, for example, metal strips, pads, or lines, designed and prepared for layer transfer and electrical coupling from preprocessed wafer or layer 200A to the next layer or layers to be transferred.

Figure 2D:
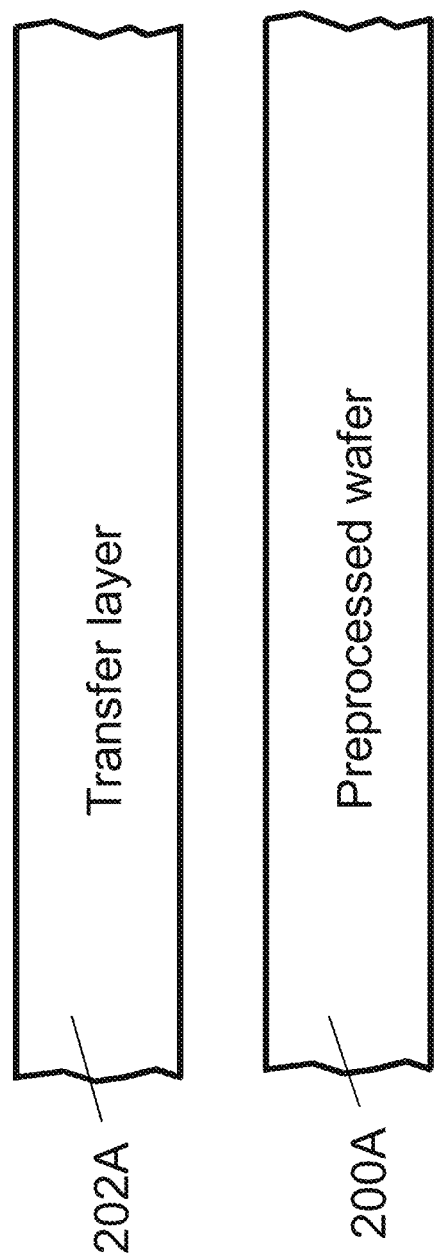

FIG. 2D is a drawing illustration of a generalized transfer layer 202A prior to being attached to preprocessed wafer or layer 200A. Transfer layer 202A may be attached to a carrier wafer or substrate during layer transfer. Transfer layer 202A may have metal interconnects, such as, for example, metal strips, pads, or lines, designed and prepared for layer transfer and electrical coupling to preprocessed wafer or layer 200A. Transfer layer 202A may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

FIG. 2E is a drawing illustration of a preprocessed wafer or layer 200B created by the layer transfer of transfer layer 202A on top of preprocessed wafer or layer 200A. Transfer layer 202A may also be called the third semiconductor layer. The top of preprocessed wafer or layer 200B may be further processed with metal interconnects, such as, for example, metal strips, pads, or lines, designed and prepared for layer transfer and electrical coupling from preprocessed wafer or layer 200B to the next layer or layers to be transferred.

Figure 2F:
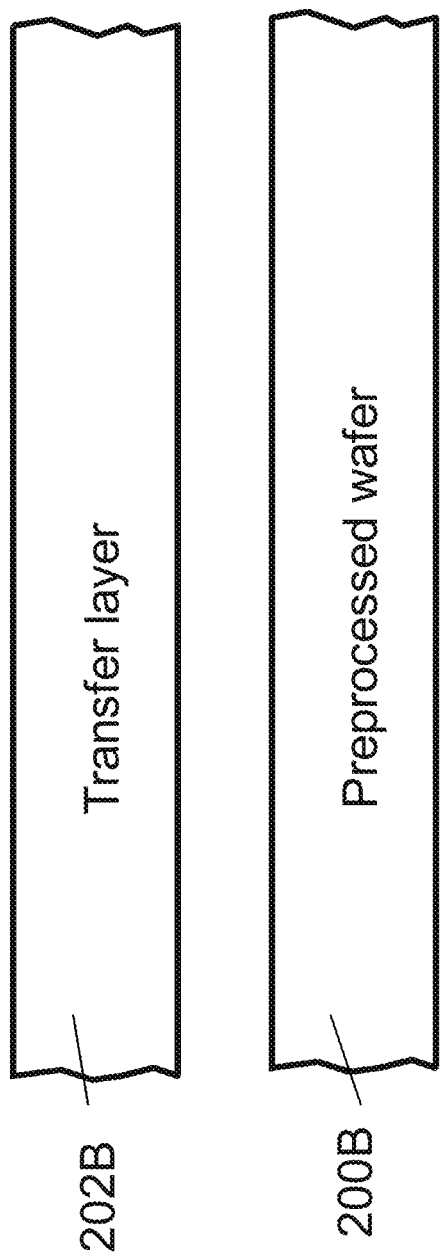

FIG. 2F is a drawing illustration of a generalized transfer layer 202B prior to being attached to preprocessed wafer or layer 200B. Transfer layer 202B may be attached to a carrier wafer or substrate during layer transfer. Transfer layer 202B may have metal interconnects, such as, for example, metal strips, pads, or lines, designed and prepared for layer transfer and electrical coupling to preprocessed wafer or layer 200B. Transfer layer 202B may include mono-crystalline silicon, or doped mono-crystalline silicon layer or layers, or other semiconductor, metal, and insulator materials, layers; or multiple regions of single crystal silicon, or mono-crystalline silicon, or dope mono-crystalline silicon, or other semiconductor, metal, or insulator materials.

Figure 2G:
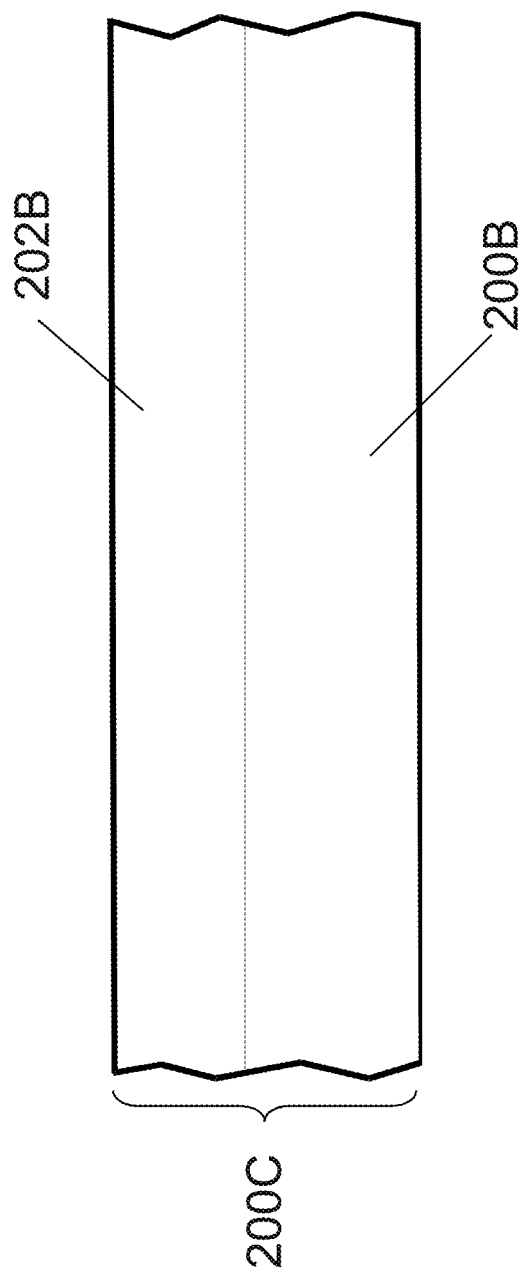

FIG. 2G is a drawing illustration of preprocessed wafer or layer 200C created by the layer transfer of transfer layer 202B on top of preprocessed wafer or layer 200B. The top of preprocessed wafer or layer 200C may be further processed with metal interconnect, such as, for example, metal strips, pads, or lines, designed and prepared for layer transfer and electrical coupling from preprocessed wafer or layer 200C to the next layer or layers to be transferred.

Figure 2H:
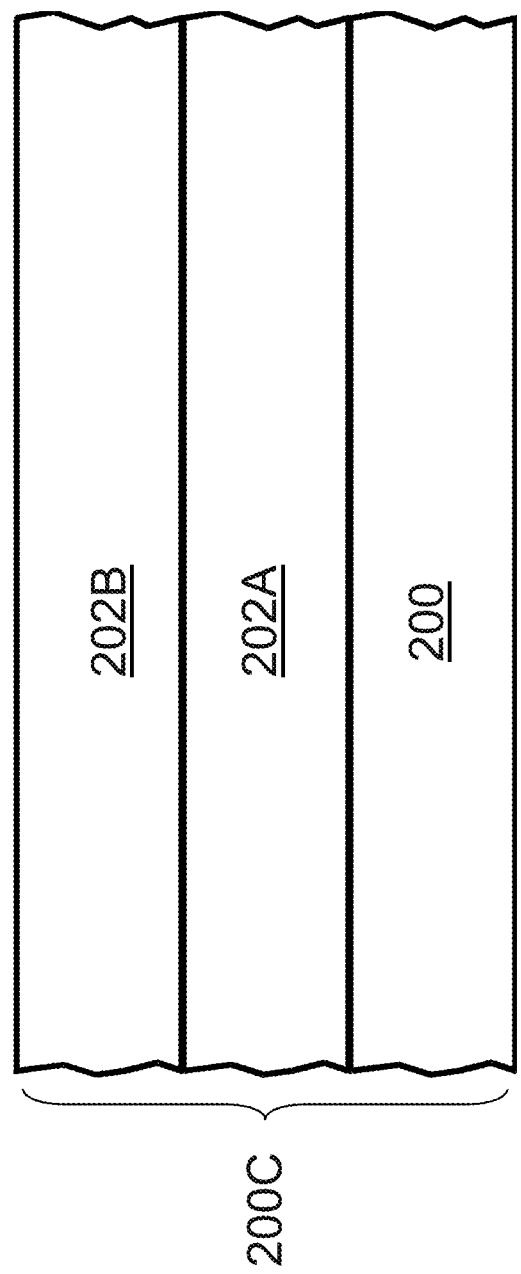

FIG. 2H is a drawing illustration of preprocessed wafer or layer 200C, a 3D IC stack, which may include transferred layers 202A and 202B on top of the original preprocessed wafer or layer 200. Transferred layers 202A and 202B and the original preprocessed wafer or layer 200 may include transistors of one or more types in one or more layers, metallization such as, for example, copper or aluminum in one or more layers, interconnections to and among layers above and below (connection paths, such as TLVs or TSVs), and interconnections within the layer. The transistors may be of various types that may be different from layer to layer or within the same layer. The transistors may be in various organized patterns. The transistors may be in various pattern repeats or bands. The transistors may be in multiple layers involved in the transfer layer. The transistors may be, for example, junction-less transistors or recessed channel transistors or other types of transistors described in this document. Transferred layers 202A and 202B and the original preprocessed wafer or layer 200 may further include semiconductor devices such as, for example, resistors and capacitors and inductors, one or more programmable interconnects, memory structures and devices, sensors, radio frequency devices, or optical interconnect with associated transceivers. The terms carrier wafer or carrier substrate may also be called holder wafer or holder substrate.

This layer transfer process can be repeated many times, thereby creating preprocessed wafers that may include many different transferred layers which, when combined, can then become preprocessed wafers or layers for future transfers. This layer transfer process may be sufficiently flexible that preprocessed wafers and transfer layers, if properly prepared, can be flipped over and processed on either side with further transfers in either direction as a matter of design choice.

Persons of ordinary skill in the art will appreciate that the illustrations in FIGS. 2A through 2H are exemplary only and are not drawn to scale. Such skilled persons will further appreciate that many variations are possible such as, for example, the preprocessed wafer or layer 200 may act as a base or substrate layer in a wafer transfer flow, or as a preprocessed or partially preprocessed circuitry acceptor wafer in a wafer transfer process flow. Many other modifications within the scope of the invention will suggest themselves to such skilled persons after reading this specification. Thus the invention is to be limited only by the appended claims.

One industry method to form a low temperature gate stack may be called a high-k metal gate (HKMG) and may be referred to in later discussions. The high-k metal gate structure may be formed as follows. Following an industry standard HF/SC1/SC2 cleaning to create an atomically smooth surface, a high-k dielectric may be deposited. The semiconductor industry has chosen Hafnium-based dielectrics as the leading material of choice to replace $SiO_2$ and Silicon oxynitride. The Hafnium-based family of dielectrics includes hafnium oxide and hafnium silicate/hafnium silicon oxynitride. Hafnium oxide, $HfO_2$, may have a dielectric constant twice as much as that of hafnium silicate/hafnium silicon oxynitride (HfSiO/HfSiON k~15). The choice of the metal may be critical for the device to perform properly. A metal replacing $N^{30}$ poly as the gate electrode may need to have a work function of approximately 4.2 eV for the device to operate properly and at the right threshold voltage. Alternatively, a metal replacing $P^+$ poly as the gate electrode may need to have a work function of approximately 5.2 eV to operate properly. The TiAl and TiAlN based family of metals, for example, could be used to tune the work function of the metal from 4.2 eV to 5.2 eV.

Alternatively, a low temperature gate stack may be formed with a gate oxide formed by a microwave oxidation technique, such as, for example, the TEL SPA (Tokyo Electron Limited Slot Plane Antenna) oxygen radical plasma, that grows or deposits a low temperature Gate Dielectric to serve as the MOSFET gate oxide, or an atomic layer deposition (ALD) deposition technique may be utilized. A metal gate of proper work function, such as, for example, aluminum or tungsten, or low temperature doped amorphous silicon gate electrode, may then be deposited.

Transistors constructed in this document can be considered "planar transistors" when the current flow in the transistor channel may be substantially in the horizontal direction. The horizontal direction may be defined as the direction being parallel to the largest area of surface of the substrate or wafer that the transistor may be built or layer transferred onto. These transistors can also be referred to as horizontal transistors, horizontally oriented transistors, or lateral transistors. In some embodiments of the invention the horizontal transistor may be constructed in a two-dimensional plane where the source and the drain are in the same two dimensional horizontal plane.

An embodiment of the invention is to pre-process a donor wafer by forming wafer sized layers of various materials without a process temperature restriction, then layer transferring the pre-processed donor wafer to the acceptor wafer, and processing at either low temperature (below approximately 400° C.) or high temperature (greater than approximately 400° C.) after the layer transfer to form device structures, such as, for example, transistors and metal interconnect, on or in the donor wafer that may be physically aligned and may be electrically coupled or connected to the acceptor wafer. A wafer sized layer denotes a continuous layer of material or combination of materials that may extend across the wafer to substantially the full extent of the wafer edges and may be approximately uniform in thickness. If the wafer sized layer compromises dopants, then the dopant concentration may be substantially the same in the x and y direction across the wafer, but can vary in the z direction perpendicular to the wafer surface.

As illustrated in FIG. 3A, a generalized process flow may begin with a donor wafer 300 that may be preprocessed with wafer sized layers 302 of conducting, semi-conducting or insulating materials that may be formed by deposition, ion implantation and anneal, oxidation, epitaxial growth, combinations of above, or other semiconductor processing steps and methods. The donor wafer 300 may be preprocessed with a layer transfer demarcation plane (shown as dashed line) 399, such as, for example, a hydrogen implant cleave plane, before or after layers 302 are formed. Acceptor wafer 310 may be a preprocessed wafer that may have fully functional circuitry including metal layers (including aluminum or copper metal interconnect layers that may connect acceptor wafer 310 transistors) or may be a wafer with previously transferred layers, or may be a blank carrier or holder wafer, or other kinds of substrates suitable for layer transfer processing. Acceptor wafer 310 may have alignment marks 390 and metal connect pads or strips 380. Acceptor wafer 310 and the donor wafer 300 may be a bulk monocrystalline silicon wafer or a Silicon On Insulator (SOI) wafer or a Germanium on Insulator (GeOI) wafer.

Both bonding surfaces 301 and 311 may be prepared for wafer bonding by depositions, polishes, plasma, or wet chemistry treatments to facilitate successful wafer to wafer bonding.

Figure 3B:
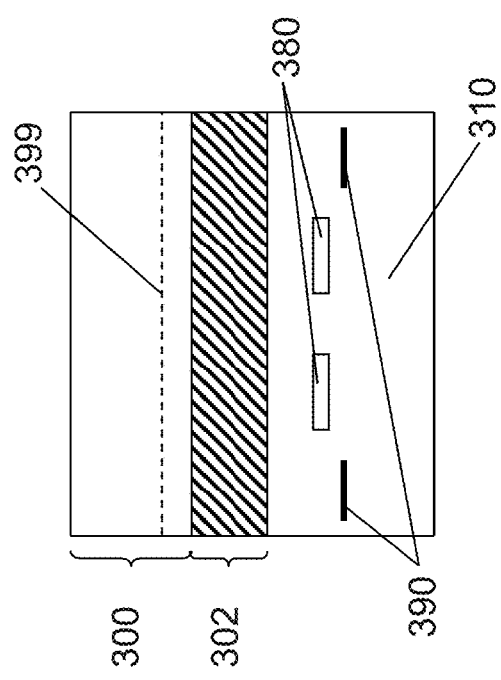

As illustrated in FIG. 3B, the donor wafer 300 with layers 302 and layer transfer demarcation plane 399 may then be flipped over, aligned, and bonded to the acceptor wafer 310. The donor wafer 300 with layers 302 may have alignment marks (not shown).

As illustrated in FIG. 3C, the donor wafer 300 may be cleaved at or thinned to the layer transfer demarcation plane 399, leaving a portion of the donor wafer 300' and the pre-processed layers 302 bonded to the acceptor wafer 310, by methods such as, for example, ion-cut or other layer transfer methods.

Figure 3D:
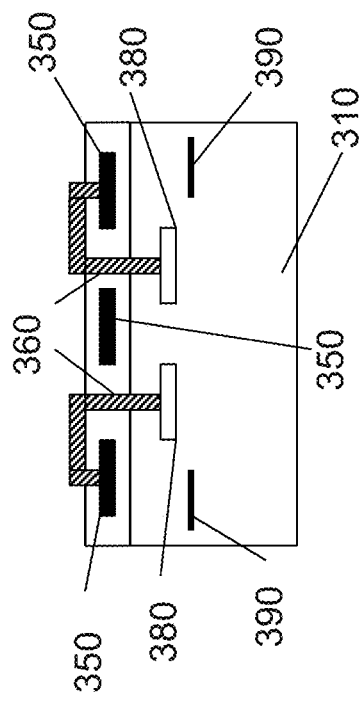

As illustrated in FIG. 3D, the remaining donor wafer portion 300' may be removed by polishing or etching and the transferred layers 302 may be further processed to create donor wafer device structures 350 that may be precisely aligned to the acceptor wafer alignment marks 390. Donor wafer device structures 350 may include, for example, CMOS transistors such as N type and P type transistors, or any of the other transistor or device types discussed herein this document. These donor wafer device structures 350 may utilize thru layer vias (TLVs) 360 to electrically couple (connection paths) the donor wafer device structures 350 to the acceptor wafer metal connect pads or strips 380. TLVs 360 may be formed through the transferred layers 302. As the transferred layers 302 may be thin, on the order of about 200 nm or less in thickness, the TLVs may be easily manufactured as a typical metal to metal via may be, and said TLV may have state of the art diameters such as nanometers or tens to a few hundreds of nanometers, such as, for example about 150 nm or about 100 nm or about 50 nm. The thinner the transferred layers 302, the smaller the thru layer via diameter obtainable, which may result from maintaining manufacturable via aspect ratios. Thus, the transferred layers 302 (and hence, TLVs 360) may be, for example, less than about 2 microns thick, less than about 1 micron thick, less than about 0.4 microns thick, less than about 200 nm thick, less than about 150 nm thick, or less than about 100 nm thick. The thickness of the layer or layers transferred according to some embodiments of the invention may be designed as such to match and enable the most suitable obtainable lithographic resolution, such as, for example, less than about 10 nm, 14 nm, 22 nm or 28 nm linewidth resolution and alignment capability, such as, for example, less than about 5 nm, 10 nm, 20 nm, or 40 nm alignment accuracy/precision/error, of the manufacturing process employed to create the thru layer vias or any other structures on the transferred layer or layers. Transferred layers 302 may be considered to be overlying the metal layer or layers of acceptor wafer 310. Alignment marks in acceptor substrate 310 and/or in transferred layers 302 may be utilized to enable reliable contact to transistors and circuitry in transferred layers 302 and donor wafer device structures 350 and electrically couple them to the transistors and circuitry in the acceptor substrate 310. The donor wafer 300 may now also be processed and reused for more layer transfers.

There may be multiple methods by which a transistor or other devices may be formed to enable a 3D IC.

As illustrated in FIGS. 4A to 4I, an n-channel 3-sided gated junction-less transistor (JLT) may be constructed that may be suitable for 3D IC manufacturing. This structure may improve the source and drain contact resistance by providing for a higher doping at the metal contact surface than in the transistor channel. Additionally, this structure may be utilized to create a two layer channel wherein the layer closest to the gate may be more highly doped.

Figure 4A:
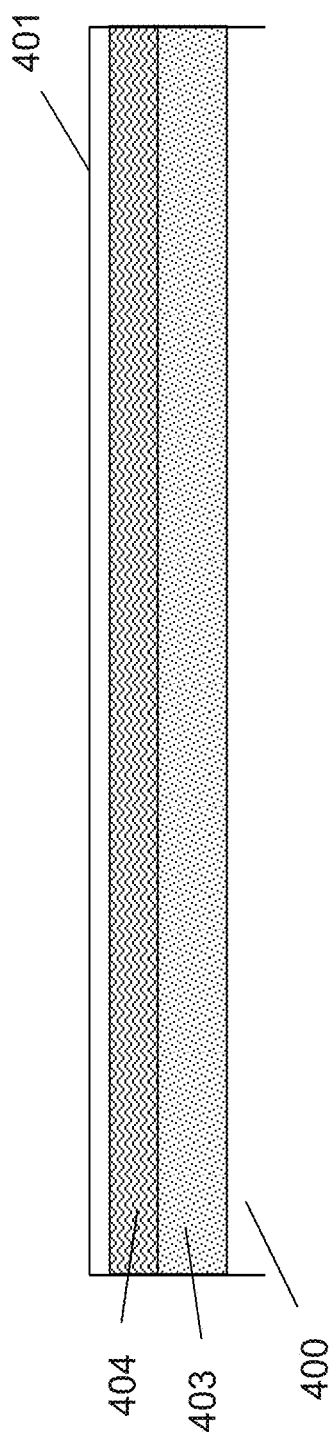

As illustrated in FIG. 4A, an N− substrate donor wafer 400 may be processed to include two wafer sized layers of N+ doping 403 and 404. The top N+ layer 404 may have a lower doping concentration than the bottom N+ doping layer 403. The bottom N+ doping layer 403 may have a doping concentration that may be more than 10× the doping concentration of top N+ layer 404. The N+ doping layers 403 and 404 may be formed by ion implantation and thermal anneal. The layer stack may alternatively be formed by successive epitaxially deposited doped silicon layers of N+ silicon with differing dopant concentrations or by a combination of epitaxy and implantation. A screen oxide 401 may be grown or deposited before the implants to protect the silicon from implant contamination and to provide an oxide surface for later wafer to wafer bonding. The N+ layer 404 may alternatively be a deposited layer of heavily N+ doped polysilicon that may be optically annealed to form large grains, or the structures may be formed by one or more depositions of in-situ doped amorphous silicon to create the various dopant layers or gradients. The N+ doped layer 404 may be formed by doping the N− substrate donor wafer 400 by Plasma Assisted Doping (PLAD) techniques. These processes may be done at temperatures above about 400° C. as the layer transfer to the processed substrate with metal interconnects has yet to be done.

Figure 4B:
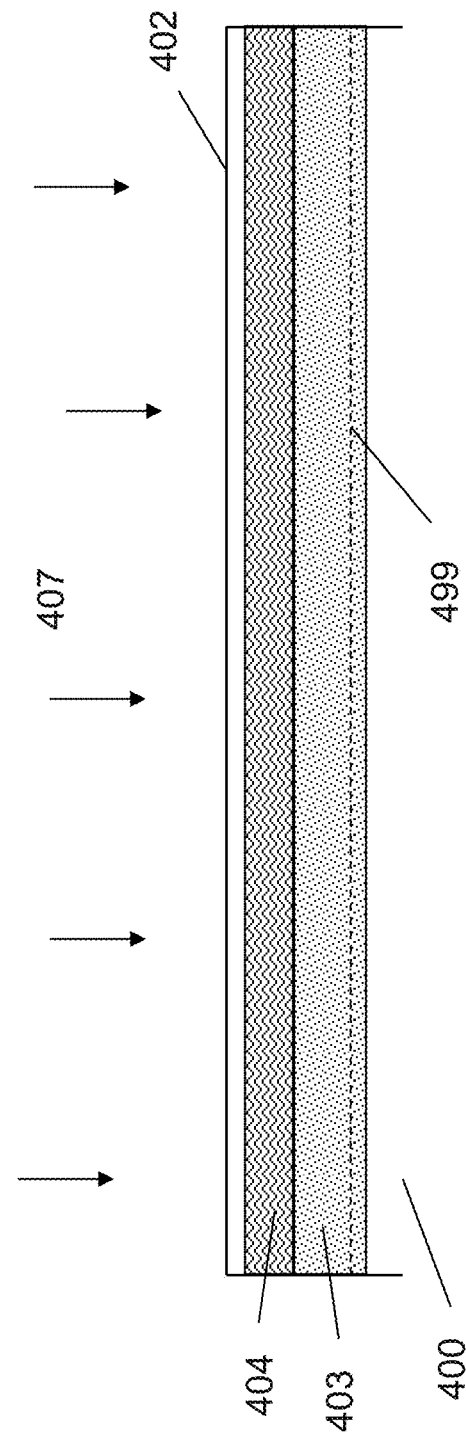

As illustrated in FIG. 4B, the top surface of N− substrate donor wafer 400 may be prepared for oxide wafer bonding with a deposition of an oxide or by thermal oxidation of the N+ layer 404 to form oxide layer 402, or a re-oxidation of implant screen oxide 401. A layer transfer demarcation plane 499 (shown as a dashed line) may be formed in N− substrate donor wafer 400 or in the N+ layer 404 (as shown) by hydrogen implantation 407 or other methods as previously described. Both the N− substrate donor wafer 400 and acceptor wafer 410 may be prepared for wafer bonding as previously described and then low temperature (less than approximately 400° C.) bonded. The portion of the N+ layer 403 and the N− substrate donor wafer 400 that may be above the layer transfer demarcation plane 499 may be removed by cleaving and polishing, or other low temperature processes as previously described, such as, for example, ion-cut or other layer transfer methods.

As illustrated in FIG. 4C, the remaining N+ layer 403', lighter N+ doped layer 404, and oxide layer 402 have been layer transferred to acceptor wafer 410. The top surface of N+ layer 403' may be chemically or mechanically polished and an etch hard mask layer of low temperature silicon nitride may be deposited on the surface of N+ layer 403', including a thin oxide stress buffer layer, thus forming silicon nitride etch hard mask layer 405. Now transistors may be formed with low temperature (less than approximately 400° C.) processing and aligned to the acceptor wafer 410 alignment marks (not shown). The acceptor wafer metal connect pad 480 is illustrated. For illustration clarity, the oxide layers used to facilitate the wafer to wafer bond are not shown in subsequent drawings.

Figure 4D:
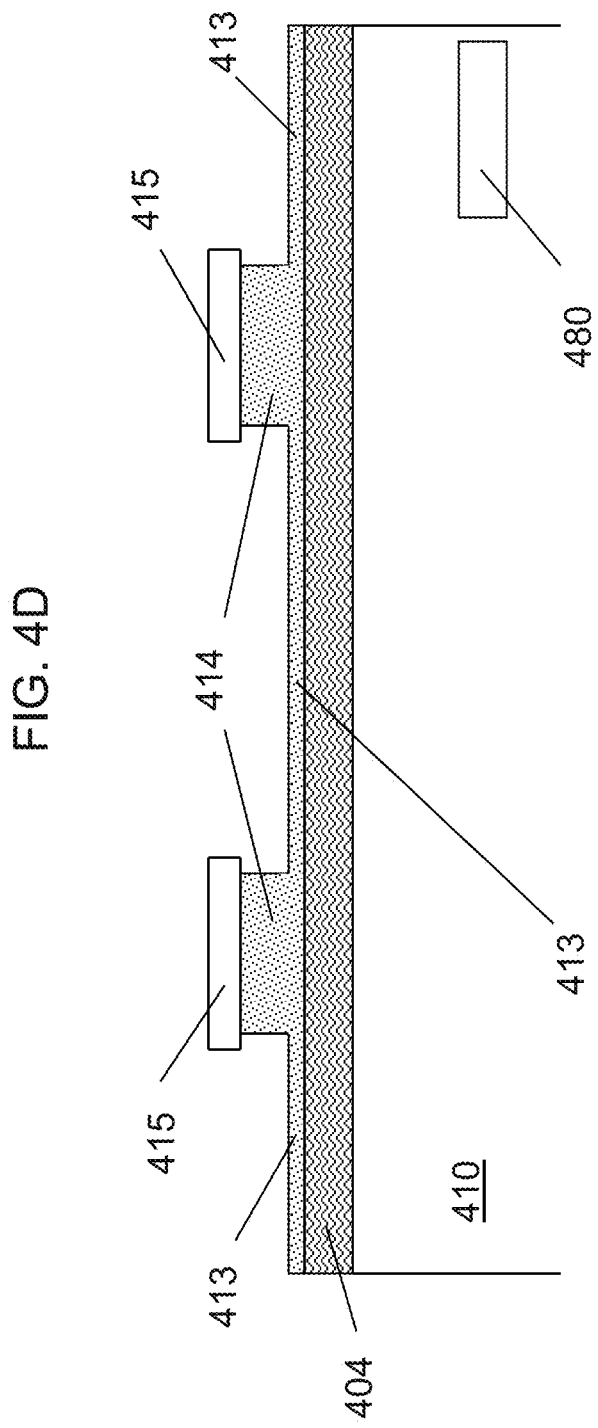

As illustrated in FIG. 4D the source and drain connection areas may be lithographically defined, the silicon nitride etch hard mask layer 405 may be etched, and the photoresist may be removed, leaving etch hard mask regions 415. A partial or full silicon plasma/RIE etch may be performed to thin or remove N+ layer 403'. Alternatively, one or more a low temperature oxidations coupled with a Hydrofluoric Acid etch of the formed oxide may be utilized to thin N+ layer 403'. This results in a two-layer channel, as described and simulated above in conjunction with FIGS. 13A and 13B of the incorporated reference U.S. Pat. No. 8,836,073, formed by thinning N+ layer 403' with the above etch process to almost complete removal, leaving some of N+ layer 403' remaining (now labeled 413) on top of the lighter N+ doped 404 layer and the full thickness of N+ layer 403' (now labeled 414) still remaining underneath the etch hard mask regions 415. A substantially complete removal of the top channel N+ layer 403' in the areas not underneath etch hard mask regions 415 may be performed. This etch process may be utilized to adjust for post layer transfer cleave wafer-to-wafer CMP variations of the remaining donor wafer layers, such as N− substrate donor wafer 400 and N+ layer 403' and provide less variability in the final channel thickness.

As illustrated in FIG. 4E photoresist 450 may be lithographically defined to substantially cover the source and drain connection areas 414 and the heavier N+ doped transistor channel layer region 453, previously a portion of thinned N+ doped layer 413.

Figure 4F:
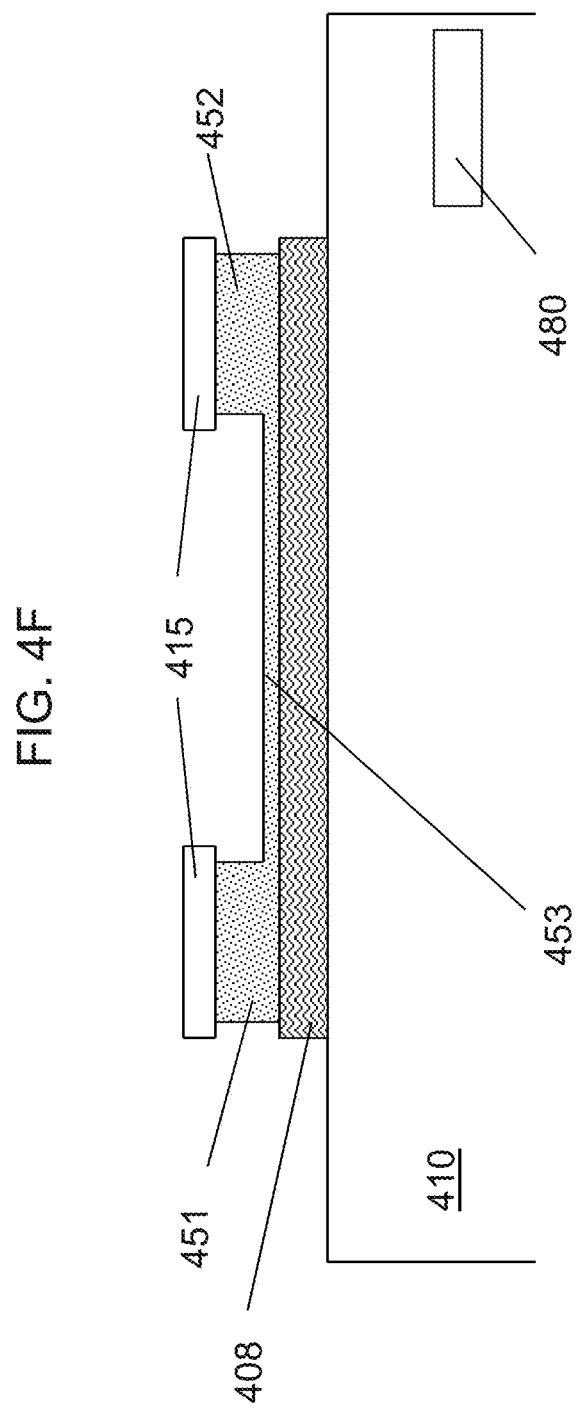

As illustrated in FIG. 4F the exposed portions of thinned N+ doped layer 413 and the lighter N+ doped layer 404 may be plasma/RIE etched and the photoresist 450 removed. The etch forms source connection region 451 and drain connection region 452, provides isolation among transistors, and defines the width of the JLT channel which may include lighter doped N+ region 408 and thinned heavier N+ doped layer region 453.

Figure 4G:
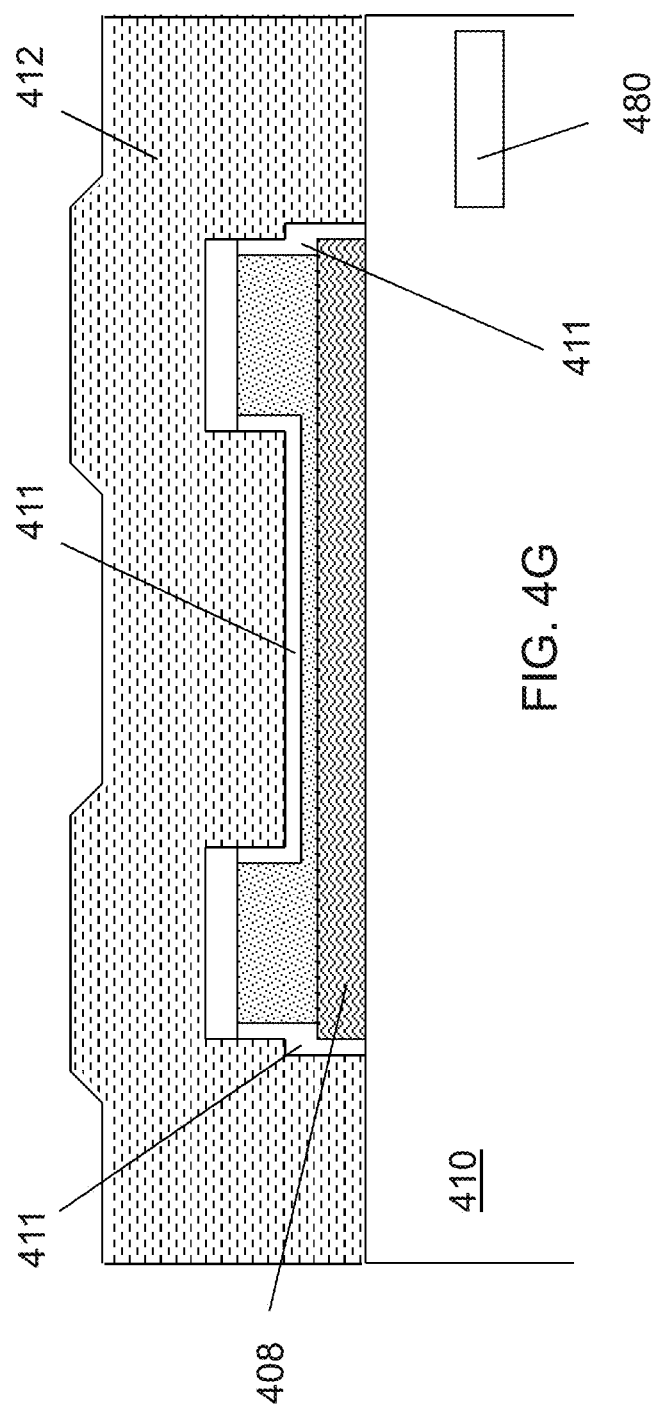

As illustrated in FIG. 4G, a low temperature based Gate Dielectric may be deposited and densified to serve as the gate dielectric 411 for the junction-less transistor. Alternatively, a low temperature microwave plasma oxidation of the lighter doped N+ region 408 silicon surfaces may serve as the JLT gate dielectric 411 or an atomic layer deposition (ALD) technique may be utilized to form the HKMG gate oxide as previously described. Then deposition of a low temperature gate material with proper work function and less than approximately 400° C. deposition temperature, such as, for example, P+ doped amorphous silicon, may be performed to form gate 412. Alternatively, a HKMG gate structure may be formed as described previously.

Figure 4H:
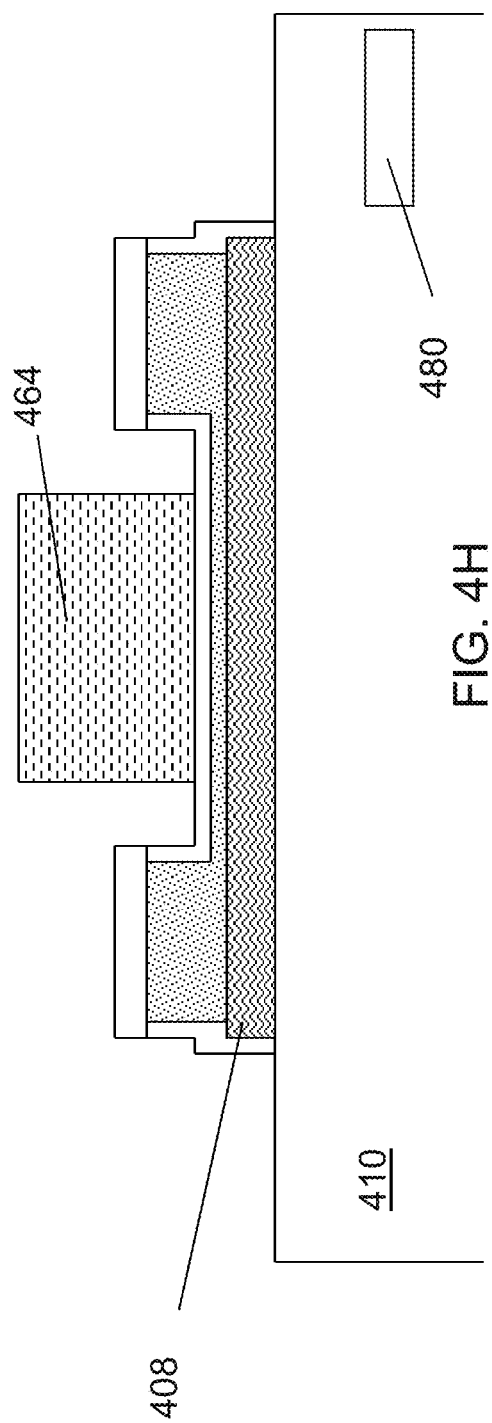
Figure 4I:
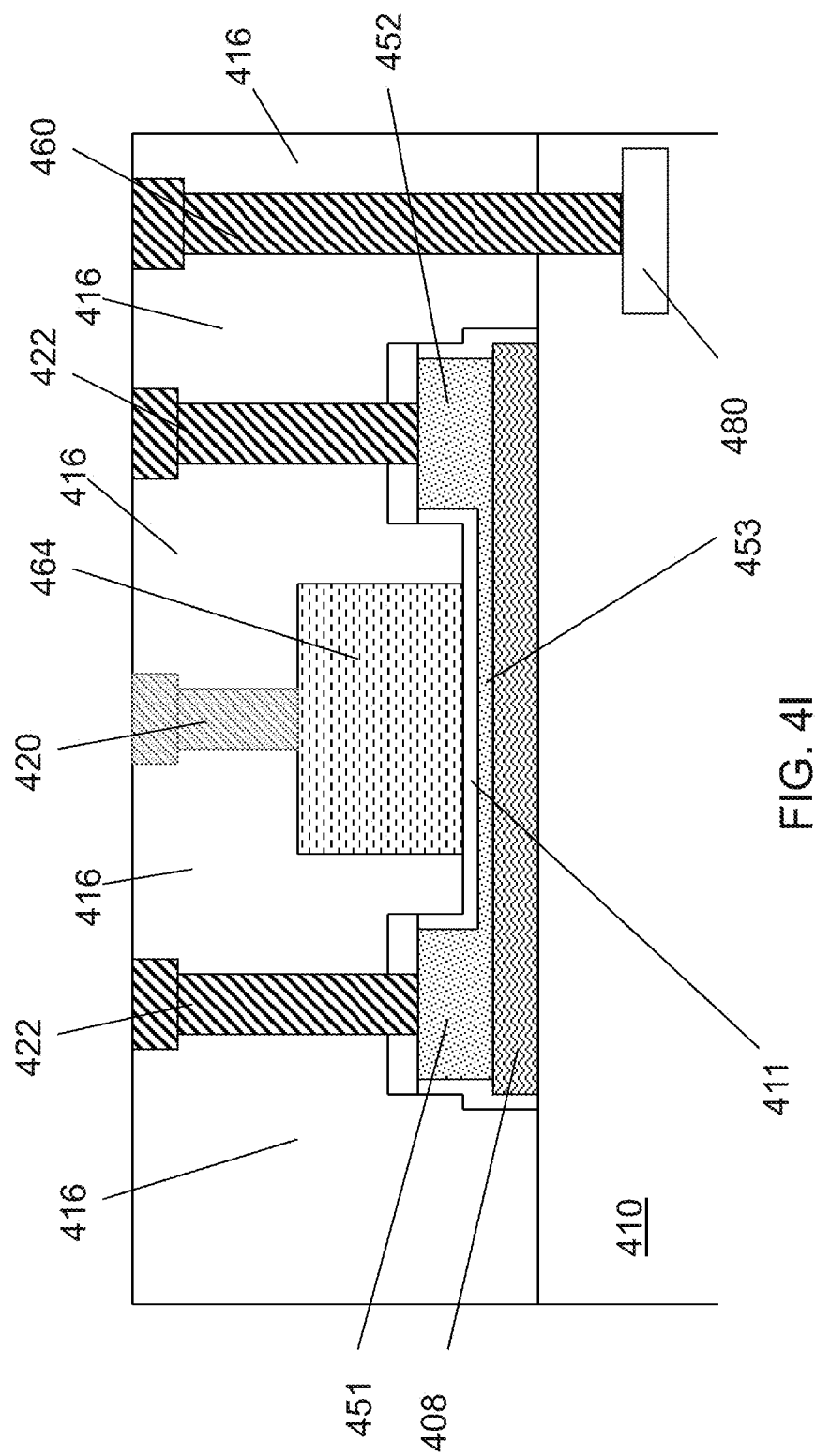

As illustrated in FIG. 4H, the gate material of gate 412 may be masked and etched to define the three sided (top and two side) gate electrode 464 that may be in an overlapping crossing manner, generally orthogonal, with respect to the transistor channel lighter doped N+ region 408.

As illustrated in 4I, the entire structure may be substantially covered with a Low Temperature Oxide 416, which may be planarized with chemical mechanical polishing. The three sided gate electrode 464, N+ transistor channel composed of lighter N+ doped region 408 and heavier doped N+ silicon region 453, gate dielectric 411, source connection region 451, and drain connection region 452 are shown. Contacts and metal interconnects may be formed. The gate contact 420 connects to the gate electrode 464. The two transistor channel terminal contacts (source and drain) 422 independently connect to the heavier doped N+ silicon region 453 on each side of the gate electrode 464. The layer via 460 electrically couples the transistor layer metallization to the acceptor wafer 410 at acceptor wafer metal connect pad 480. This flow enables the formation of a mono-crystalline silicon channel with 1, 2, or 3-sided gated junction-less transistor with uniform, graded, or multiple layers of dopant levels in the transistor channel, which may be formed and connected to the underlying multi-metal layer semiconductor device without exposing the underlying devices to a high temperature processing step.

A p channel 1, 2, or 3-sided gated JLT may be constructed as above with the N+ layers 404 and 403 formed as P+ doped, and the gate material of gate 412 may be of appropriate work function to shutoff the p channel at a gate voltage of approximately zero.

A junction-less FinFet may also be constructed similarly, wherein heavier doped N+ silicon region 453 may be substantially etched away leaving behind source connection region 451 and drain connection region 452, and the thickness of lighter N+ doped region 408 may be greater than its width (forming the fin), and three sided (top and two side) gate electrode 464 with gate dielectric 411 may control the electrostatic properties (such as on and off transistor states) of the fin. Thus, the heavier doped N+ silicon region 453 may provide good contact resistance to the eventual source and drain contacts (for example, the two transistor channel terminal contacts (source and drain) 422), while the lighter N+ doped region 408 (or 'fin') may be undoped or of light doping such that it can be electrostatically controlled by the three sided (top and two side) gate electrode 464. A junctioned FinFet may be constructed similarly to the junction-less FinFet wherein the dopant type, such as n or p type dopant, of source connection region 451 and drain connection region 452 may be different than the dopant type of the transistor channel, for example, the lighter N+ doped region 408.

An embodiment of the invention is to pre-process a donor wafer by forming wafer-sized or die-sized layers of pre-formed repeating device structures without a process temperature restriction, then layer transferring the pre-processed donor wafer to the acceptor wafer, and processing with either low temperature (below approximately 400° C.) or high temperature (greater than approximately 400° C.) after the layer transfer to form device structures, such as, for example, transistors, on or in the donor wafer that may be physically aligned and may be electrically coupled to the acceptor wafer. Methods are described to build both 'n' type and 'p' type transistors on the same layer by partially processing the first phase of transistor formation on the donor wafer with typical CMOS processing including a 'dummy gate', a process known as 'gate-last'. The 'gate last' process flow may be referred to as a gate replacement process or a replacement gate process. In various embodiments of the invention, a layer transfer of the mono-crystalline silicon may be performed after the dummy gate is formed and before the formation of a replacement gate. The dummy gate and the replacement gate may include various materials such as, for example, silicon and silicon dioxide, or metal and low k materials such as, for example, TiAlN and HfO$_2$. An example may be the high-k metal gate (HKMG) CMOS transistors that have been developed for the 45 nm, 32 nm, 22 nm, and future CMOS generations. Intel and TSMC have shown the utility of a 'gate-last' approach to construct high performance HKMG CMOS transistors (C. Auth et al., VLSI 2008, pp 128-129 and C. H. Jan et al, 2009 IEDM p. 647). The donor wafer and acceptor wafer in these discussions may include the compositions, such as metal layers and TLVs, referred to for donor wafers and acceptor wafers in the FIGS. 1, 2 and 3 layer transfer discussions.

FIGS. 5A to 5H describe an overall process flow wherein CMOS transistors may be partially processed on a donor wafer, temporarily transferred to a carrier or holder substrate or wafer and thinned, layer transferred to an acceptor substrate, and then the transistor and interconnections may be substantially completed in low temperature (below approximately 400° C.).

Figure 5A:
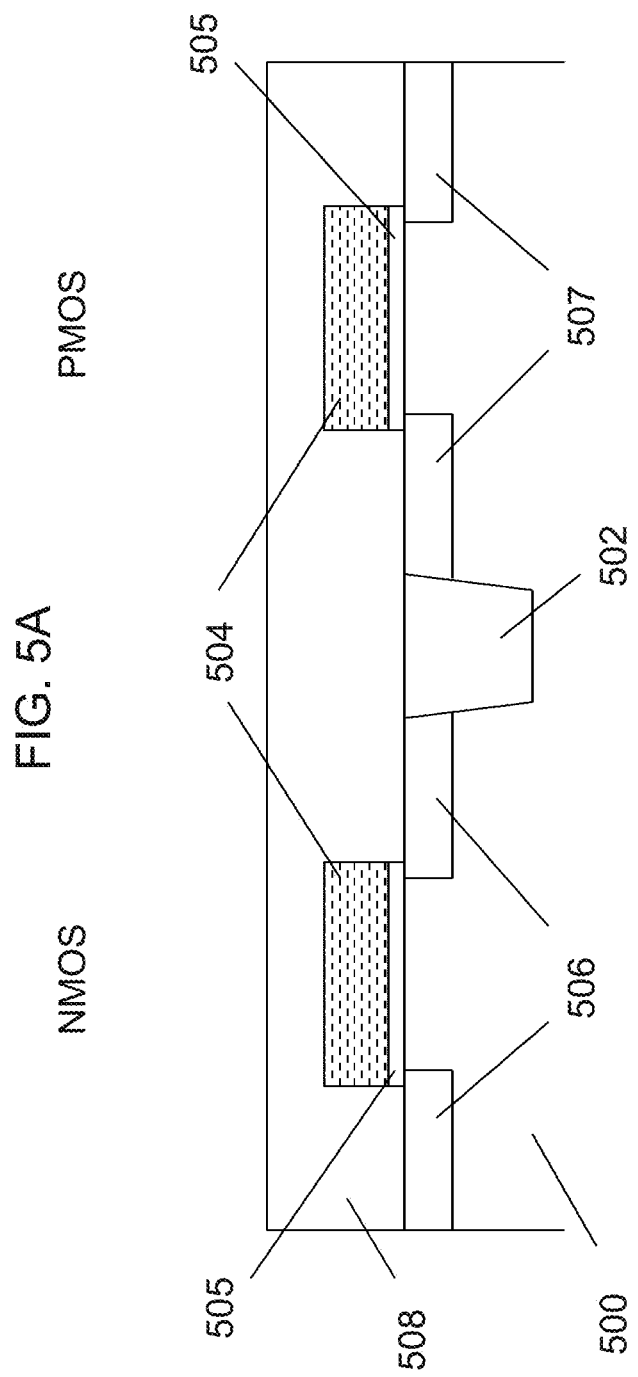

As illustrated in FIG. 5A, a donor wafer 500 may be processed in the typical state of the art HKMG gate-last manner up to the step prior to where CMP exposure of the poly-crystalline silicon dummy gates takes place. The donor wafer 500 may be a bulk mono-crystalline silicon wafer (shown), or a Silicon On Insulator (SOI) wafer, or a Germanium on Insulator (GeOI) wafer. Donor wafer 500, the shallow trench isolation (STI) 502 among transistors, the poly-crystalline silicon 504 and gate oxide 505 of both n-type and p-type CMOS dummy gates, their associated source and drains 506 for NMOS and 507 for PMOS, and the interlayer dielectric (ILD) 508 are shown in the cross section illustration. These structures of FIG. 5A illustrate substantial completion of the first phase of transistor formation.

As illustrated in FIG. 5B, a layer transfer demarcation plane (shown as dashed line) 599 may be formed by hydrogen implantation 509 or other methods as previously described.

As illustrated in FIG. 5C, donor wafer 500 with the first phase of transistor formation substantially completed may be temporarily bonded to carrier or holder substrate 514 at interface 516 with a low temperature process that may facilitate a low temperature release. The carrier or holder substrate 514 may be a glass substrate to enable state of the art optical alignment with the acceptor wafer. A temporary bond among the carrier or holder substrate 514 and the donor wafer 500 at interface 516 may be made with a polymeric material, such as, for example, polyimide DuPont HD3007, which can be released at a later step by laser ablation, Ultra-Violet radiation exposure, or thermal decomposition. Alternatively, a temporary bond may be made with uni-polar or bi-polar electrostatic technology such as, for example, the Apache tool from Beam Services Inc.

Figure 5D:
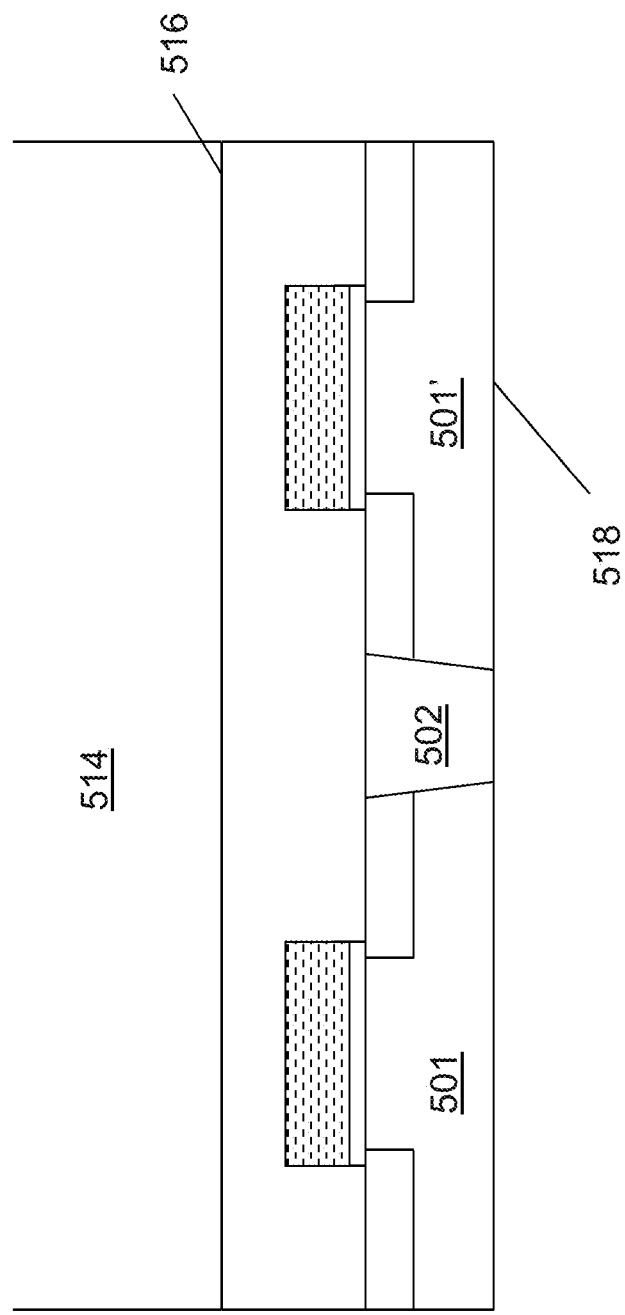

As illustrated in FIG. 5D, the portion of the donor wafer 500 that may be below the layer transfer demarcation plane 599 may be removed by cleaving or other processes as previously described, such as, for example, ion-cut or other methods. The remaining donor wafer regions 501 and 501' may be thinned by chemical mechanical polishing (CMP) so that the transistor STI 502 may be exposed at the donor wafer surface 518. Alternatively, the CMP could continue to the bottom of the junctions to eventually create fully depleted SOI transistors. The donor wafer 500 may now also be processed and reused for more layer transfers.

As illustrated in FIG. 5E, oxide 520 may be deposited on the remaining donor wafer 501 surface 518. Both the donor wafer surface 518 and acceptor substrate 510 may be prepared for wafer bonding as previously described and then low temperature (less than approximately 400° C.) aligned and bonded at surface 522. With reference to the FIG. 33D of the incorporated reference U.S. Pat. No. 8,836,073 discussion, acceptor wafer metal connect strip 524 is shown.

As illustrated in FIG. 5F, the carrier or holder substrate 514 may then be released at interface 516 using a low temperature process such as, for example, laser ablation. The bonded combination of acceptor substrate 510 and first phase substantially completed HKMG CMOS transistor tier 550 may now be ready for typical state of the art gate-last transistor formation completion.

As illustrated in FIG. 5G, the inter layer dielectric 508 may be chemical mechanically polished to expose the top of the poly-crystalline silicon dummy gates and create interlayer dielectric regions 508'. The dummy poly-crystalline silicon gates 504 may then be removed by etching and the hi-k gate dielectric 526 and the PMOS specific work function metal gate 528 may be deposited. The PMOS work function metal gate may be removed from the NMOS transistors and the NMOS specific work function metal gate 530 may be deposited. An aluminum fill may be performed on both NMOS and PMOS gates 532 and the metal chemical mechanically polished. For illustration clarity, the oxide layers used to facilitate the wafer to wafer bond are not shown.

Figure 5H:
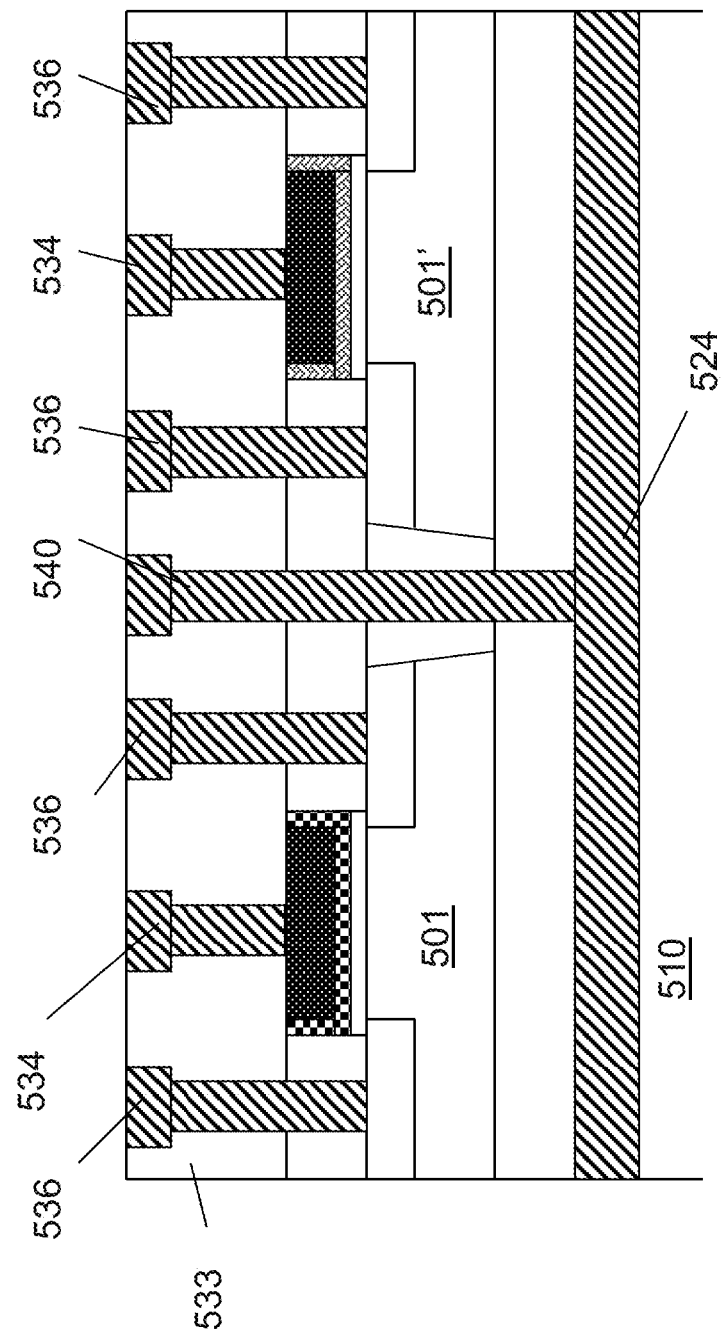

As illustrated in FIG. 5H, a low temperature dielectric layer 533 may be deposited and the typical gate 534 and source/drain 536 contact formation and metallization may now be performed to connect to and among the PMOS & NMOS transistors. Thru layer via (TLV) 540 may be lithographically defined, plasma/RIE etched, and metallization formed. TLV 540 electrically couples the transistor layer metallization to the acceptor substrate 510 at acceptor wafer metal connect strip 524.

Persons of ordinary skill in the art will appreciate that the illustrations in FIGS. 5A through 5H are exemplary only and are not drawn to scale. Such skilled persons will further appreciate that many variations are possible such as, for example, the top metal layer may be formed to act as the acceptor wafer landing strips for a repeat of the above process flow to stack another preprocessed thin monocrystalline layer of two-phase formed transistors. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin monocrystalline layer, replace the gate electrode and gate oxide, and then proceed with low temperature interconnect processing. Moreover, other transistor types may be possible, such as, for example, RCAT and junction-less. Many other modifications within the scope of the invention will suggest themselves to such skilled persons after reading this specification. Thus the scope of the invention is to be limited only by the appended claims.

With reference to the discussion of FIGS. 5A to 5H, FIGS. 6A to 6G describe a process flow wherein CMOS transistors may be partially processed on a donor wafer, which may be temporarily bonded and transferred to a carrier or holder wafer, after which it may be cleaved, thinned and planarized before being layer transferred to an acceptor substrate. After bonding to the acceptor substrate, the temporary carrier or holder wafer may be removed, the surface planarized, and then the transistor and interconnections may be substantially completed with low temperature (below approximately 400° C.) processes. State of the art CMOS transistors may be constructed with methods that may be suitable for 3D IC manufacturing.

As illustrated in FIG. 6A, a donor wafer 606 may be processed in the typical state of the art HKMG gate-last manner up to the step prior to where CMP exposure of the poly-crystalline silicon dummy gates takes place. The donor wafer 606 may be a bulk mono-crystalline silicon wafer (shown), or a Silicon On Insulator (SOI) wafer, or a Germanium on Insulator (GeOI) wafer. Donor wafer 606 and CMOS dummy gates 602 are shown in the cross section illustration. These structures of FIG. 6A illustrate substantial completion of the first phase of transistor formation.

As illustrated in FIG. 6B, a layer transfer demarcation plane (shown as dashed line) 699 may be formed in donor wafer 606 by hydrogen implantation 616 or other methods as previously described. Both the donor wafer 606 top surface and carrier or holder silicon wafer 626 may be prepared for wafer bonding as previously described.

As illustrated in FIG. 6C, donor wafer 606 with the first phase of transistor formation substantially completed may be permanently bonded to carrier or holder silicon wafer 626 and may utilize oxide to oxide bonding.

As illustrated in FIG. 6D, the portion of the donor wafer 606 that may be above the layer transfer demarcation plane 699 may be removed by cleaving or other processes as previously described, such as, for example, ion-cut or other methods. The remaining donor wafer 606' may be thinned by chemical mechanical polishing (CMP). Thus dummy gates 602 and associated remaining donor wafer 606' may be transferred and permanently bonded to carrier or holder silicon wafer 626.

Figure 6E:
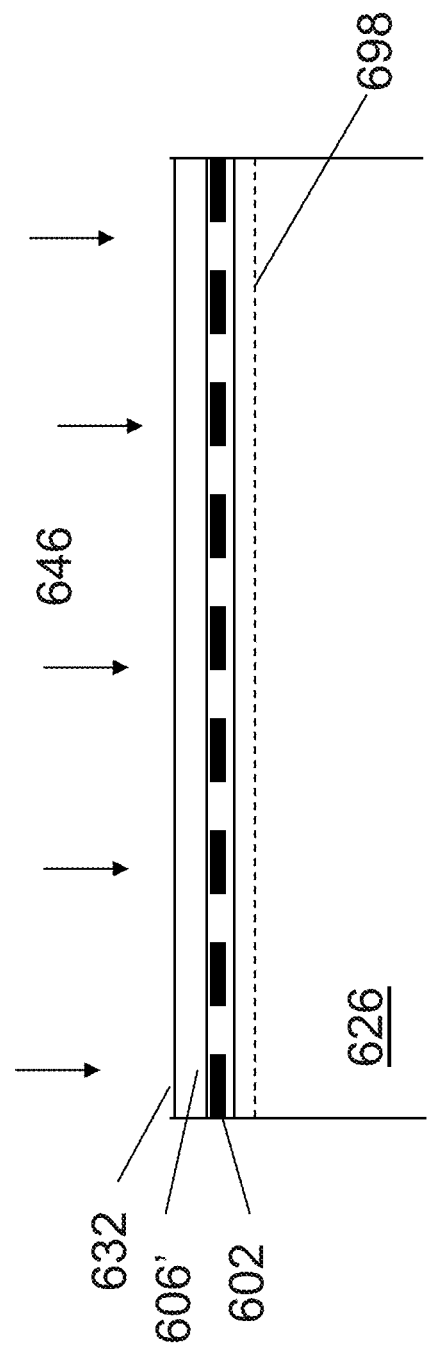

As illustrated in FIG. 6E, a thin layer of oxide 632 may be deposited on the remaining donor wafer 606' open surface. A layer transfer demarcation plane (shown as dashed line) 698 may be formed in carrier or holder silicon wafer 626 by hydrogen implantation 646 or other methods as previously described.

Figure 6F:
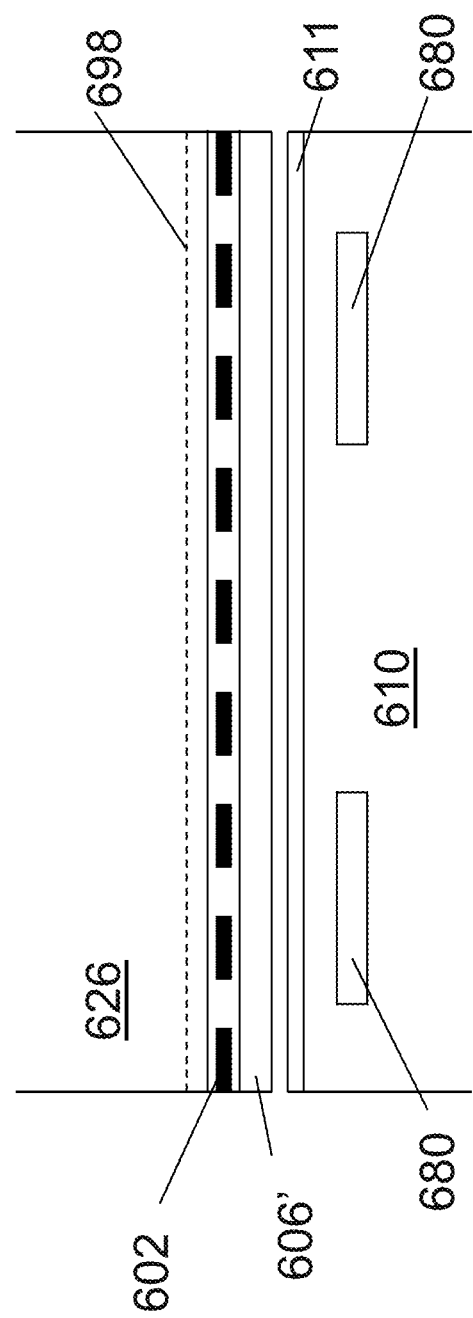

As illustrated in FIG. 6F, carrier or holder silicon wafer 626, with layer transfer demarcation plane (shown as dashed line) 698, dummy gates 602, oxide 632, and remaining donor wafer 606' may be prepared for wafer bonding as previously described and then low temperature (less than approximately 400° C.) aligned and bonded to acceptor substrate 610. Acceptor substrate 610 may include pre-made circuitry as described previously, top oxide layer 611, and acceptor wafer metal connect strip 680.

As illustrated in FIG. 6G, the portion of the carrier or holder silicon wafer 626 that may be above the layer transfer demarcation plane 698 may be removed by cleaving or other processes as previously described, such as, for example, ion-cut or other methods. The remaining carrier or holder material may be removed by chemical mechanical polishing (CMP) or a wet etchant, such as, for example, Potassium Hydroxide (KOH). A second CMP may be performed to expose the top of the dummy gates 602. The bonded combination of acceptor substrate 610 and first phase substantially completed HKMG CMOS transistor tier including dummy gates 602 and remaining donor wafer 606' may now be ready for typical state of the art gate-last transistor formation completion as described previously with reference to FIGS. 5G and 5H.

Persons of ordinary skill in the art will appreciate that the illustrations in FIGS. 6A through 6G are exemplary only and are not drawn to scale. Such skilled persons will further appreciate that many variations are possible such as, for example, the carrier or holder wafer may be composed of some other material than mono-crystalline silicon, or the top metal layer may be formed to act as the acceptor wafer landing strips for a repeat of the above process flow to stack another preprocessed thin mono-crystalline layer of two-phase formed transistors. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Many other modifications within the scope of the invention will suggest themselves to such skilled persons after reading this specification. Thus the scope of the invention is to be limited only by the appended claims.

FIGS. 7A to 7E illustrate an overall process flow similar to FIG. 5 wherein CMOS transistors may be partially processed on a donor wafer, temporarily transferred to a carrier or holder substrate and thinned, a double or back-gate may be processed, layer transferred to an acceptor substrate, and then the transistor and interconnections may be substantially completed in low temperature (below approximately 400° C.). This may provide a back-gated transistor (double gated) in a face-up process flow. State of the art CMOS transistors may be constructed with methods that may be suitable for 3D IC manufacturing.

Figure 7A:
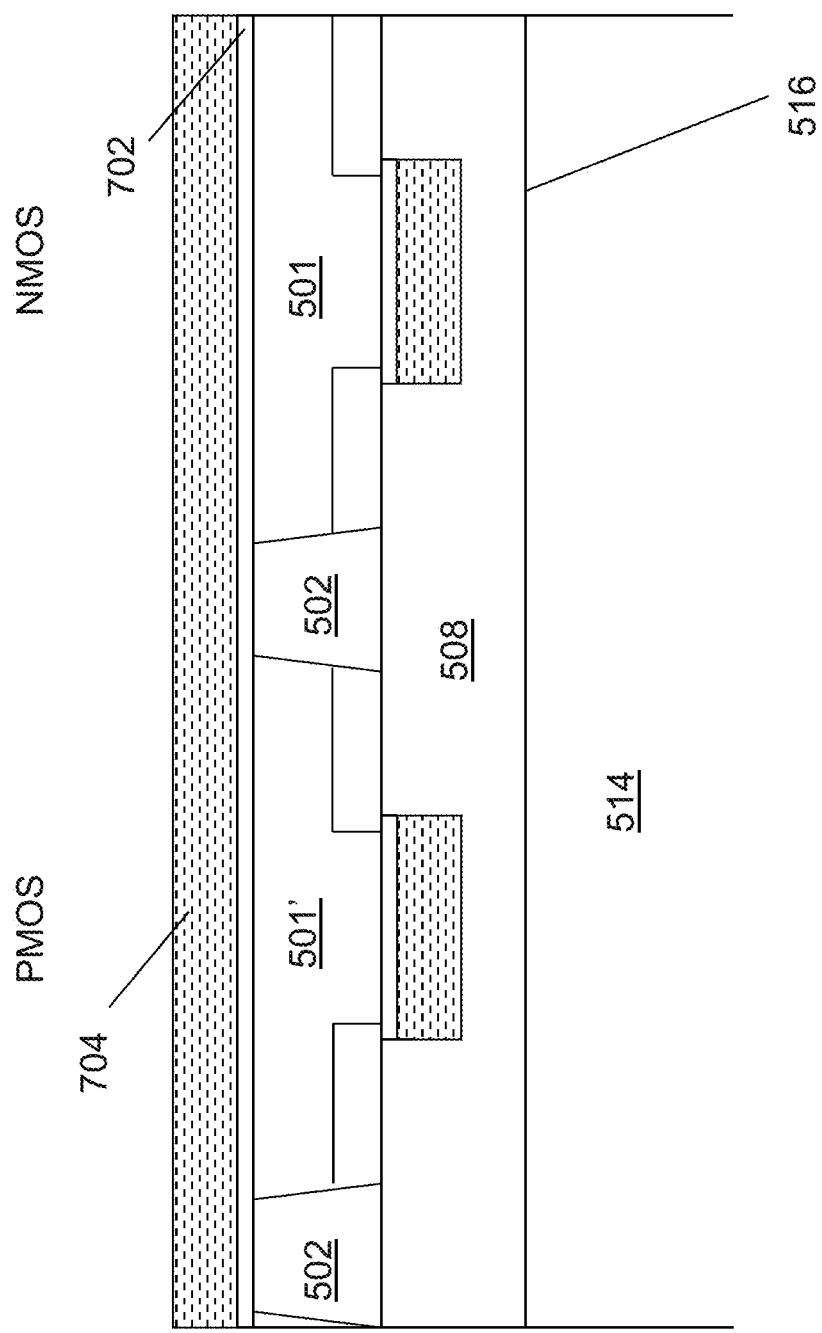
FIG. 7A-7E are exemplary drawing illustrations of the formation of top planar transistors.

As illustrated in FIG. 7A, planar CMOS dummy gate transistors may be processed as described in FIGS. 5A, 5B, 5C, and 5D. Carrier or holder substrate 514, bonding interface 516, inter layer dielectric (ILD) 508, shallow trench isolation (STI) regions 502 and remaining donor wafer regions 501 and 501' are shown. These structures illustrate substantial completion of the first phase of transistor formation. A second gate dielectric 702 may be grown or deposited and second gate metal material 704 may be deposited. The gate dielectric 702 and second gate metal material 704 may be formed with low temperature (approximately less than 400° C.) materials and processing, such as, for example, previously described TEL SPA gate oxide and amorphous silicon, ALD techniques, or hi-k metal gate stack (HKMG), or may be formed with a higher temperature gate oxide or oxynitride and doped poly-crystalline silicon if the carrier or holder substrate bond may be permanent and the dopant movement or diffusion in the underlying transistors may be accounted or compensated for.

Figure 7B:
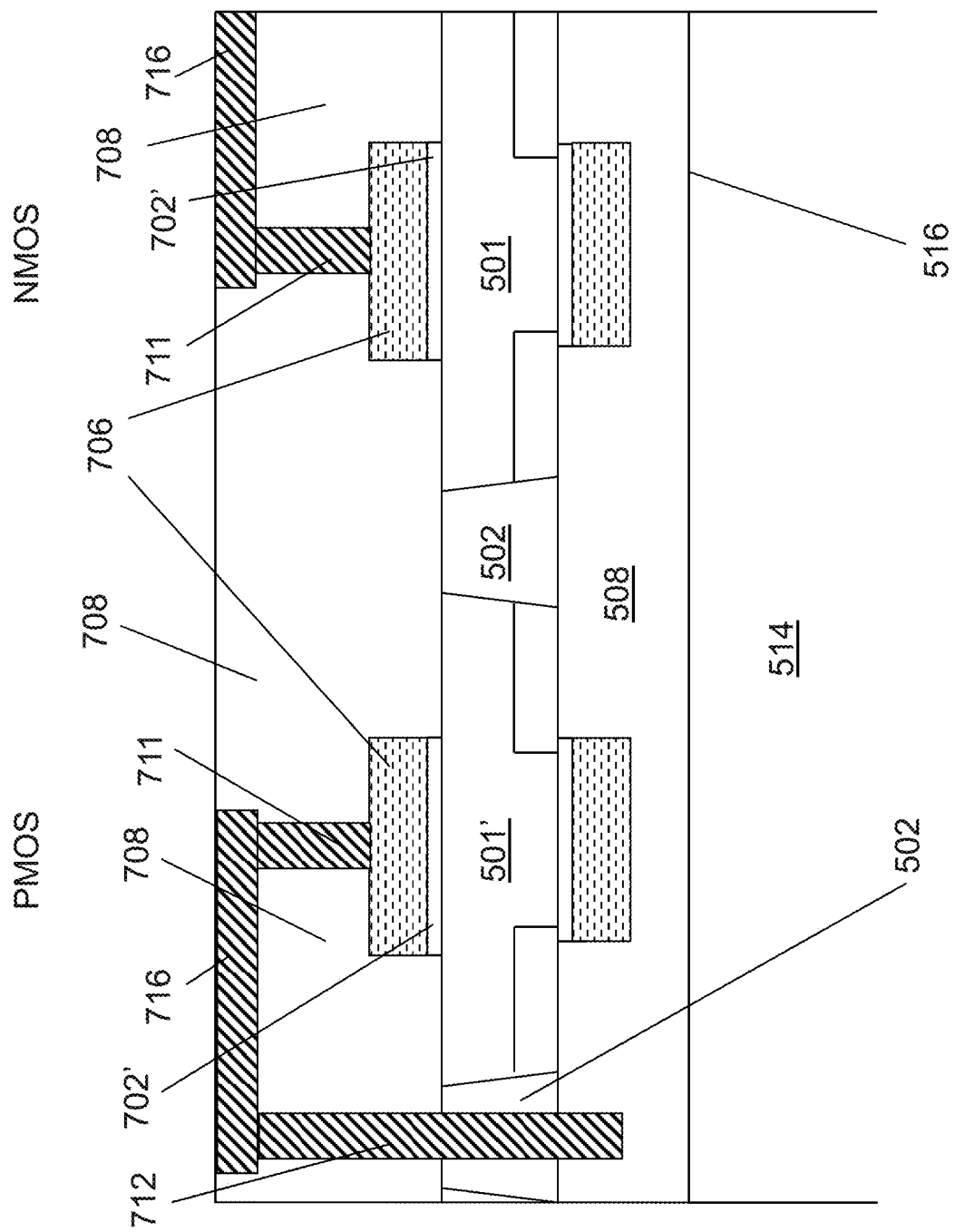

As illustrated in FIG. 7B, the gate stacks may be lithographically defined and plasma/RIE etched removing second gate metal material 704 and gate dielectric 702 leaving second transistor gates 706 and associated gate dielectrics 702' remaining Inter layer dielectric 708 may be deposited and planarized, and then second gate contacts 711 and partial thru layer via 712 and associated metallization 716 may be conventionally formed.

Figure 7C:
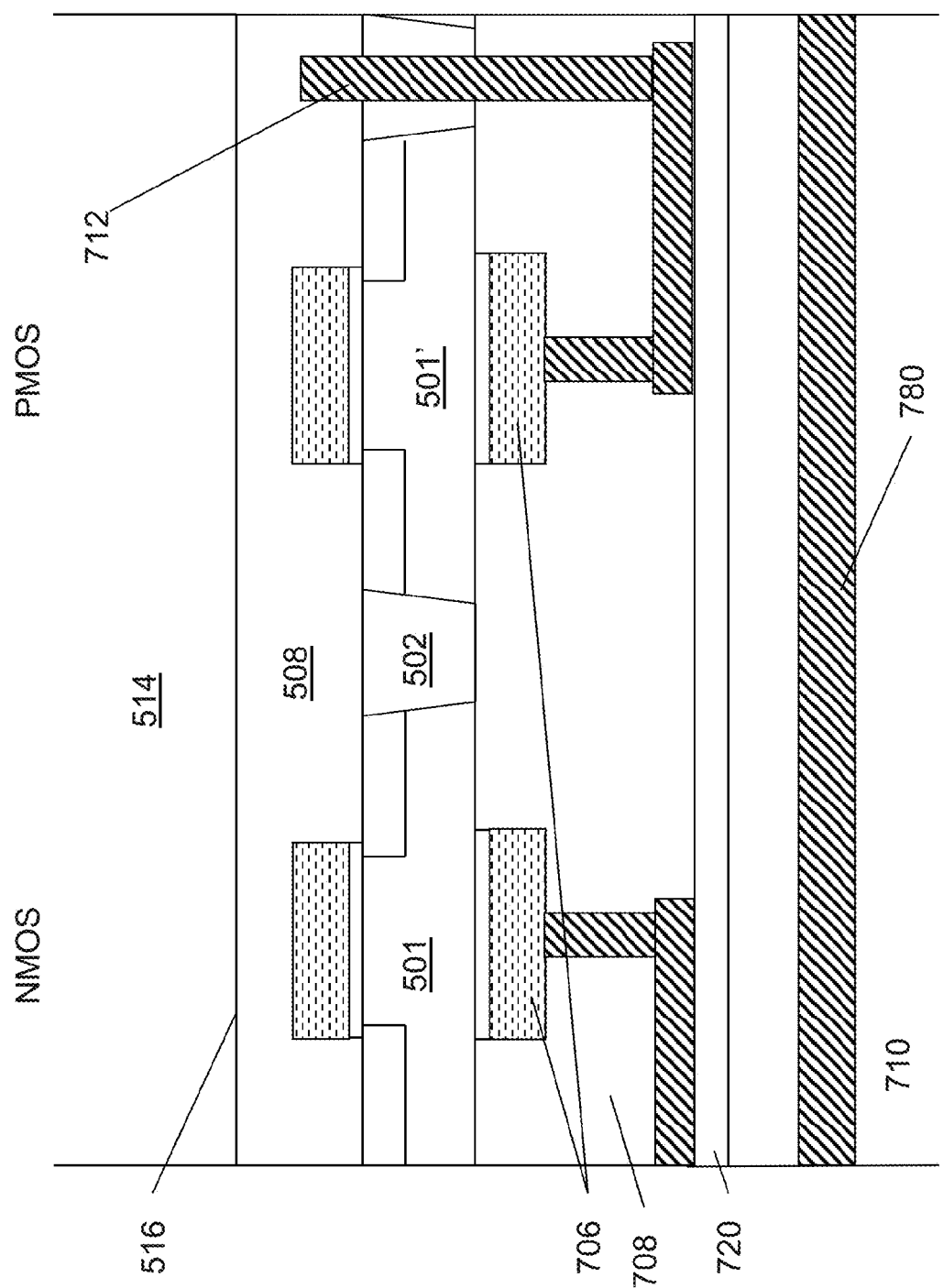

As illustrated in FIG. 7C, oxide layer 720 may be deposited on the carrier or holder substrate with processed donor wafer surface for wafer bonding and electrical isolation of the metallization 716 purposes. Both oxide layer 720 surface and acceptor substrate 710 may be prepared for wafer bonding as previously described and then low temperature (less than approximately 400° C.) aligned and bonded. Acceptor wafer metal connect strip 780 is shown.

Figure 7D:
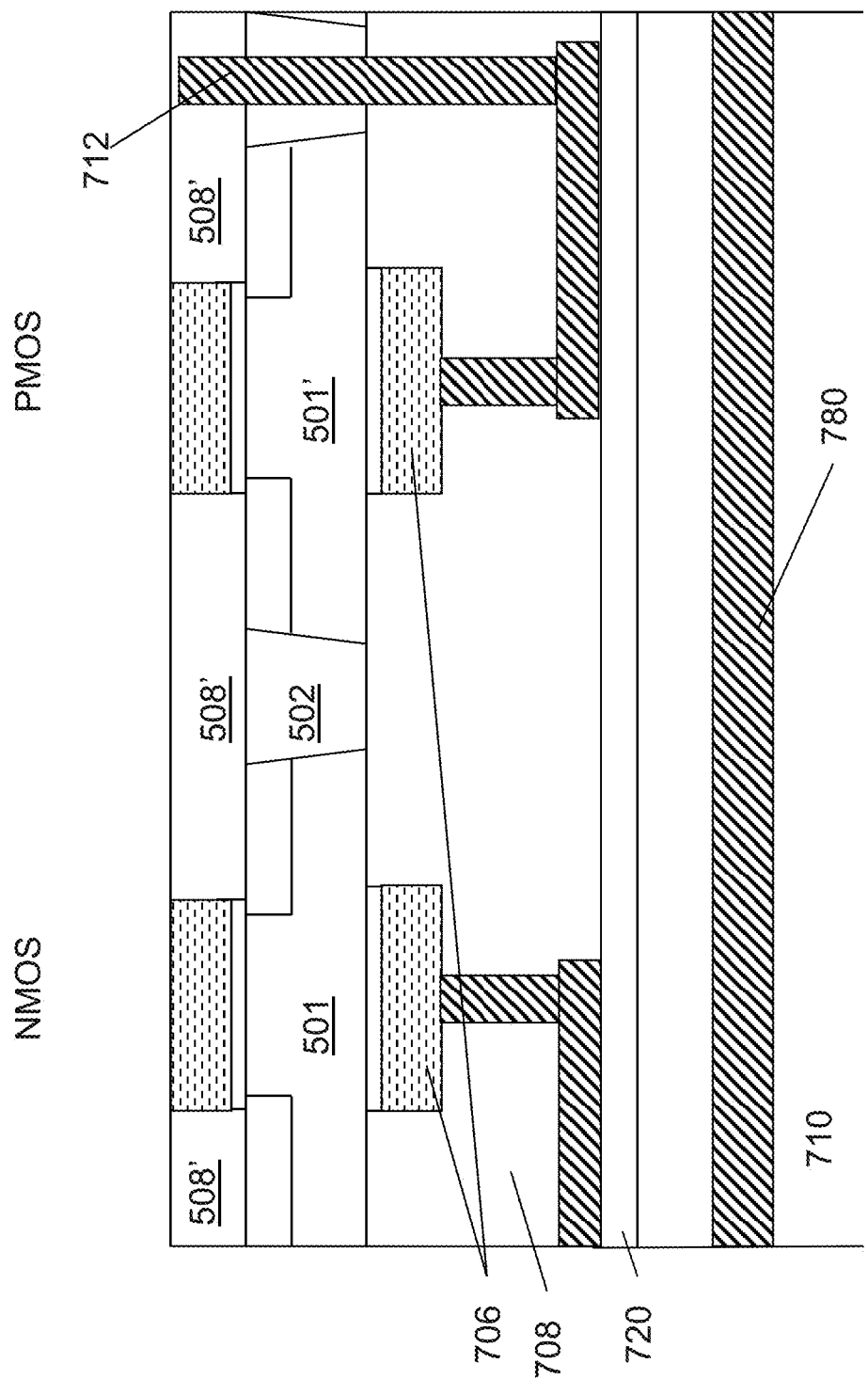

As illustrated in FIG. 7D, the carrier or holder substrate 514 may then be released at interface 516 using a low temperature process such as, for example, laser ablation. The bonded combination of acceptor substrate 510 and first phase substantially completed HKMG CMOS transistors may now be ready for typical state of the art gate-last transistor formation completion. The inter layer dielectric 508 may be chemical mechanically polished to expose the top of the poly-crystalline silicon dummy gates and create interlayer dielectric regions 508'.

Figure 7E:
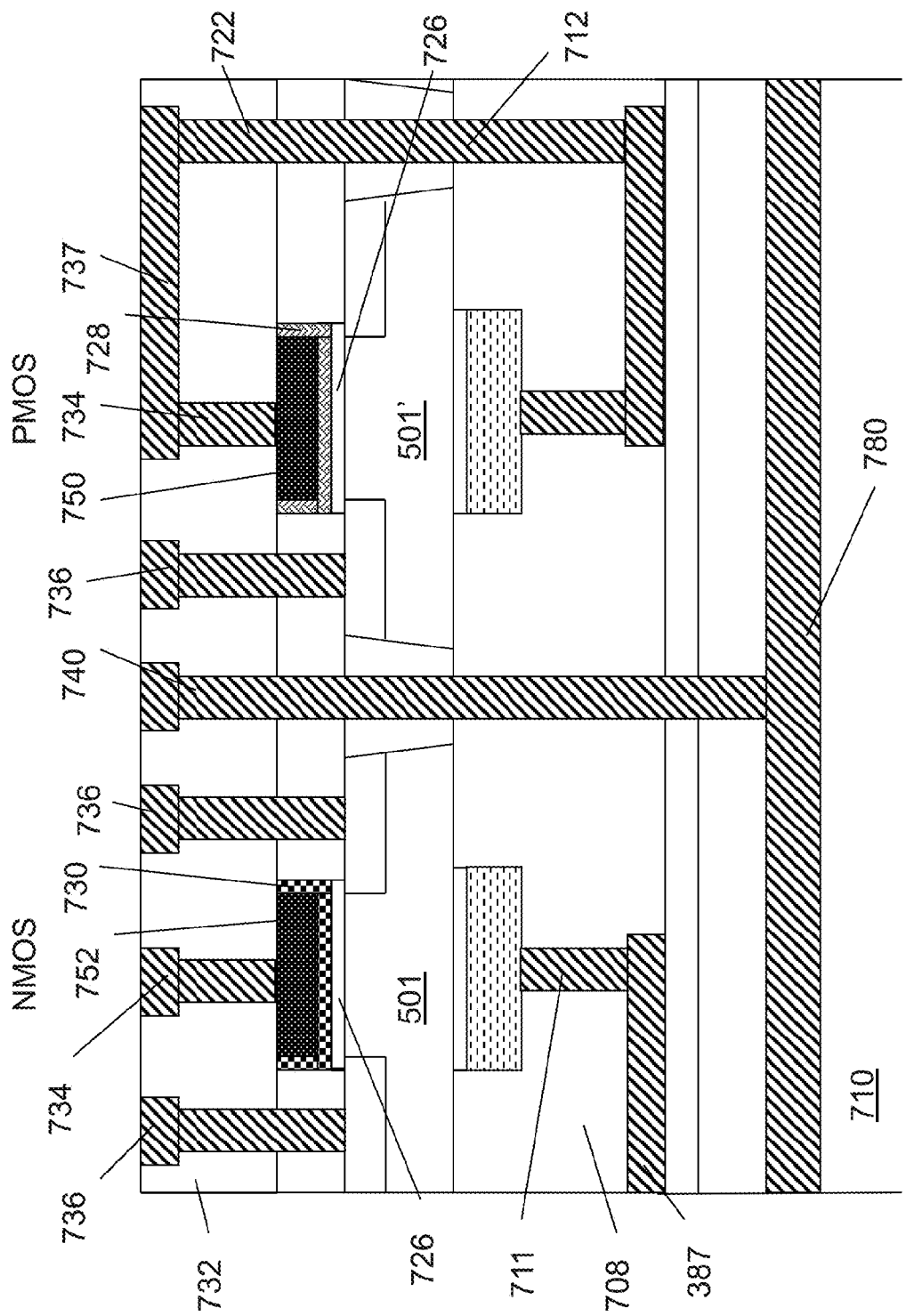

As illustrated in FIG. 7E, the dummy poly-crystalline silicon gates may then be removed by etching and the hi-k gate dielectric 726 and the PMOS specific work function metal gate 728 may be deposited. The PMOS work function metal gate may be removed from the NMOS transistors and the NMOS specific work function metal gate 730 may be deposited. An aluminum fill may be performed and the metal chemical mechanically polished to create NMOS gate 752 and PMOS gate 750. A low temperature dielectric layer 732 may be deposited and the typical gate contact 734 and source/drain contact 736 formation and associated metallization may now be performed to connect to and among the PMOS & NMOS transistors. Thru layer via (TLV) 722 may be lithographically defined, plasma/RIE etched, and metallization formed to connect to partial thru layer via 712. TLV 740 may be lithographically defined, plasma/RIE etched, and metallization formed to electrically couple the transistor layer metallization to the acceptor substrate 710 via acceptor wafer metal connect strip 780. The PMOS transistor may be back-gated by connecting the PMOS gate 750 to the bottom gate thru gate contact 734 to metal line 737 and to partial thru layer via 712 and TLV 722. The NMOS transistor may be back biased by connecting metal line metallization 716 to a back bias circuit that may be in the top transistor level or in the acceptor substrate 710.

Persons of ordinary skill in the art will appreciate that the illustrations in FIGS. 7A through 7E are exemplary only and are not drawn to scale. Such skilled persons will further appreciate that many variations are possible such as, for example, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Such skilled persons will further appreciate that the above process flow may be utilized to create fully depleted SOI transistors, or junction-less, or RCATs. Many other modifications within the scope of the invention will suggest themselves to such skilled persons after reading this specification. Thus the scope of the invention is to be limited only by the appended claims.

FIGS. 8A to 8D describe an overall process flow wherein CMOS transistors may be partially processed on a donor wafer, ion implanted for later cleaving, transistors and some interconnect substantially completed, then layer transferred to an acceptor substrate, donor cleaved and thinned, back-gate processing, and then interconnections may be substantially completed. This provides a back-gated transistor (double gated) in a transistor 'face-down' process flow. State of the art CMOS transistors may be constructed with methods that may be suitable for 3D IC manufacturing.

Figure 8A:
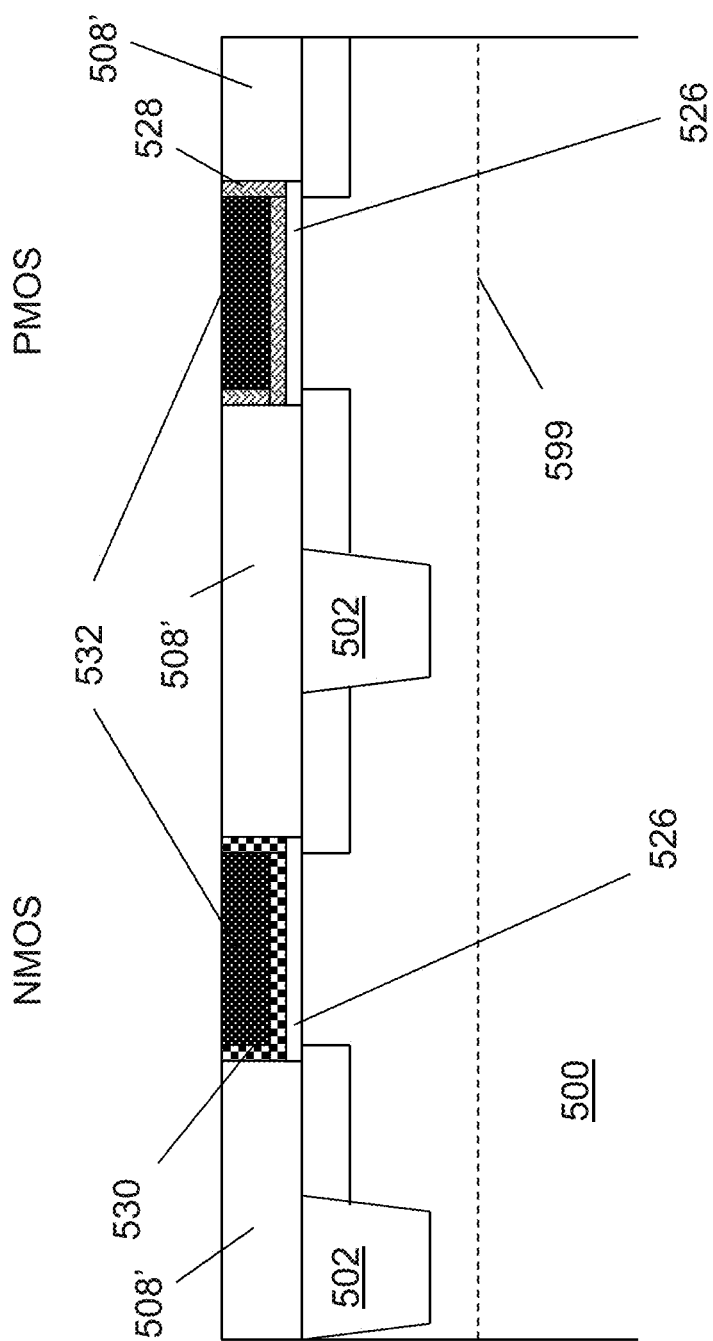

As illustrated in FIG. 8A, planar CMOS dummy gate transistors may be processed as described in FIGS. 5A and 5B. The dummy gate transistors may now be ready for typical state of the art gate-last transistor formation completion. The inter layer dielectric may be chemical mechanically polished to expose the top of the poly-crystalline silicon dummy gates and create interlayer dielectric regions 508'. The dummy gates may then be removed by etching and the hi-k gate dielectric 526 and the PMOS specific work function metal gate 528 may be deposited. The PMOS work function metal gate may be removed from the NMOS transistors and the NMOS specific work function metal gate 530 may be deposited. An aluminum fill may be performed and the metal chemical mechanically polished to create NMOS and PMOS gates 532. Thus donor wafer 500, layer transfer demarcation plane (shown as dashed line) 599, shallow trench isolation (STI) regions 502, interlayer dielectric regions 508', hi-k gate dielectric 526, PMOS specific work function metal gate 528, NMOS specific work function metal gate 530, and NMOS and PMOS gates 532 are shown.

Figure 8B:
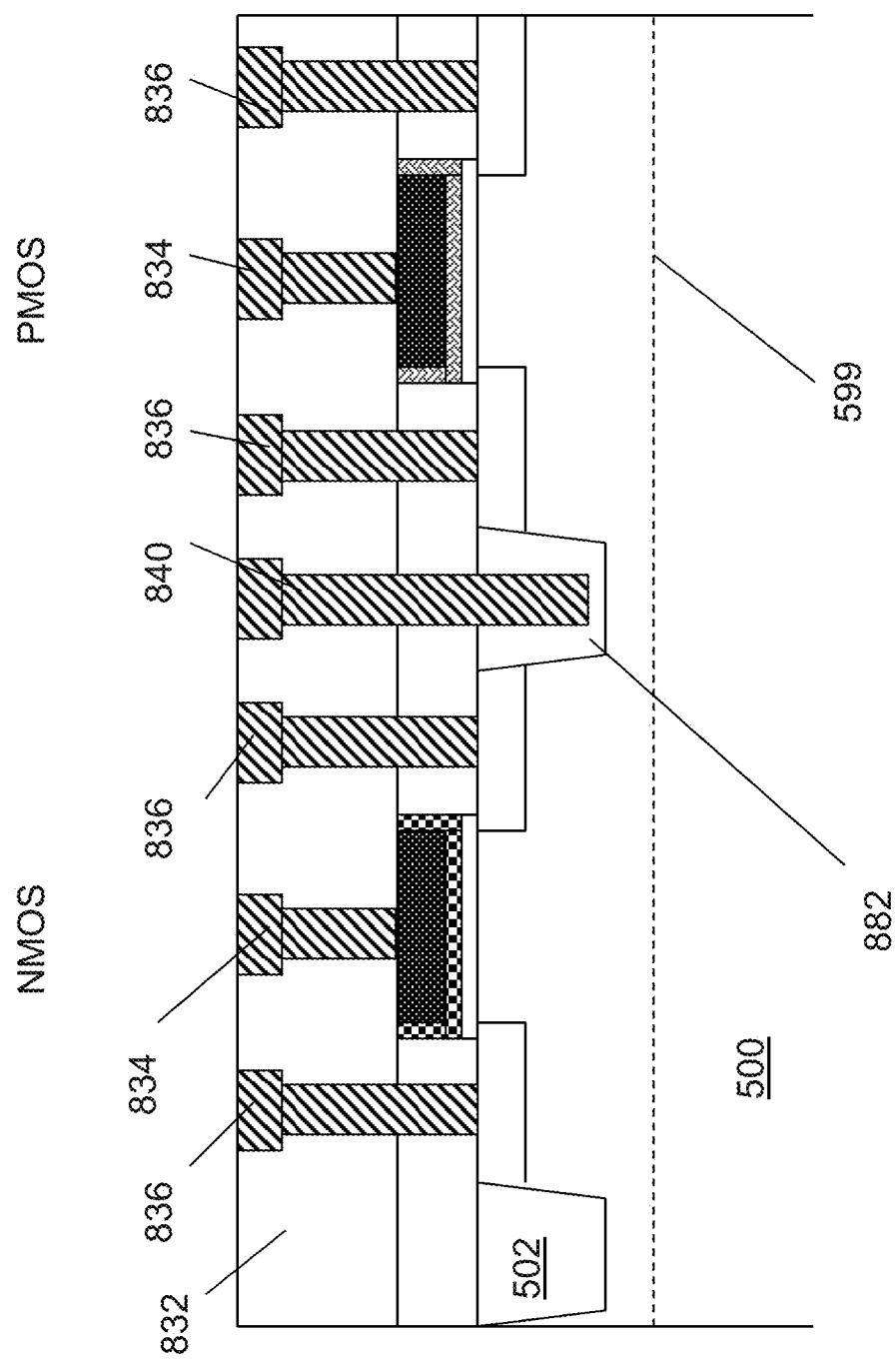

As illustrated in FIG. 8B, a low temperature dielectric layer 832 may be deposited and the typical gate 834 and source/drain 836 contact formation and metallization may now be performed to connect to and among the PMOS & NMOS transistors. Partial top to bottom via 840 may be lithographically defined, plasma/RIE etched into STI isolation region 882, and metallization formed.

Figure 8C:
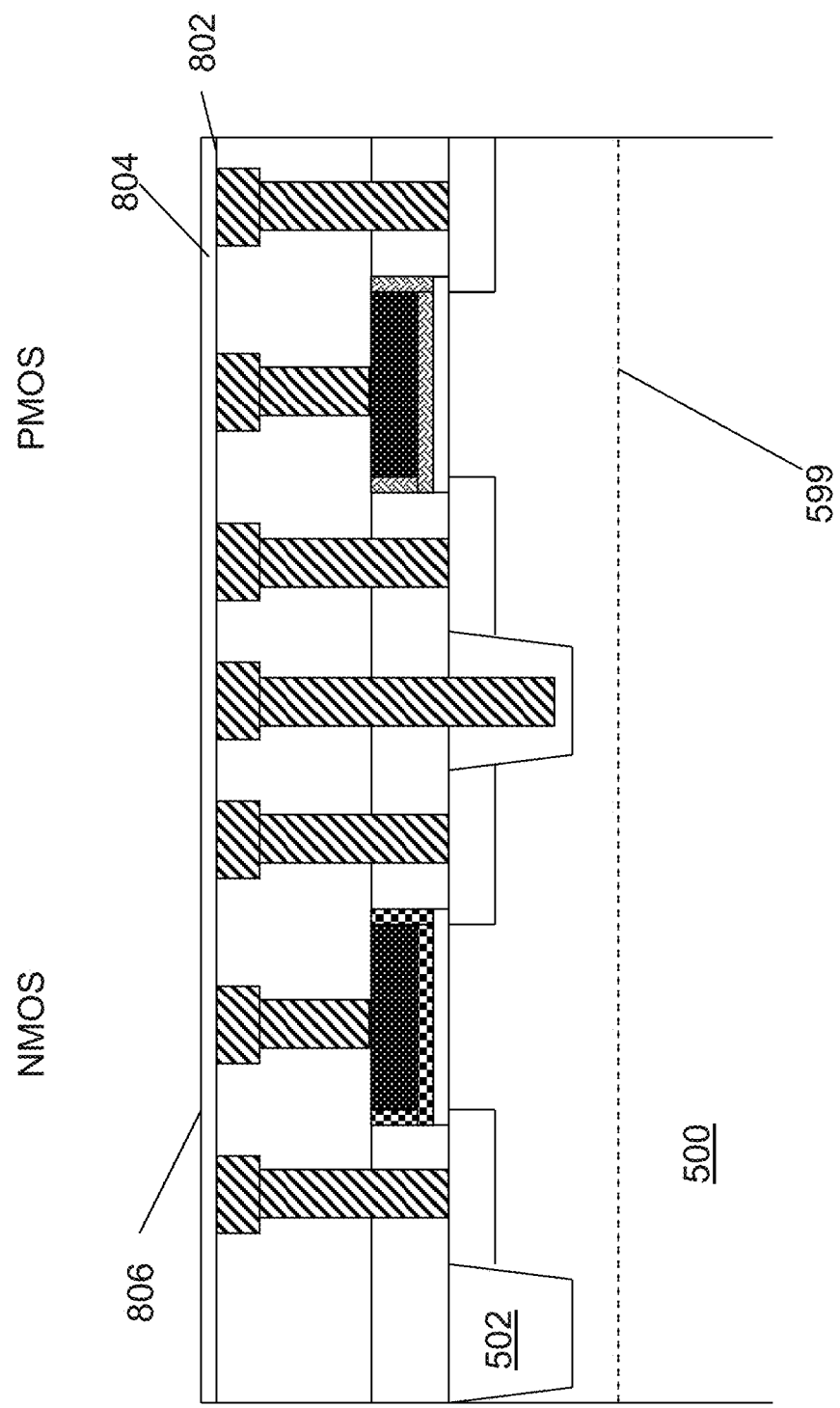

As illustrated in FIG. 8C, oxide layer 804 may be deposited on the processed donor wafer 500 surface 802 for wafer bonding and electrical isolation of the metallization purposes.

As illustrated in FIG. 8D, oxide layer 804 surface 806 and acceptor substrate 810 may be prepared for wafer bonding as previously described and then donor wafer 500 may be aligned to the acceptor substrate 510 and they may be bonded at a low temperature (less than approximately 400° C.). Acceptor wafer metal connect strip 880 and the STI isolation 830 where the future thru layer via (TLV) may be formed is shown.

Figure 8E:
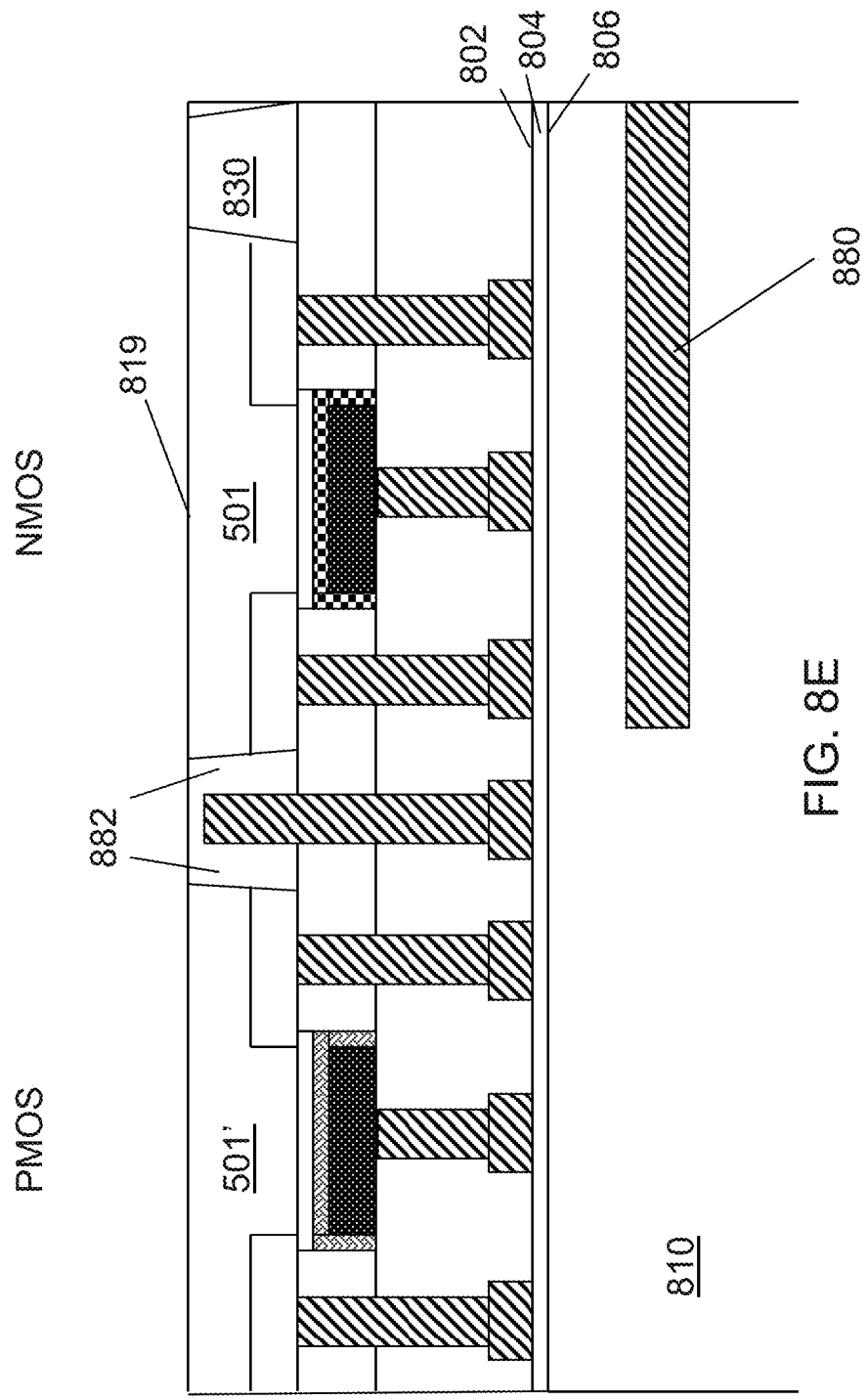

As illustrated in FIG. 8E, the portion of the donor wafer 500 that may be above the layer transfer demarcation plane 599 may be removed by cleaving or other processes as previously described, such as, for example, ion-cut or other methods. The remaining donor wafer regions 501 and 501' may be thinned by chemical mechanical polishing (CMP) so that the transistor STI regions 882 and 830 may be exposed at the donor wafer face 819. Alternatively, the CMP could continue to the bottom of the junctions to eventually create fully depleted SOI transistors as may be discussed later with reference to FIG. 8F-2.

Figure 8F:
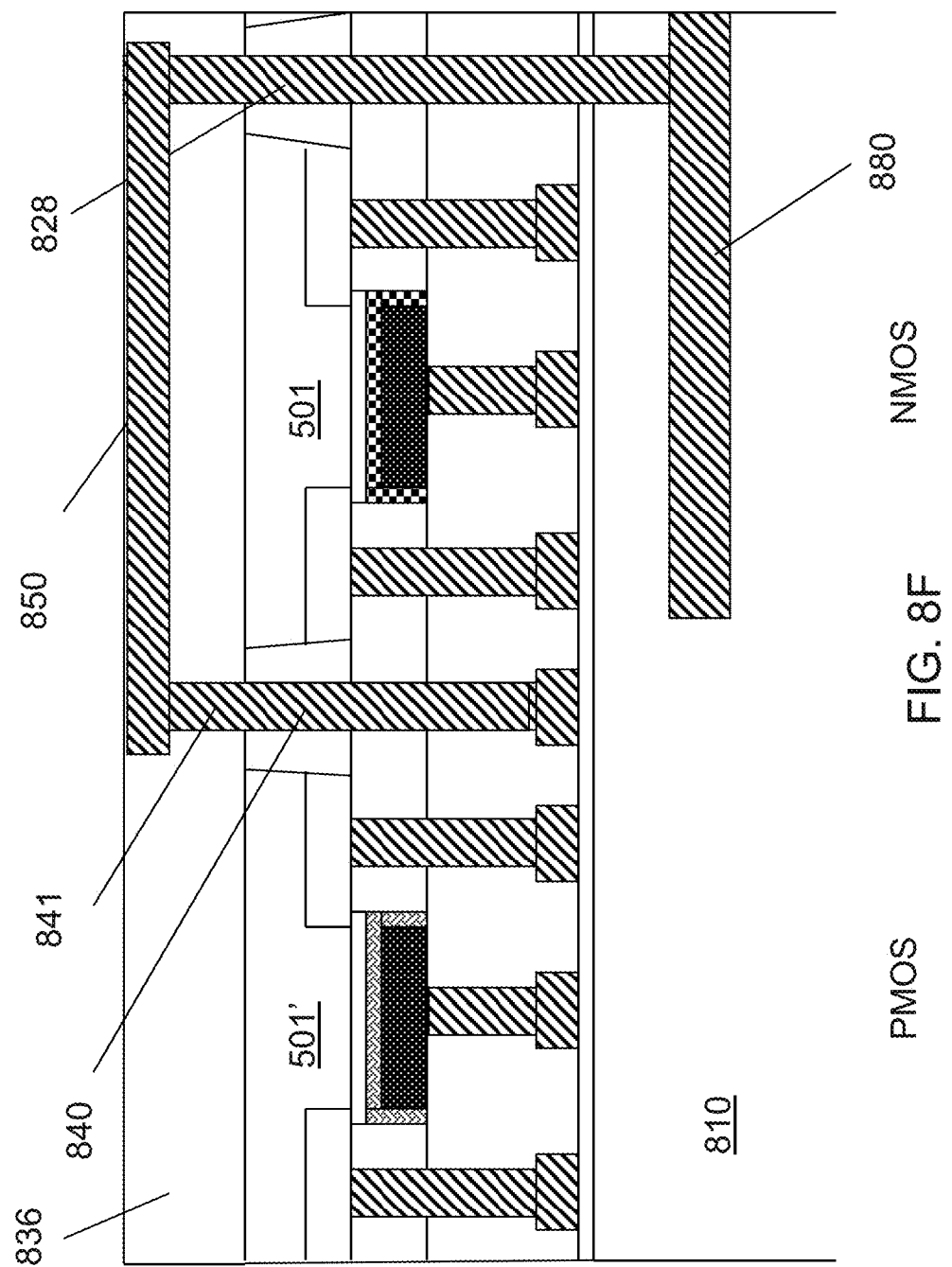
Figures 1, 8F:
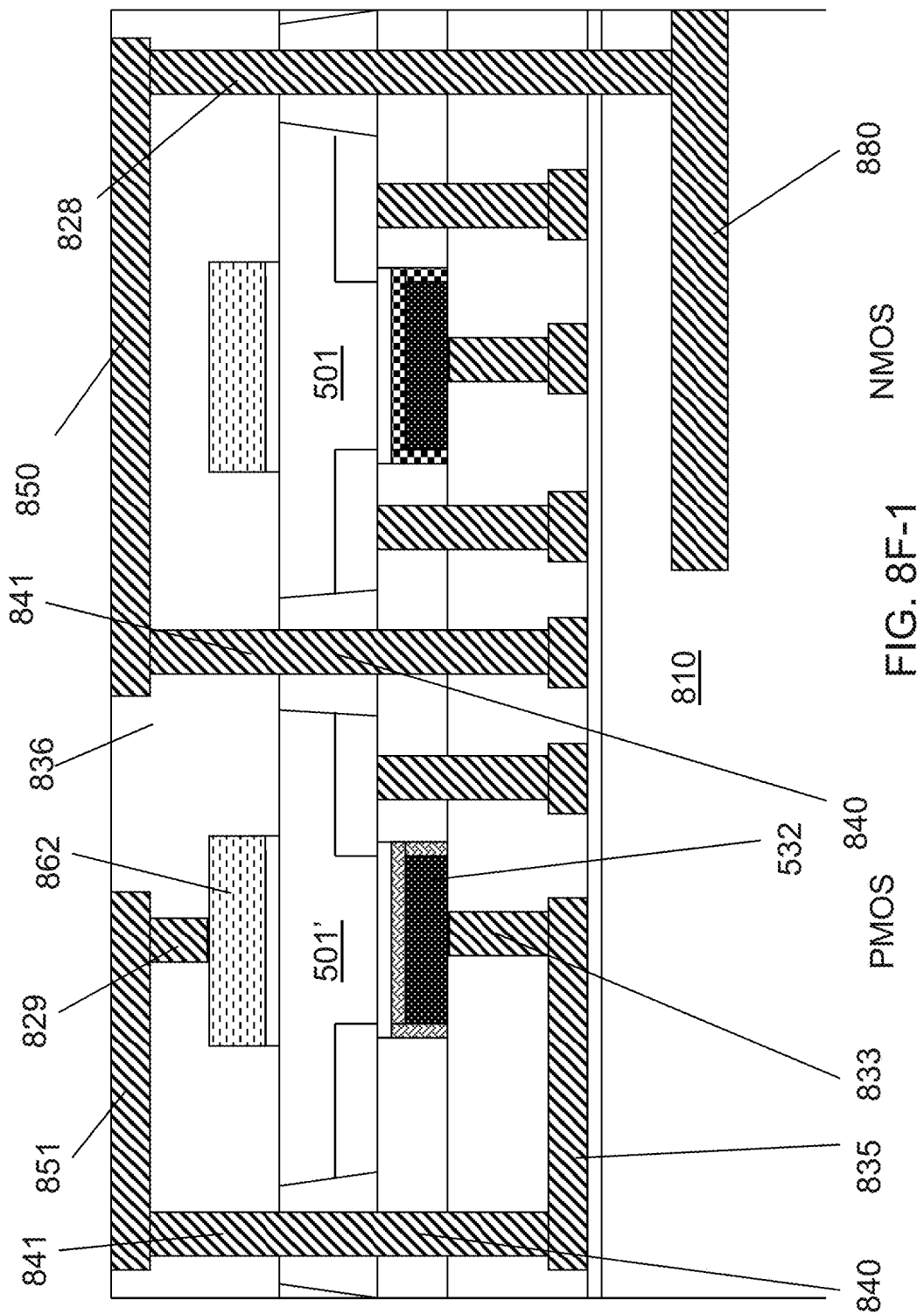

As illustrated in FIG. 8F, a low-temperature oxide or low-k dielectric 836 may be deposited and planarized. The thru layer via (TLV) 828 may be lithographically defined and plasma/RIE etched. Contact 841 may be lithographically defined and plasma/RIE etched to provide connection to partial top to bottom via 840. Metallization may be formed for interconnection purposes. Donor wafer to acceptor wafer electrical coupling may be provided by partial top to bottom via 840 connecting to contact 841 connecting to metal line 850 connecting to thru layer via (TLV) 828 connecting to acceptor metal strip 880.

The face down flow may have some potential advantages such as, for example, enabling double gate transistors, back biased transistors, 4 terminal transistors, or access to the floating body in memory applications.

As illustrated in FIG. 8E-1, a back gate for a double gate transistor may be constructed. A second gate dielectric 860 may be grown or deposited and second gate metal material 862 may be deposited. The gate dielectric 860 and second gate metal material 862 may be formed with low temperature (approximately less than 400° C.) materials and processing, such as, for example, previously described TEL SPA gate oxide and amorphous silicon, ALD techniques, or hi-k metal gate stack (HKMG). The gate stacks may be lithographically defined and plasma/RIE etched.

As illustrated in FIG. 8F-1, a low-temperature oxide or low-k dielectric 836 may be deposited and planarized. The thru layer via (TLV) 828 may be lithographically defined and plasma/RIE etched. Contacts 841 and 829 may be lithographically defined and plasma/RIE etched to provide connection to partial top to bottom via 840 or to the second gate. Metallization may be formed for interconnection purposes. Donor wafer to acceptor wafer electrical connections may be provided by partial top to bottom via 840 connecting to contact 841 connecting to metal line 850 connecting to thru layer via (TLV) 828 connecting to acceptor metal strip 880. Back gate or double gate electrical coupling may be provided by PMOS gate 532 connecting to gate contact 833 connecting to metal line 835 connecting to partial top to bottom via 840 connecting to contact 841 connecting to metal line 851 connecting to contact 829 connecting to back gate 862.

Figures 2, 8F:
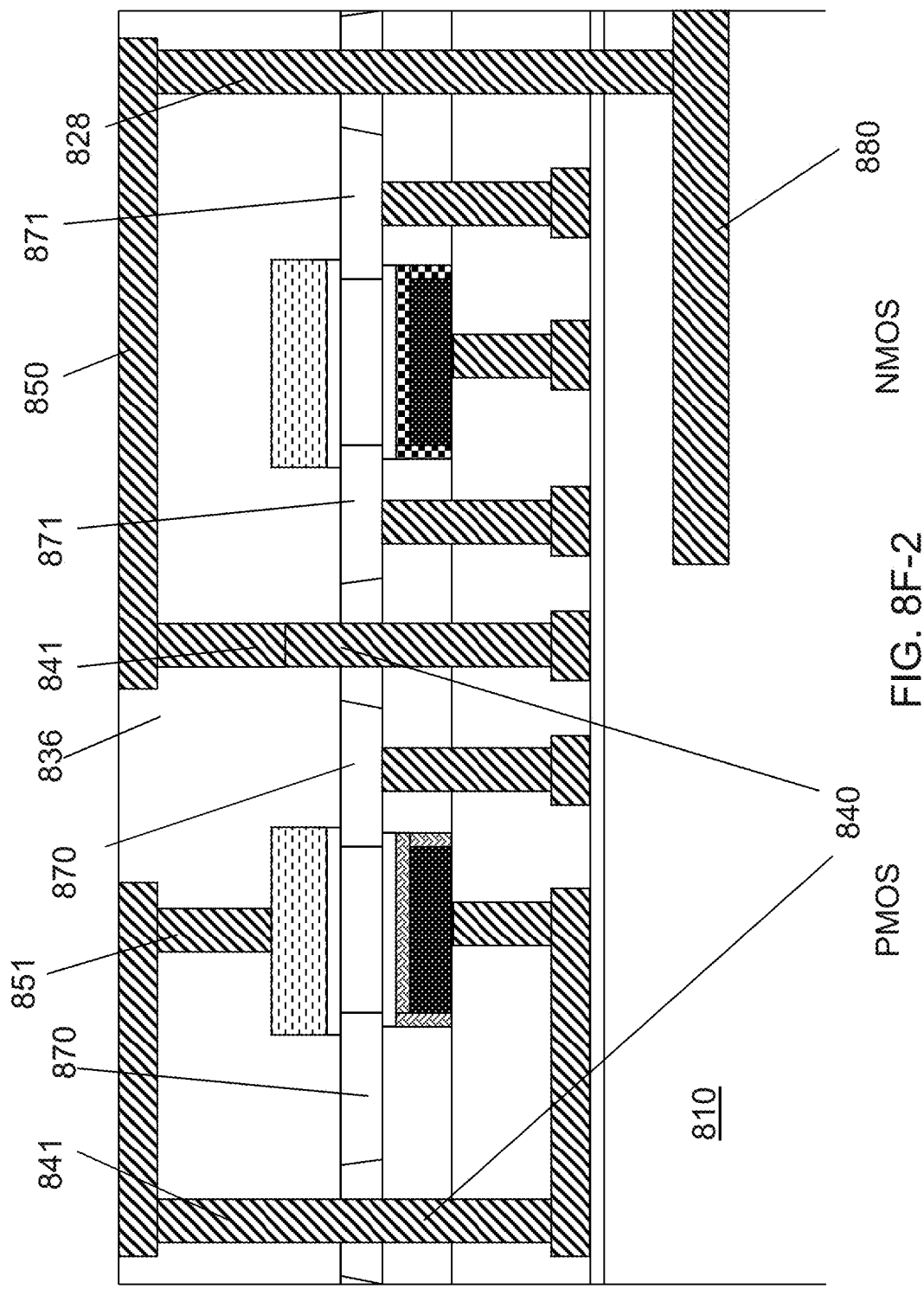

As illustrated in FIG. 8F-2, fully depleted SOI transistors with P+ junctions 870 and N+ junctions 871 may be alternatively constructed in this flow. In the FIG. 8E step description above, the CMP may be continued to the bottom of the junctions, thus creating fully depleted SOI transistors.

Persons of ordinary skill in the art will appreciate that the illustrations in FIGS. 8A through 8F-2 are exemplary only and are not drawn to scale. Such skilled persons will further appreciate that many variations are possible such as, for example, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Such skilled persons will further appreciate that the above process flow may be utilized to create junction-less transistors, or RCATs. Many other modifications within the scope of the invention will suggest themselves to such skilled persons after reading this specification. Thus the scope of the invention is to be limited only by the appended claims.

FIGS. 9A to 9K describe an overall process flow utilizing a carrier wafer or a holder wafer wherein CMOS transistors may be processed on two sides of a donor wafer, NMOS on one side and PMOS on the other, and then the NMOS on top of PMOS donor wafer may be transferred to an target or acceptor substrate with pre-processed circuitry. State of the art CMOS transistors and compact 3D library cells may be constructed with methods that may be suitable for 3D IC manufacturing.

Figure 9A:
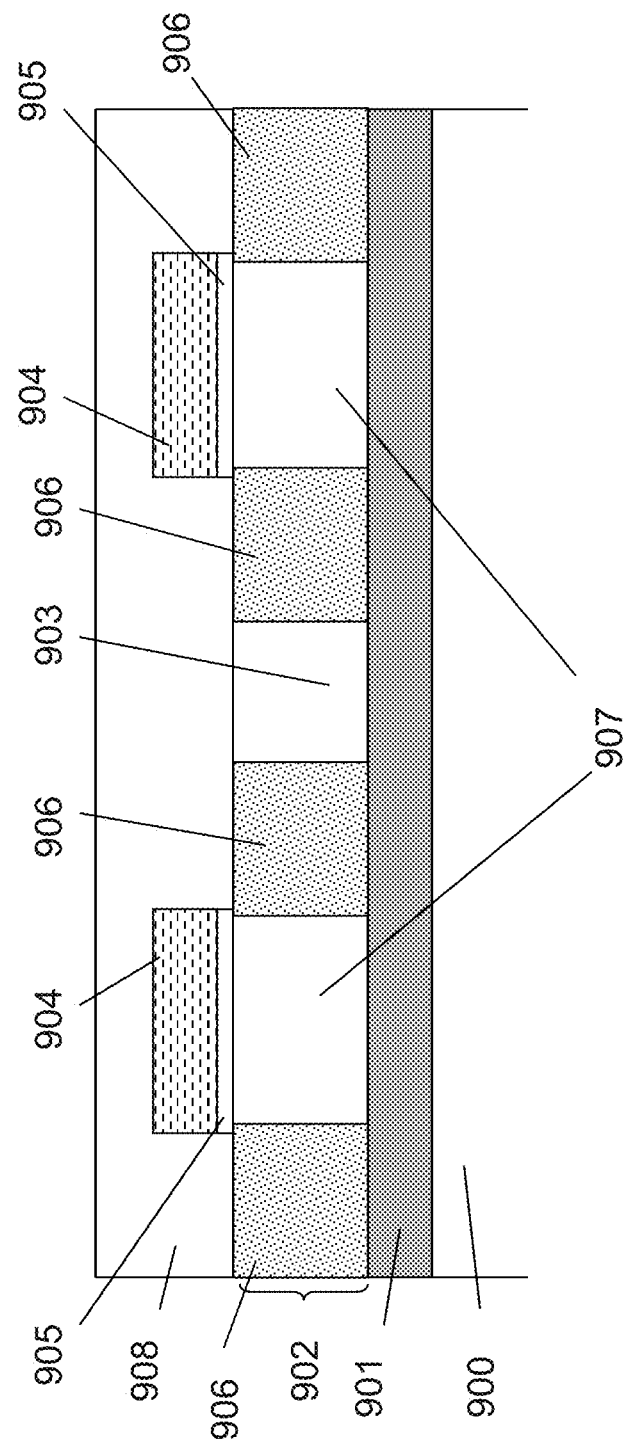

As illustrated in FIG. 9A, a Silicon On Oxide (SOI) donor wafer substrate 900 may be processed in the typical state of the art HKMG gate-last manner up to the step prior to where CMP exposure of the poly-crystalline silicon dummy gates takes place, but forming only NMOS transistors. SOI donor wafer substrate 900, the buried oxide (i.e., BOX) 901, the thin silicon layer 902 of the SOI wafer, the shallow trench isolation (STI) 903 among NMOS transistors, the poly-crystalline silicon 904 and gate dielectric 905 of the NMOS dummy gates, NMOS source and drains 906, the NMOS transistor channel 907, and the NMOS interlayer dielectric (ILD) 908 are shown in the cross section illustration. These structures of FIG. 9A illustrate the substantial completion of the first phase of NMOS transistor formation. The thermal cycles of the NMOS HKMG process may be adjusted to compensate for later thermal processing.

As illustrated in FIG. 9B, a layer transfer demarcation plane (shown as dashed line) 999 may be formed in SOI donor wafer substrate 900 by hydrogen implantation 910 or other methods as previously described.

As illustrated in FIG. 9C, oxide 916 may be deposited onto carrier or holder wafer 920 and then both the SOI donor wafer substrate 900 and carrier or holder wafer 920 may be prepared for wafer bonding as previously described, and then may be permanently oxide to oxide bonded together at interface 914. Carrier or holder wafer 920 may also be called a carrier or holder substrate, and may be composed of mono-crystalline silicon, or other materials.

As illustrated in FIG. 9D, the portion of the SOI donor wafer substrate 900 that may be below the layer transfer demarcation plane 999 may be removed by cleaving or other processes as previously described, such as, for example, ion-cut or other methods. The remaining donor wafer layer 900' may be thinned by chemical mechanical polishing (CMP) and surface 922 may be prepared for transistor formation.

As illustrated in FIG. 9E, donor wafer layer 900' at surface 922 may be processed in the typical state of the art HKMG gate last processing manner up to the step prior to where CMP exposure of the poly-crystalline silicon dummy gates takes place to form the PMOS transistors with dummy gates. The PMOS transistors may be precisely aligned at state of the art tolerances to the NMOS transistors as a result of the shared substrate possessing the same alignment marks. Carrier or holder wafer 920, oxide 916, BOX 901, the thin silicon layer 902 of the SOI wafer, the shallow trench isolation (STI) 903 among NMOS transistors, the poly-crystalline silicon 904 and gate dielectric 905 of the NMOS dummy gates, NMOS source and drains 906, the NMOS transistor channels 907, and the NMOS interlayer dielectric (ILD) 908, donor wafer layer 900', the shallow trench isolation (STI) 933 among PMOS transistors, the poly-crystalline silicon 934 and gate dielectric 935 of the PMOS dummy gates, PMOS source and drains 936, the PMOS transistor channels 937, and the PMOS interlayer dielectric (ILD) 938 are shown in the cross section illustration. A high temperature anneal may be performed to activate both the NMOS and the PMOS transistor dopants. These structures of FIG. 9E illustrate substantial completion of the first phase of PMOS transistor formation.

As illustrated in FIG. 9F, a layer transfer demarcation plane (shown as dashed line) 998 may be formed in carrier or holder wafer 920 by hydrogen implantation 911 or other methods as previously described. The PMOS transistors may now be ready for typical state of the art gate-last transistor formation completion.

Figure 9G:
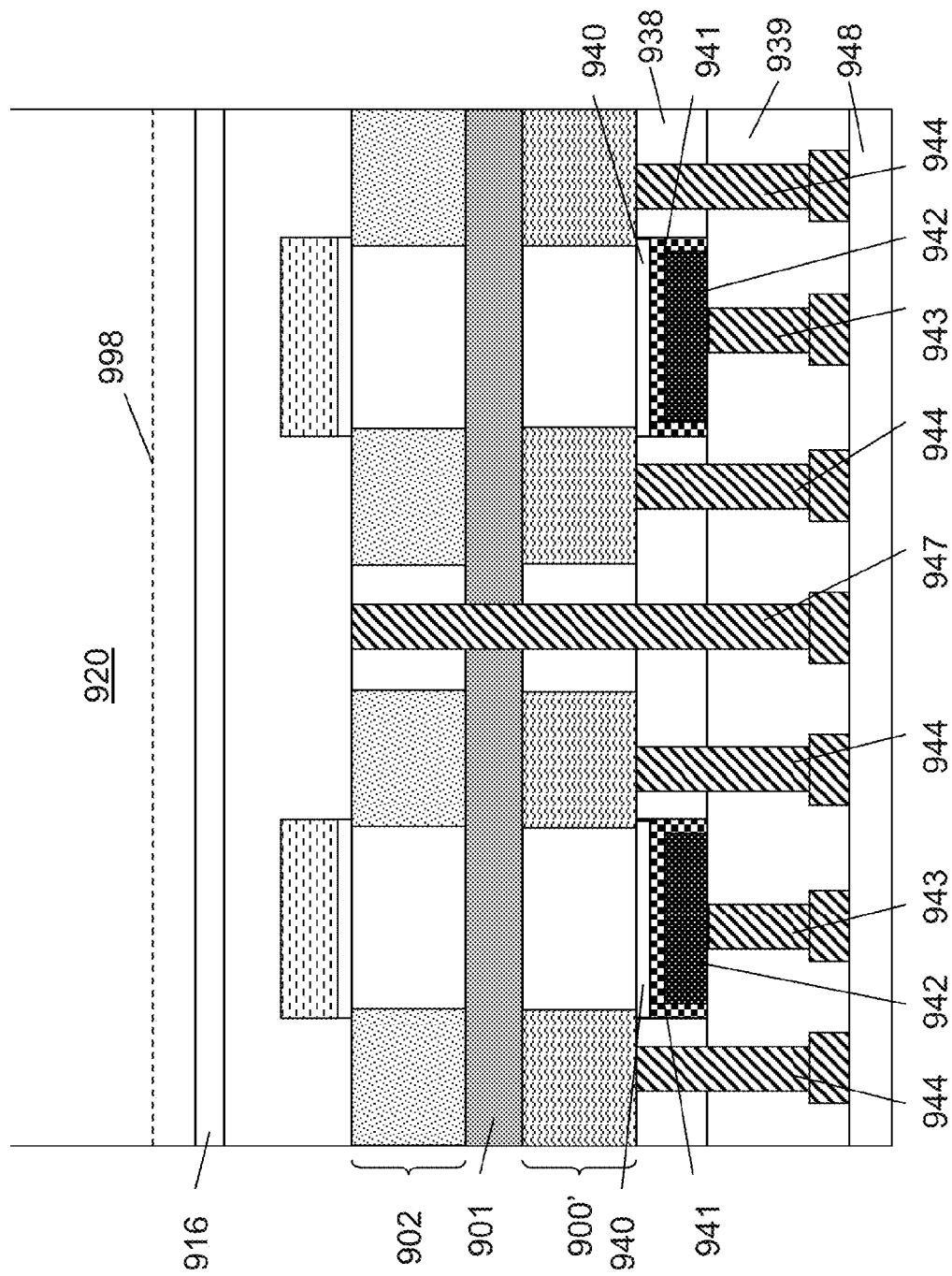

As illustrated in FIG. 9G, the PMOS ILD 938 may be chemical mechanically polished to expose the top of the PMOS poly-crystalline silicon dummy gates, composed of poly-crystalline silicon 934 and gate dielectric 935, and the dummy gates may then be removed by etching. A hi-k gate dielectric 940 and the PMOS specific work function metal gate 941 may be deposited. An aluminum fill 942 may be performed and the metal chemical mechanically polished. A low temperature dielectric layer 939 may be deposited and the typical gate 943 and source/drain 944 contact formation and metallization may now be performed to connect to and among the PMOS transistors. Partially formed PMOS inter layer via (ILV) 947 may be lithographically defined, plasma/RIE etched, and metallization formed. Oxide layer 948 may be deposited to prepare for bonding.

Figure 9H:
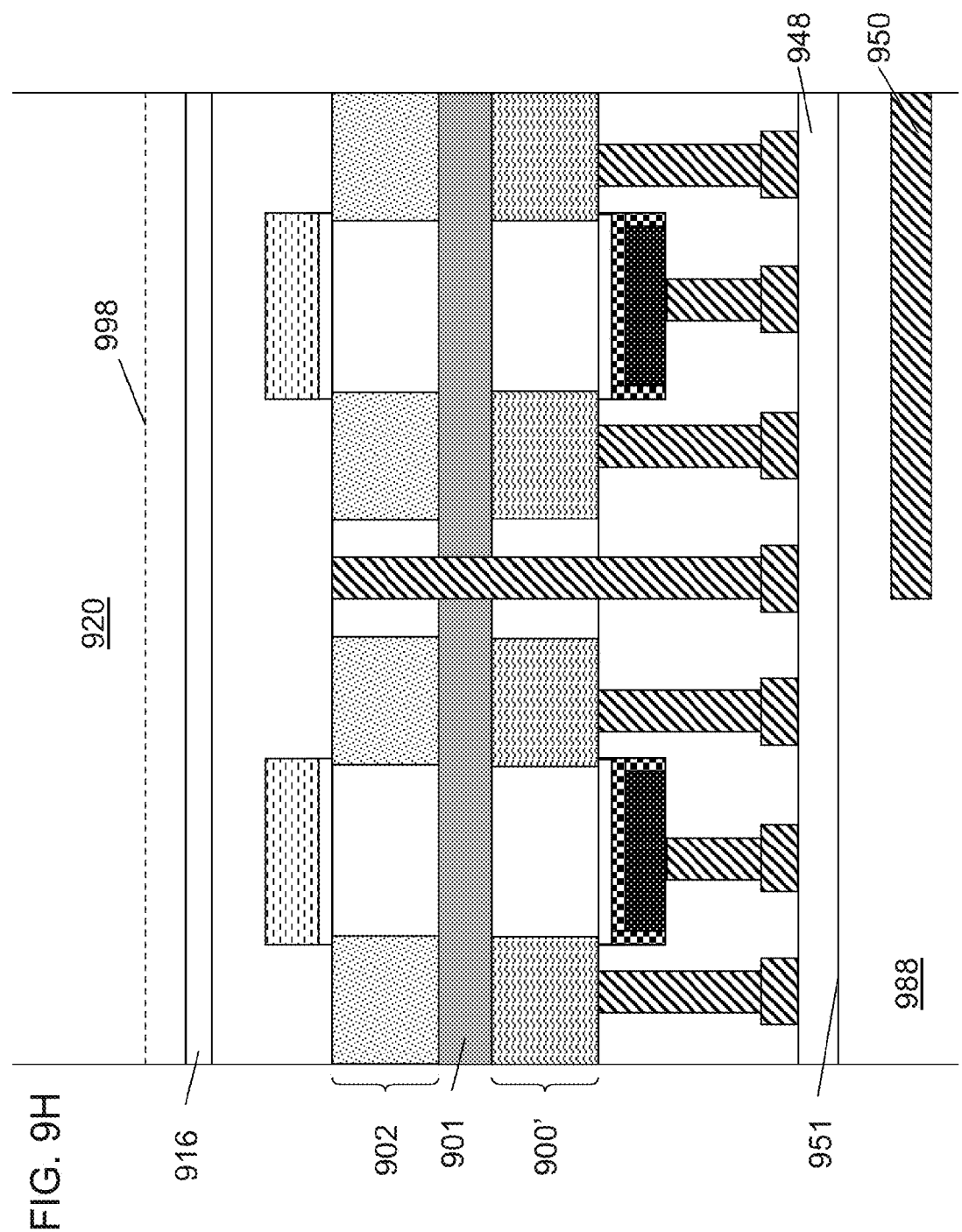

As illustrated in FIG. 9H, the donor wafer surface at oxide layer 948 and top oxide surface of acceptor or target substrate 988 with acceptor wafer metal connect strip 950 may be prepared for wafer bonding as previously described and then low temperature (less than approximately 90° C.) aligned and oxide to oxide bonded at interface 951.

Figure 9I:
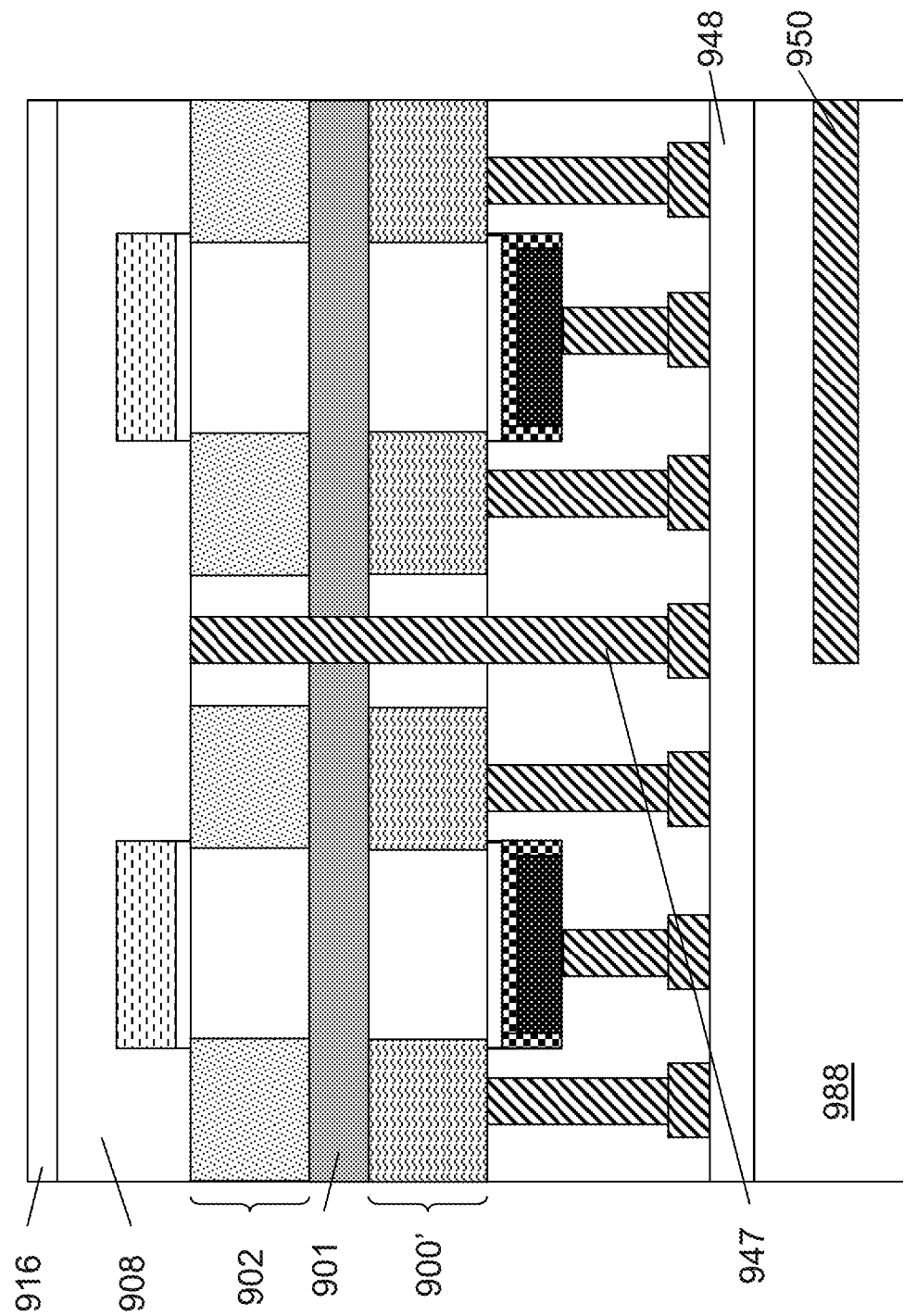

As illustrated in FIG. 9I, the portion of the carrier or holder wafer 920 that may be above the layer transfer demarcation plane 998 may be removed by cleaving or other processes as previously described, such as, for example, ion-cut or other methods. The remaining layer of the carrier or holder wafer may be removed by chemical mechanical polishing (CMP) to or into oxide layer 916. The NMOS transistors may be now ready for typical state of the art gate-last transistor formation completion.

Figure 9J:
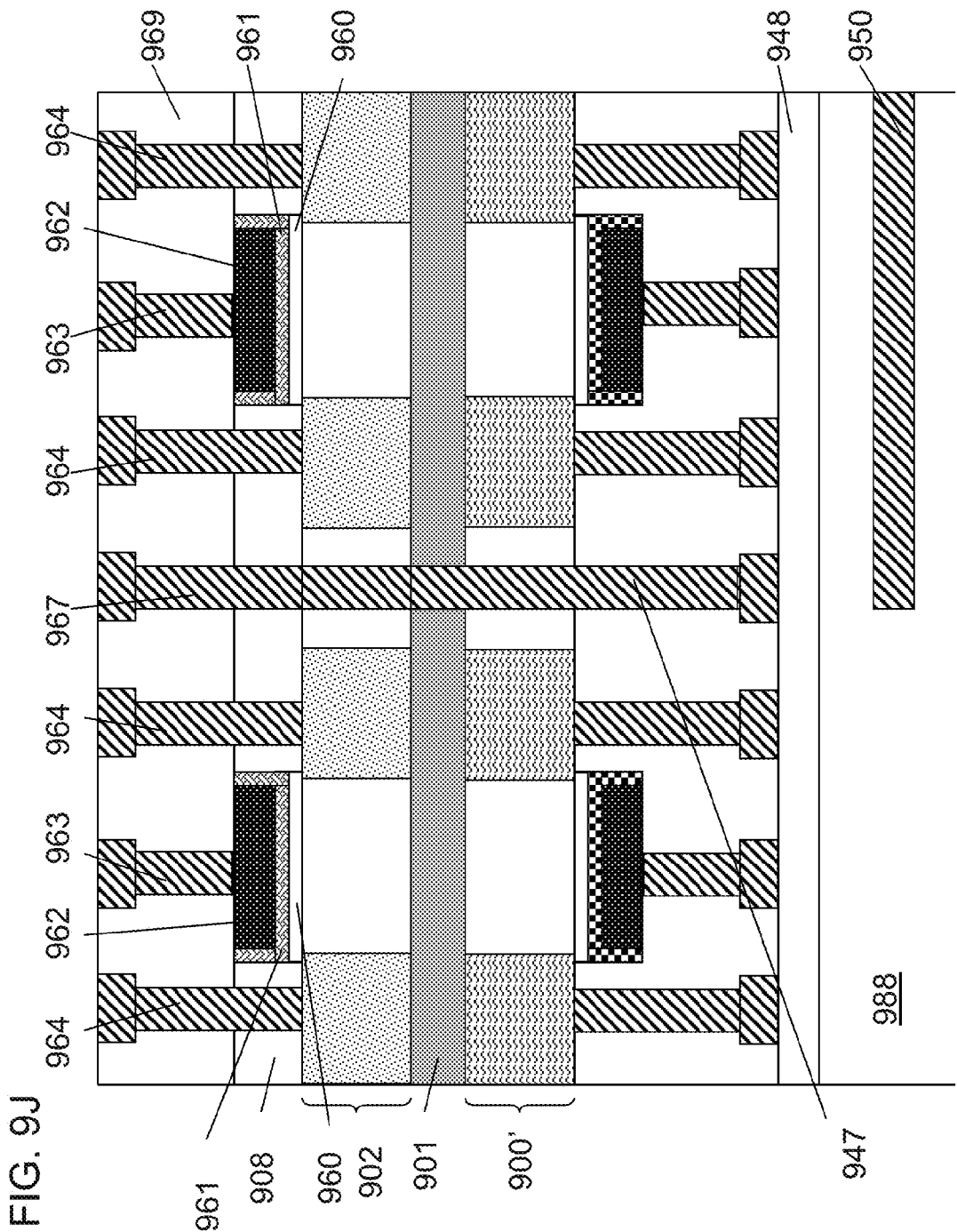

As illustrated in FIG. 9J, oxide 916 and the NMOS ILD 908 may be chemical mechanically polished to expose the top of the NMOS dummy gates composed of poly-crystalline silicon 904 and gate dielectric 905, and the dummy gates may then be removed by etching. A hi-k gate dielectric 960 and an NMOS specific work function metal gate 961 may be deposited. An aluminum fill 962 may be performed and the metal chemical mechanically polished. A low temperature dielectric layer 969 may be deposited and the typical gate 963 and source/drain 964 contact formation and metallization may now be performed to connect to and among the NMOS transistors. Partially formed NMOS inter layer via (ILV) 967 may be lithographically defined, plasma/RIE etched, and metallization formed, thus electrically connecting NMOS ILV 967 to PMOS ILV 947.

Figure 9K:
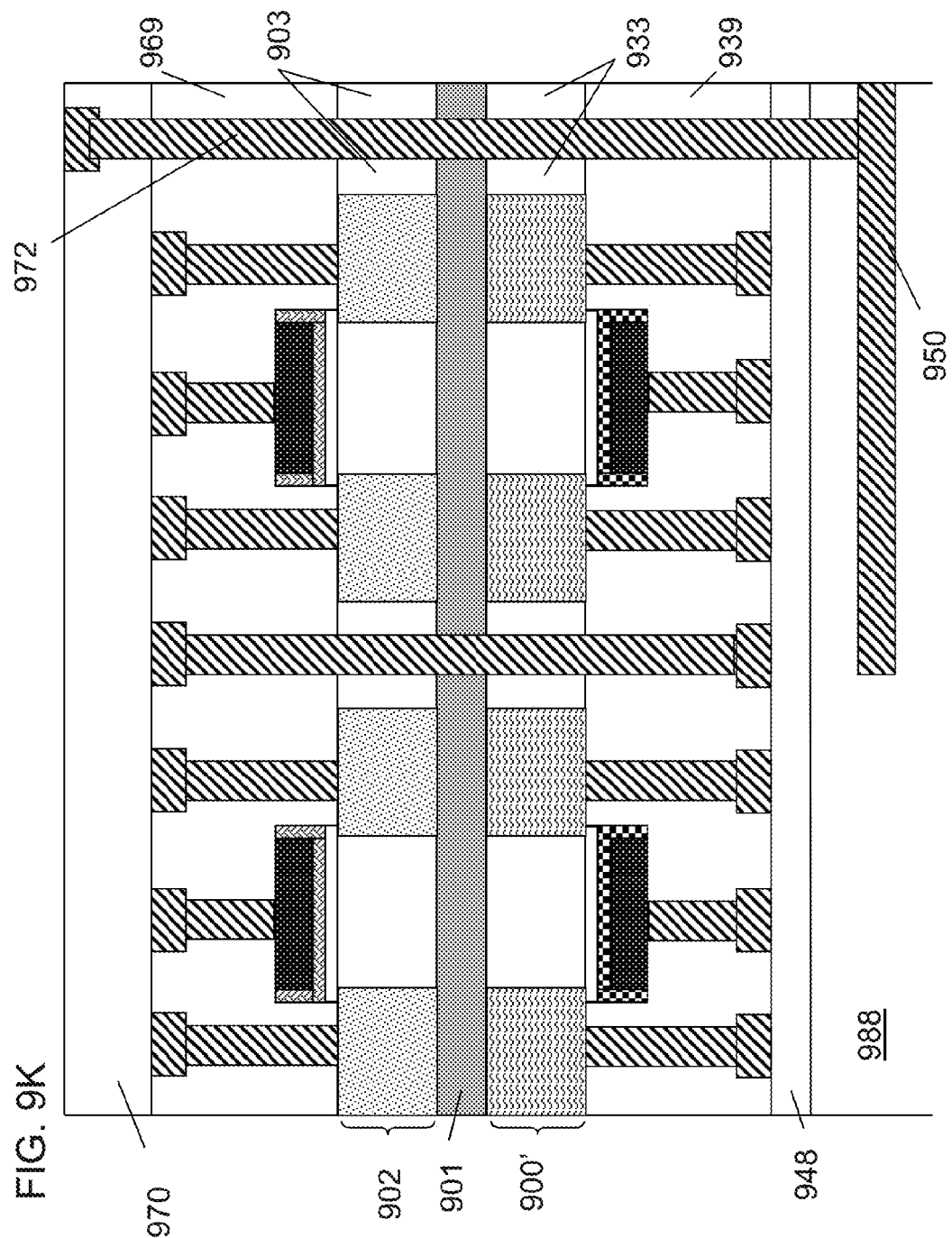

As illustrated in FIG. 9K, oxide 970 may be deposited and planarized. Thru layer via (TLV) 972 may be lithographically defined, plasma/RIE etched, and metallization formed. TLV 972 electrically couples the NMOS transistor layer metallization to the acceptor or target substrate 988 at acceptor wafer metal connect strip 950. A topmost metal layer, at or above oxide 970, of the layer stack illustrated may be formed to act as the acceptor wafer metal connect strips for a repeat of the above process flow to stack another preprocessed thin mono-crystalline silicon layer of NMOS on top of PMOS transistors.

Persons of ordinary skill in the art will appreciate that the illustrations in FIGS. 9A through 9K are exemplary only and are not drawn to scale. Such skilled persons will further appreciate that many variations are possible such as, for example, the transistor layers on each side of BOX 901 may include full CMOS, or one side may be CMOS and the other n-type MOSFET transistors, or other combinations and types of semiconductor devices. Additionally, the above process flow may also be utilized to construct gates of other types, such as, for example, doped poly-crystalline silicon on thermal oxide, doped poly-crystalline silicon on oxynitride, or other metal gate configurations, as 'dummy gates,' perform a layer transfer of the thin mono-crystalline layer, replace the gate electrode and gate oxide, and then proceed with low temperature interconnect processing. Moreover, that other transistor types may be possible, such as, for example, RCAT, FinFet, and junction-less. Further, the donor wafer layer 900' in FIG. 9D may be formed from a bulk mono-crystalline silicon wafer with CMP to the NMOS junctions and oxide deposition in place of the SOI wafer discussed. Additionally, the SOI donor wafer substrate 900 may start as a bulk silicon wafer and utilize an oxygen implantation and thermal anneal to form a buried oxide layer, such as, for example, the SIMOX process (i.e., separation by implantation of oxygen), or SOI donor wafer substrate 900 may be a Germanium on Insulator (GeOI) wafer. Many other modifications within the scope of the invention will suggest themselves to such skilled persons after reading this specification. Thus the scope of the invention is to be limited only by the appended claims.

An embodiment of the invention is to pre-process a donor wafer by forming a block or blocks of a non-repeating pattern device structures and layer transferred using the above described techniques such that the donor wafer structures may be electrically coupled to the acceptor wafer. This donor wafer of non-repeating pattern device structures may be a memory block of DRAM, or a block of Input-Output circuits, or any other block of non-repeating pattern circuitry or combination thereof. The donor wafer and acceptor wafer in these discussions may include the compositions, such as metal layers and TLVs, referred to for donor wafers and acceptor wafers in the FIGS. 1, 2 and 3 layer transfer discussions.

Figure 10:
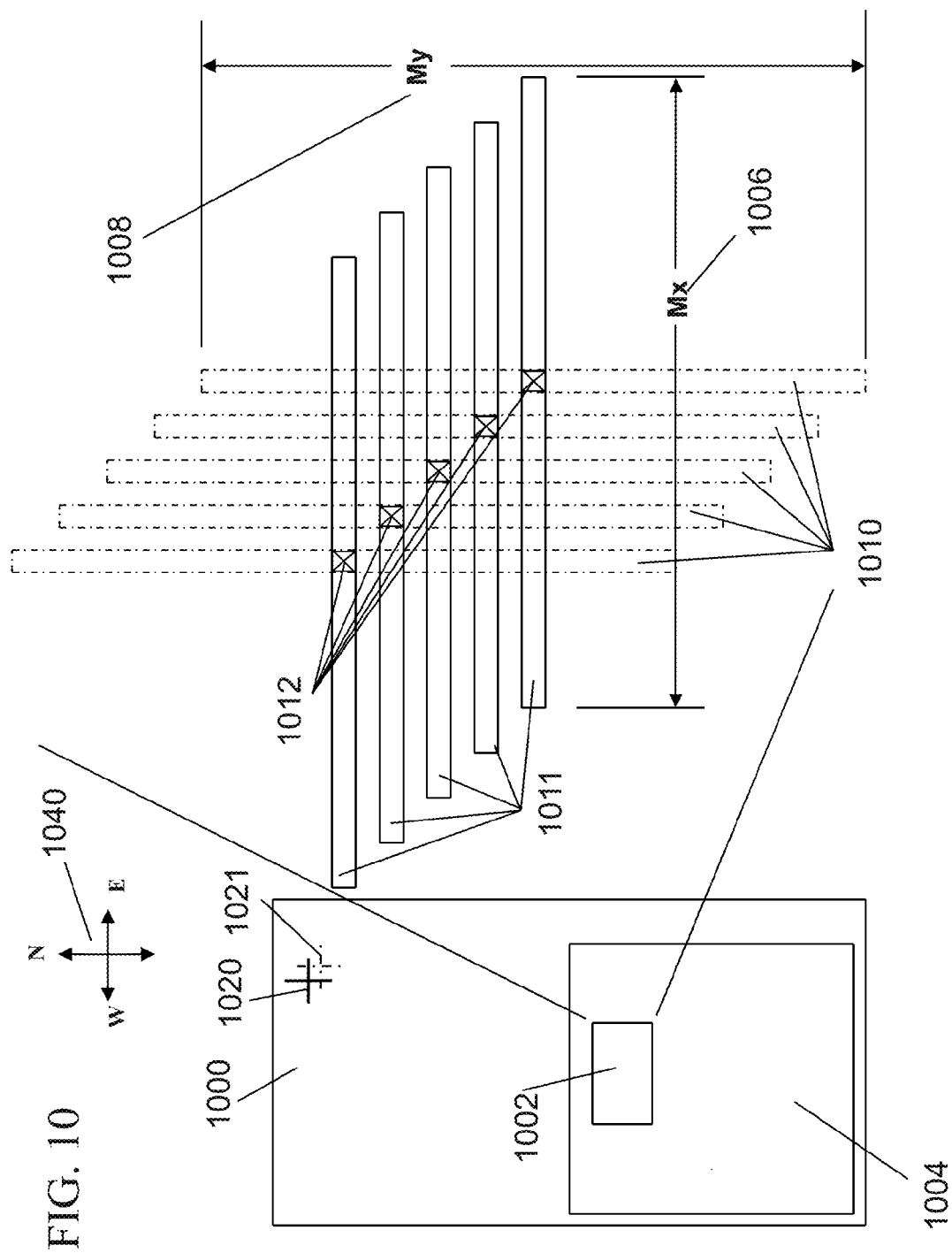
FIG. 10 is an exemplary drawing illustration of a connection strip array structure.

As illustrated in FIG. 10, an acceptor wafer die 1000 on an acceptor wafer may be aligned and bonded with a donor wafer which may have prefabricated non-repeating pattern device structures, such as, for example, block 1004. Acceptor alignment mark 1021 and donor wafer alignment mark 1020 may be located in the acceptor wafer die 1000 (as shown) or may be elsewhere on the bonded donor and acceptor wafer stack. A four cardinal directions indicator 1040 may be used to assist the explanation. A general connectivity structure 1002 may be drawn inside or outside of the donor wafer non-repeating pattern device structure block 1004 and a blowup of the general connectivity structure 1002 is shown. Maximum donor wafer to acceptor wafer misalignment in the East-West direction Mx 1006 and maximum donor wafer to acceptor wafer misalignment in the North-South direction My 1008 may include margin for incremental misalignment resulting from the angular misalignment during wafer to wafer bonding, and may include uncompensated donor wafer bow and warp. Acceptor wafer metal connect strips 1010, shown as oriented in the North-South direction, may have a length of at least My 1008 and may be aligned to the acceptor wafer alignment mark 1021. Donor wafer metal connect strips 1011, shown as oriented in the East-West direction, may have a length of at least Mx 1006 and may be aligned to the donor wafer alignment mark 1020. Acceptor wafer metal connect strips 1010 and donor wafer metal connect strips 1011 may be formed with metals, such as, for example, copper or aluminum, and may include barrier metals, such as, for example, TiN or WCo. The thru layer via (TLV) 1012 connecting donor wafer metal connect strip 1011 to acceptor wafer metal connect strips 1010 may be aligned to the acceptor wafer alignment mark 1021 in the East-West direction and to the donor wafer alignment mark 1020 in the North-South direction in such a manner that the TLV may typically be at the intersection of the correct two metal strips, which it may need to connect.

Alternatively, the donor wafer may include both repeating and non-repeating pattern device structures. The two elements, one repeating and the other non-repeating, may be patterned separately. The donor wafer non-repeating pattern device structures, such as, for example, block 1004, may be aligned to the donor wafer alignment mark 1020, and the repeating pattern device structures may be aligned to the acceptor wafer alignment mark 1021 with an offsets Rdx and Rdy as previously described with reference to FIG. 43 of the incorporated reference U.S. Pat. No. 8,836,073. Donor wafer metal connect strips 1011, shown as oriented in the East-West direction, may be aligned to the donor wafer alignment mark 1020. Acceptor wafer metal connect strips 1010, shown as oriented in the North-South direction, may be aligned to the acceptor wafer alignment mark 1021 with the offset Rdy. The thru layer via (TLV) 1012 connecting donor wafer metal connect strip 1011 to acceptor wafer metal connect strips 1010 may be aligned to the acceptor wafer alignment mark 1021 in the East-West direction with the offset Rdx and to the donor wafer alignment mark 1020 in the North-South direction Persons of ordinary skill in the art will appreciate that the illustrations in FIG. 10 are exemplary only and are not drawn to scale. Such skilled persons will further appreciate that many variations are possible such as, for example, the North-South direction could become the East-West direction (and vice versa) by merely rotating the wafer 90° and that the donor wafer metal connect strips 1011 could also run North-South as a matter of design choice with corresponding adjustments to the rest of the fabrication process. Moreover, TLV 1012 may be drawn in the database (not shown) so that it may be positioned approximately at the center of donor wafer metal connect strip 1011 and acceptor wafer metal connect strip 1010, and, hence, may be away from the ends or edges of donor wafer metal connect strip 1011 and acceptor wafer metal connect strips 1010 at distances greater than approximately the nominal layer to layer misalignment margin. Many other modifications within the scope of the invention will suggest themselves to such skilled persons after reading this specification. Thus the scope of the invention is to be limited only by the appended claims.

It may be desirable to screen the sensitive gate dielectric and other gate structures from the layer transfer or ion-cut atomic species implantation previously described, such as, for example, Hydrogen and Helium implantation thru the gate structures and into the underlying silicon wafer or substrate.

As illustrated in FIG. 11, lithographic definition and etching of an atomically dense material 1150, for example about 5,000 angstroms of Tantalum, may be combined with a remaining after etch about 5,000 angstroms of photoresist 1152, to create implant stopping regions or shields on donor wafer 1100. Interlayer dielectric (ILD) 1108, gate metal 1104, gate dielectric 1105, transistor junctions 1106, shallow trench isolation (STI) 1102 are shown in the illustration. The screening of ion-cut implant 1109 may create segmented layer transfer demarcation planes 1199 (shown as dashed lines) in donor wafer 1100, or other layers in previously described processes, and may need additional post-cleave polishing, such as, for example, by chemical mechanical polishing (CMP), to provide a smooth bonding or device structure formation surface for 3D IC manufacturability. Alternatively, the ion-cut implant 1109 may be done in multiple steps with a sufficient tilt each to create an overlapping or continuous layer transfer demarcation plane 1199 below the protected regions.

To improve the contact resistance of very small scaled contacts, the semiconductor industry employs various metal silicides, such as, for example, cobalt silicide, titanium silicide, tantalum silicide, and nickel silicide. The current advanced CMOS processes, such as, for example, 45 nm, 32 nm, and 22 nm employ nickel silicides to improve deep submicron source and drain contact resistances. Background information on silicides utilized for contact resistance reduction can be found in "NiSi Salicide Technology for Scaled CMOS," H. Iwai, et. al., Microelectronic Engineering, 60 (2002), pp 157-169; "Nickel vs. Cobalt Silicide integration for sub-50 nm CMOS", B. Froment, et. al., IMEC ESS Circuits, 2003; and "65 and 45-nm Devices—an Overview", D. James, Semicon West, July 2008, ctr_024377. To achieve the lowest nickel silicide contact and source/drain resistances, the nickel on silicon must be heated to at least 450° C.

Thus it may be desirable to enable low resistances for process flows in this document where the post layer transfer temperature exposures must remain under approximately 400° C. as a result from metallization, such as, for example, copper and aluminum, and low-k dielectrics being present. The example process flow forms a Recessed Channel Array Transistor (RCAT), but this or similar flows may be applied to other process flows and devices, such as, for example, S-RCAT, JLT, V-groove, JFET, bipolar, and replacement gate flows.

Figure 12A:
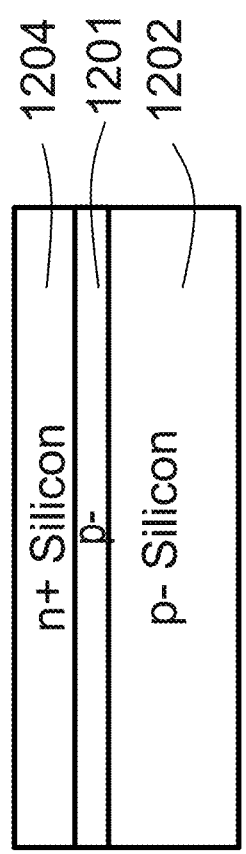
FIG. 12A-12I are exemplary drawing illustrations of the formation of a recessed channel array transistor with source and drain silicide.

A planar n-channel Recessed Channel Array Transistor (RCAT) with metal silicide source & drain contacts suitable for a 3D IC may be constructed. As illustrated in FIG. 12A, a P− substrate donor wafer 1202 may be processed to include wafer sized layers of N+ doping 1204, and P− doping 1201 across the wafer. The N+ doped layer 1204 may be formed by ion implantation and thermal anneal. In addition, P− doped layer 1201 may have additional ion implantation and anneal processing to provide a different dopant level than P− substrate donor wafer 1202. P− doped layer 1201 may have graded or various layers of P− doping to mitigate transistor performance issues, such as, for example, short channel effects, after the RCAT is formed. The layer stack may alternatively be formed by successive epitaxially deposited doped silicon layers of P− doping 1201 and N+ doping 1204, or by a combination of epitaxy and implantation Annealing of implants and doping may utilize optical annealing techniques or types of Rapid Thermal Anneal (RTA or spike). The N+ doped layer 1204 may have a doping concentration that may be more than 10× the doping concentration of P− doped layer 1201.

Figure 12B:
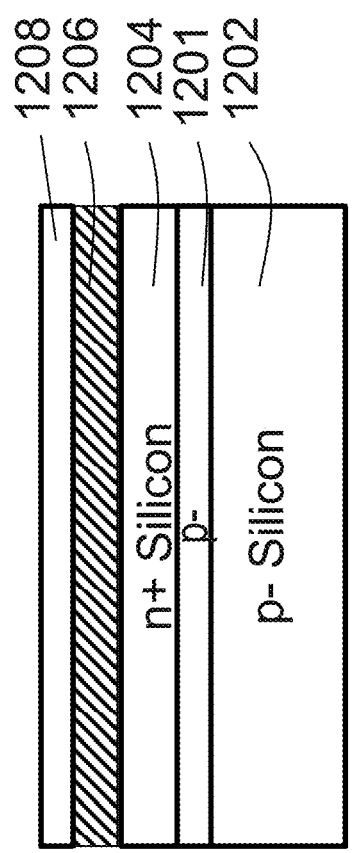

As illustrated in FIG. 12B, a silicon reactive metal, such as, for example, Nickel or Cobalt, may be deposited onto N+ doped layer 1204 and annealed, utilizing anneal techniques such as, for example, RTA, thermal, or optical, thus forming metal silicide layer 1206. The top surface of donor wafer 1202 may be prepared for oxide wafer bonding with a deposition of an oxide to form oxide layer 1208.

Figure 12C:
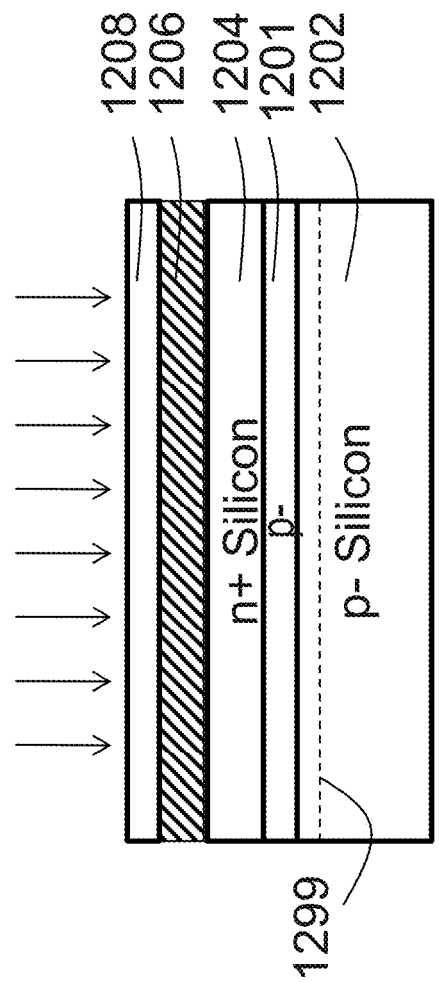

As illustrated in FIG. 12C, a layer transfer demarcation plane (shown as dashed line) 1299 may be formed by hydrogen implantation or other methods as previously described.

Figure 12D:
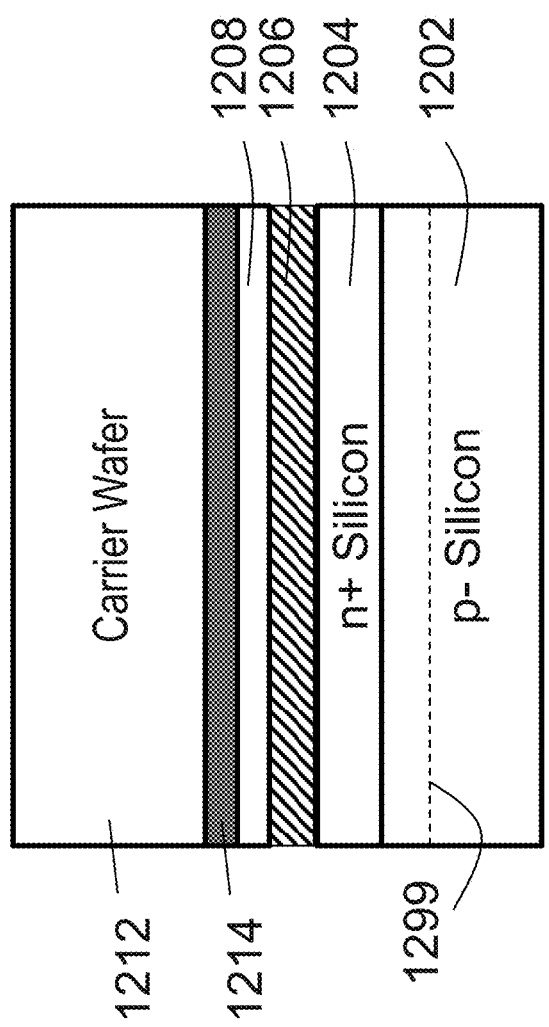

As illustrated in FIG. 12D donor wafer 1202 with layer transfer demarcation plane5399, P-doped layer 1201, N+ doped layer 1204, metal silicide layer 1206, and oxide layer 1208 may be temporarily bonded to carrier or holder substrate 1212 with a low temperature process that may facilitate a low temperature release. The carrier or holder substrate 1212 may be a glass substrate to enable state of the art optical alignment with the acceptor wafer. A temporary bond between the carrier or holder substrate 1212 and the donor wafer 1202 may be made with a polymeric material, such as, for example, polyimide DuPont HD3007, which can be released at a later step by laser ablation, Ultra-Violet radiation exposure, or thermal decomposition, shown as adhesive layer 1214. Alternatively, a temporary bond may be made with uni-polar or bi-polar electrostatic technology such as, for example, the Apache tool from Beam Services Inc.

Figure 12E:
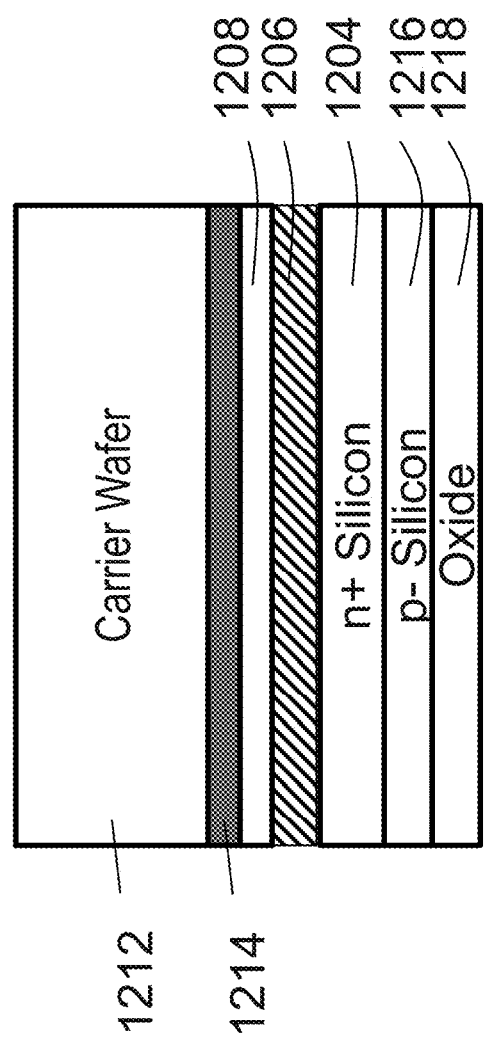

As illustrated in FIG. 12E, the portion of the donor wafer 1202 that may be below the layer transfer demarcation plane 1299 may be removed by cleaving or other processes as previously described, such as, for example, ion-cut or other methods. The remaining donor wafer P− doped layer 1201 may be thinned by chemical mechanical polishing (CMP) so that the P− layer 1216 may be formed to the desired thickness. Oxide layer 1218 may be deposited on the exposed surface of P− layer 1216.

Figure 12F:
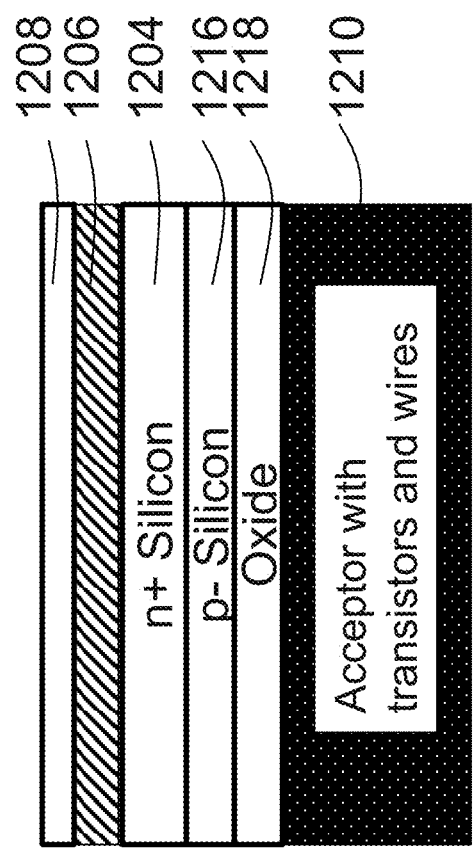

As illustrated in FIG. 12F, both the donor wafer 1202 and acceptor substrate or wafer 1210 may be prepared for wafer bonding as previously described and then low temperature (less than approximately 400° C.) aligned and oxide to oxide bonded. Acceptor wafer 1210, as described previously, may include, for example, transistors, circuitry, metal, such as, for example, aluminum or copper, interconnect wiring, and thru layer via metal interconnect strips or pads. The carrier or holder substrate 1212 may then be released using a low temperature process such as, for example, laser ablation. Oxide layer 1218, P− layer 1216, N+ doped layer 1204, metal silicide layer 1206, and oxide layer 1208 have been layer transferred to acceptor wafer 1210. The top surface of oxide layer 1208 may be chemically or mechanically polished. Now RCAT transistors may be formed with low temperature (less than approximately 400° C.) processing and aligned to the acceptor wafer 1210 alignment marks (not shown).

Figure 12G:
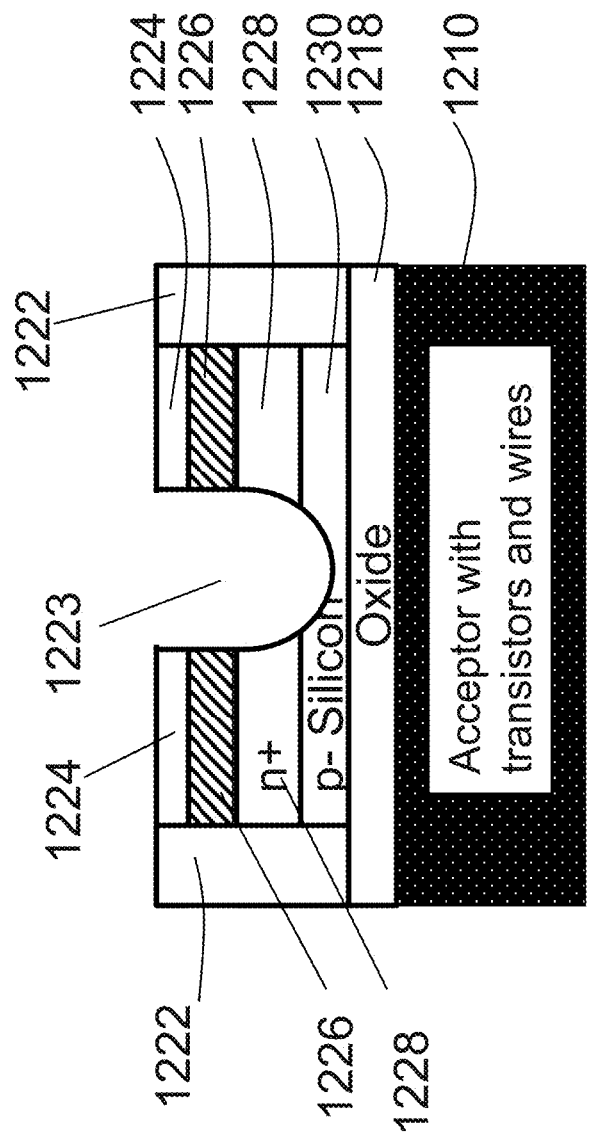

As illustrated in FIG. 12G, the transistor isolation regions 1222 may be formed by mask defining and then plasma/RIE etching oxide layer 1208, metal silicide layer 1206, N+ doped layer 1204, and P− layer 1216 to the top of oxide layer 1218. Then a low-temperature gap fill oxide may be deposited and chemically mechanically polished, with the oxide remaining in isolation regions 1222. Then the recessed channel 1223 may be mask defined and etched. The recessed channel surfaces and edges may be smoothed by wet chemical or plasma/RIE etching techniques to mitigate high field effects. These process steps form oxide regions 1224, metal silicide source and drain regions 1226, N+ source and drain regions 1228 and P− channel region 1230, which may form the transistor body. The doping concentration of P− channel region 1230 may include gradients of concentration or layers of differing doping concentrations. The etch formation of recessed channel 1223 may define the transistor channel length.

Figure 12H:
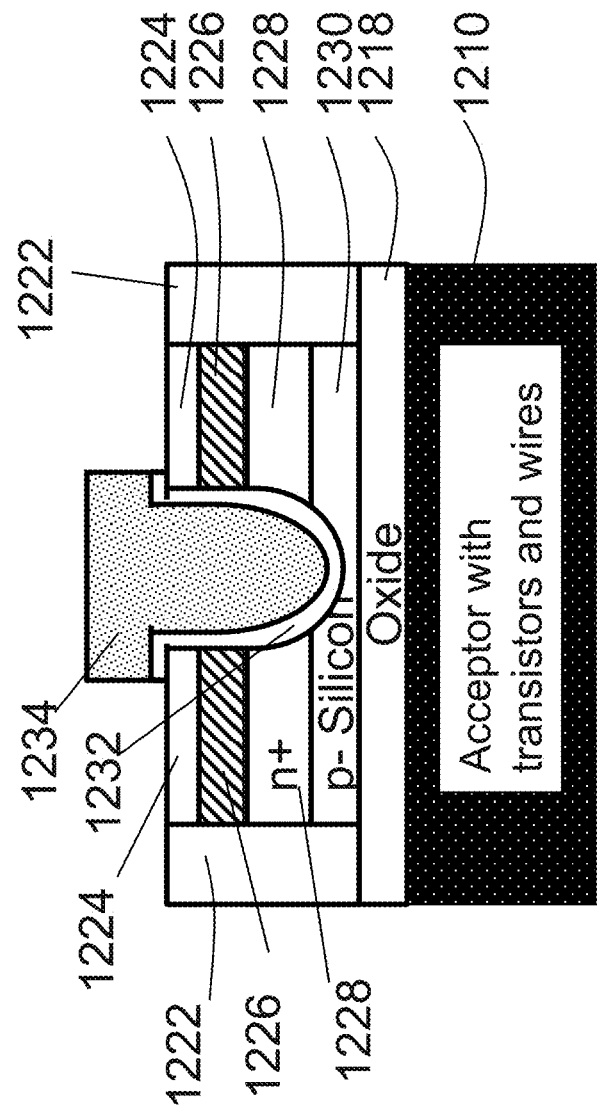

As illustrated in FIG. 12H, a gate dielectric 1232 may be formed and a gate metal material may be deposited. The gate dielectric 1232 may be an atomic layer deposited (ALD) gate dielectric that may be paired with a work function specific gate metal in the industry standard high k metal gate process schemes described previously. Or the gate dielectric 1232 may be formed with a low temperature oxide deposition or low temperature microwave plasma oxidation of the silicon surfaces and then a gate material such as, for example, tungsten or aluminum may be deposited. Then the gate material may be chemically mechanically polished, and the gate area defined by masking and etching, thus forming gate electrode 1234.

Figure 12I:
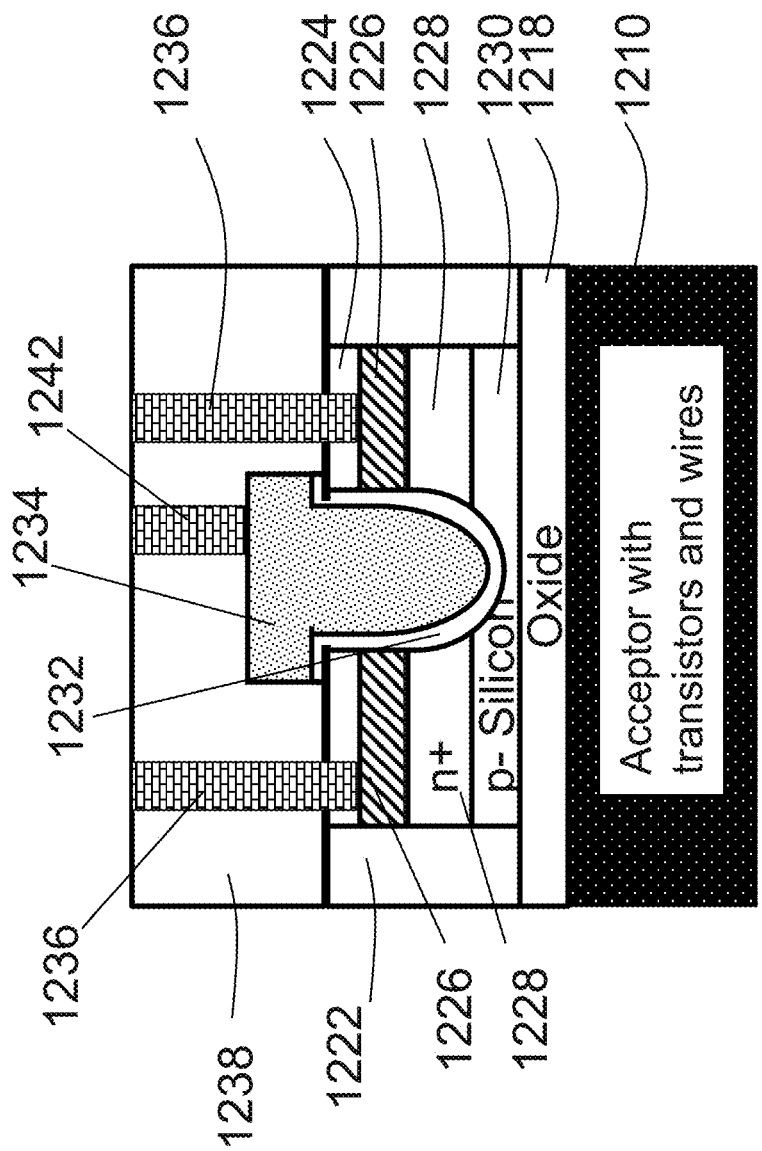

As illustrated in FIG. 12I, a low temperature thick oxide 1238 may be deposited and source, gate, and drain contacts, and thru layer via (not shown) openings may be masked and etched preparing the transistors to be connected via metallization. Thus gate contact 1242 connects to gate electrode 1234, and source & drain contacts 1236 connect to metal silicide source and drain regions 1226.

Persons of ordinary skill in the art will appreciate that the illustrations in FIGS. 12A through 12I are exemplary only and are not drawn to scale. Such skilled persons will further appreciate that many variations are possible such as, for example, the temporary carrier substrate may be replaced by a carrier wafer and a permanently bonded carrier wafer flow such as, for example, as described in FIG. 40 of the incorporated reference U.S. Pat. No. 8,836,073, may be employed. Many other modifications within the scope of the invention will suggest themselves to such skilled persons after reading this specification. Thus the invention is to be limited only by the appended claims.

Some embodiments of the invention may include alternative techniques to build IC (Integrated Circuit) devices including techniques and methods to construct 3D IC systems. Some embodiments of the invention may enable device solutions with far less power consumption than prior art. These device solutions could be very useful for the growing application of mobile electronic devices and mobile systems such as, for example, mobile phones, smart phone, and cameras, those mobile systems may also connect to the internet. For example, incorporating the 3D IC semiconductor devices according to some embodiments of the invention within these mobile electronic devices and mobile systems could provide superior mobile units that could operate much more efficiently and for a much longer time than with prior art technology.

Smart mobile systems may be greatly enhanced by complex electronics at a limited power budget. The 3D technology described in the multiple embodiments of the invention would allow the construction of low power high complexity mobile electronic systems. For example, it would be possible to integrate into a small form function a complex logic circuit with high density high speed memory utilizing some of the 3D DRAM embodiments of the invention and add some non-volatile 3D NAND charge trap or RRAM described in some embodiments of the invention.

In U.S. application Ser. No. 12/903,862 (published as US 2012/0091474), filed by some of the inventors and assigned to the same assignee, a 3D micro display and a 3D image sensor are presented. Integrating one or both of these with complex logic and or memory could be very effective for mobile system. Additionally, mobile systems could be customized to some specific market applications by integrating some embodiments of the invention.

Moreover, utilizing 3D programmable logic or 3D gate array as had been described in some embodiments of the invention could be very effective in forming flexible mobile systems.

The need to reduce power to allow effective use of limited battery energy and also the lightweight and small form factor derived by highly integrating functions with low waste of interconnect and substrate could be highly benefitted by the redundancy and repair idea of the 3D monolithic technology as has been presented in embodiments of the invention. This unique technology could enable a mobile device that would be lower cost to produce or would require lower power to operate or would provide a lower size or lighter carry weight, and combinations of these 3D monolithic technology features may provide a competitive or desirable mobile system.

Another unique market that may be addressed by some of the embodiments of the invention could be a street corner camera with supporting electronics. The 3D image sensor described in the Ser. No. 12/903,862 application would be very effective for day/night and multi-spectrum surveillance applications. The 3D image sensor could be supported by integrated logic and memory such as, for example, a monolithic 3D IC with a combination of image processing and image compression logic and memory, both high speed memory such as 3D DRAM and high density non-volatile memory such as 3D NAND or RRAM or other memory, and other combinations. This street corner camera application would require low power, low cost, and low size or any combination of these features, and could be highly benefitted from the 3D technologies described herein.

3D ICs according to some embodiments of the invention could enable electronic and semiconductor devices with much a higher performance as a result from the shorter interconnect as well as semiconductor devices with far more complexity via multiple levels of logic and providing the ability to repair or use redundancy. The achievable complexity of the semiconductor devices according to some embodiments of the invention could far exceed what may be practical with the prior art technology. These potential advantages could lead to more powerful computer systems and improved systems that have embedded computers.

Some embodiments of the invention may enable the design of state of the art electronic systems at a greatly reduced non-recurring engineering (NRE) cost by the use of high density 3D FPGAs or various forms of 3D array based ICs with reduced custom masks as described herein. These systems could be deployed in many products and in many market segments. Reduction of the NRE may enable new product family or application development and deployment early in the product lifecycle by lowering the risk of upfront investment prior to a market being developed. The above potential advantages may also be provided by various mixes such as reduced NRE using generic masks for layers of logic and other generic masks for layers of memories and building a very complex system using the repair technology to overcome the inherent yield difficulties. Another form of mix could be building a 3D FPGA and add on it 3D layers of customizable logic and memory so the end system could have field programmable logic on top of the factory customized logic. There may be many ways to mix the many innovative elements to form 3D IC to support the needs of an end system, including using multiple devices wherein more than one device incorporates elements of embodiments of the invention. An end system could benefit from a memory devices utilizing the 3D memory of some embodiments of the invention together with high performance 3D FPGA of some of the embodiments of the invention together with high density 3D logic and so forth. Using devices that can use one or multiple elements according to some embodiments of the invention may allow for increased performance or lower power and other potential advantages resulting from the use of some embodiments of the inventions to provide the end system with a competitive edge. Such end system could be electronic based products or other types of systems that may include some level of embedded electronics, such as, for example, cars and remote controlled vehicles.

Commercial wireless mobile communications have been developed for almost thirty years, and play a special role in today's information and communication technology Industries. The mobile wireless terminal device has become part of our life, as well as the Internet, and the mobile wireless terminal device may continue to have a more important role on a worldwide basis. Currently, mobile (wireless) phones are undergoing much development to provide advanced functionality. The mobile phone network is a network such as a GSM, GPRS, or WCDMA, 3G and 4G standards, and the network may allow mobile phones to communicate with each other. The base station may be for transmitting (and receiving) information to the mobile phone.

A typical mobile phone system may include, for example, a processor, a flash memory, a static random access memory, a display, a removable memory, a radio frequency (RF) receiver/transmitter, an analog base band (ABB), a digital base band (DBB), an image sensor, a high-speed bi-directional interface, a keypad, a microphone, and a speaker. A typical mobile phone system may include a multiplicity of an element, for example, two or more static random access memories, two or more displays, two or more RF receiver/transmitters, and so on.

Conventional radios used in wireless communications, such as radios used in conventional cellular telephones, typically may include several discrete RF circuit components. Some receiver architectures may employ superheterodyne techniques. In a superhetrodyne architecture an incoming signal may be frequency translated from its radio frequency (RF) to a lower intermediate frequency (IF). The signal at IF may be subsequently translated to baseband where further digital signal processing or demodulation may take place. Receiver designs may have multiple IF stages. The reason for using such a frequency translation scheme is that circuit design at the lower IF frequency may be more manageable for signal processing. It is at these IF frequencies that the selectivity of the receiver may be implemented, automatic gain control (AGC) may be introduced, etc.

A mobile phone's need of a high-speed data communication capability in addition to a speech communication capability has increased in recent years. In GSM (Global System for Mobile communications), one of European Mobile Communications Standards, GPRS (General Packet Radio Service) has been developed for speeding up data communication by allowing a plurality of time slot transmissions for one time slot transmission in the GSM with the multiplexing TDMA (Time Division Multiple Access) architecture. EDGE (Enhanced Data for GSM Evolution) architecture provides faster communications over GPRS.

4th Generation (4G) mobile systems aim to provide broadband wireless access with nominal data rates of 100 Mbit/s. 4G systems may be based on the 3GPP LTE (Long Term Evolution) cellular standard, WiMax or Flash-OFDM wireless metropolitan area network technologies. The radio interface in these systems may be based on all-IP packet switching, MIMO diversity, multi-carrier modulation schemes, Dynamic Channel Assignment (DCA) and channel-dependent scheduling.

Prior art such as U.S. application Ser. No. 12/871,984 may provide a description of a mobile device and its block-diagram.

It is understood that the use of specific component, device and/or parameter names (such as those of the executing utility/logic described herein) are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized. For example, as utilized herein, the following terms are generally defined:

(1) Mobile computing/communication device (MCD): is a device that may be a mobile communication device, such as a cell phone, or a mobile computer that performs wired and/or wireless communication via a connected wireless/wired network. In some embodiments, the MCD may include a combination of the functionality associated with both types of devices within a single standard device (e.g., a smart phones or personal digital assistant (PDA)) for use as both a communication device and a computing device.

A block diagram representation of an exemplary mobile computing device (MCD) is illustrated in FIG. 13, within which several of the features of the described embodiments may be implemented. MCD 1300 may be a desktop computer, a portable computing device, such as a laptop, personal digital assistant (PDA), a smart phone, and/or other types of electronic devices that may generally be considered processing devices. As illustrated, MCD 1300 may include at least one processor or central processing unit (CPU) 1302 which may be connected to system memory 1306 via system interconnect/bus 1304. CPU 1302 may include at least one digital signal processing unit (DSP). Also connected to system interconnect/bus 1304 may be input/output (I/O) controller 1315, which may provide connectivity and control for input devices, of which pointing device (or mouse) 1316 and keyboard 1317 are illustrated. I/O controller 1315 may also provide connectivity and control for output devices, of which display 1318 is illustrated. Additionally, a multimedia drive 1319 (e.g., compact disk read/write (CDRW) or digital video disk (DVD) drive) and USB (universal serial bus) port 1320 are illustrated, and may be coupled to I/O controller 1315. Multimedia drive 1319 and USB port 1320 may enable insertion of a removable storage device (e.g., optical disk or "thumb" drive) on which data/instructions/code may be stored and/or from which data/instructions/code may be retrieved. MCD 1300 may also include storage 1322, within/from which data/instructions/code may also be stored/retrieved. MCD 1300 may further include a global positioning system (GPS) or local position system (LPS) detection component 1324 by which MCD 1300 may be able to detect its current location (e.g., a geographical position) and movement of MCD 1300, in real time. MCD 1300 may include a network/communication interface 1325, by which MCD 1300 may connect to one or more second communication devices 1332 or to wireless service provider server 1337, or to a third party server 1338 via one or more access/external communication networks, of which a wireless Communication Network 1330 is provided as one example and the Internet 1336 is provided as a second example. It is appreciated that MCD 1300 may connect to third party server 1338 through an initial connection with Communication Network 1330, which in turn may connect to third party server 1338 via the Internet 1336.

In addition to the above described hardware components of MCD 1300, various features of the described embodiments may be completed/supported via software (or firmware) code or logic stored within system memory 1306 or other storage (e.g., storage 1322) and may be executed by CPU 1302. Thus, for example, illustrated within system memory 1306 are a number of software/firmware/logic components, including operating system (OS) 1308 (e.g., Microsoft Windows® or Windows Mobile®, trademarks of Microsoft Corp, or GNU®/Linux®, registered trademarks of the Free Software Foundation and The Linux Mark Institute, and AIX®, registered trademark of International Business Machines), and (word processing and/or other) application(s) 1309. Also illustrated are a plurality (four illustrated) software implemented utilities, each providing different one of the various functions (or advanced features) described herein. Including within these various functional utilities are: Simultaneous Text Waiting (STW) utility 1311, Dynamic Area Code Pre-pending (DACP) utility 1312, Advanced Editing and Interfacing (AEI) utility 1312 and Safe Texting Device Usage (STDU) utility 1314. In actual implementation and for simplicity in the following descriptions, each of these different functional utilities are assumed to be packaged together as sub-components of a general MCD utility 1310, and the various utilities are interchangeably referred to as MCD utility 1310 when describing the utilities within the figures and claims. For simplicity, the following description will refer to a single utility, namely MCD utility 1310. MCD utility 1310 may, in some embodiments, be combined with one or more other software modules, including for example, word processing application(s) 1309 and/or OS 1308 to provide a single executable component, which then may provide the collective functions of each individual software component when the corresponding combined code of the single executable component is executed by CPU 1302. Each separate utility 111/112/113/114 is illustrated and described as a standalone or separate software/firmware component/module, which provides specific functions, as described below. As a standalone component/module, MCD utility 1310 may be acquired as an off-the-shelf or after-market or downloadable enhancement to existing program applications or device functions, such as voice call waiting functionality (not shown) and user interactive applications with editable content, such as, for example, an application within the Windows Mobile® suite of applications. In at least one implementation, MCD utility 1310 may be downloaded from a server or website of a wireless provider (e.g., wireless service provider server 1337) or a third party server 1338, and either installed on MCD 1300 or executed from the wireless service provider server 1337 or third party server 1313.

CPU 1302 may execute MCD utility 1310 as well as OS 1308, which, in one embodiment, may support the user interface features of MCD utility 1310, such as generation of a graphical user interface (GUI), where required/supported within MCD utility code. In several of the described embodiments, MCD utility 1310 may generate/provide one or more GUIs to enable user interaction with, or manipulation of, functional features of MCD utility 1310 and/or of MCD 1300. MCD utility 1310 may, in certain embodiments, enable certain hardware and firmware functions and may thus be generally referred to as MCD logic.

Some of the functions supported and/or provided by MCD utility 1310 may be enabled as processing code/instructions/logic executing on DSP/CPU 1302 and/or other device hardware, and the processor thus may complete the implementation of those function(s). Among, for example, the software code/instructions/logic provided by MCD utility 1310, and which are specific to some of the described embodiments of the invention, may be code/logic for performing several (one or a plurality) of the following functions: (1) Simultaneous texting during ongoing voice communication providing a text waiting mode for both single number mobile communication devices and multiple number mobile communication devices; (2) Dynamic area code determination and automatic back-filling of area codes when a requested/desired voice or text communication is initiated without the area code while the mobile communication device is outside of its home-base area code toll area; (3) Enhanced editing functionality for applications on mobile computing devices; (4) Automatic toggle from manual texting mode to voice-to-text based communication mode on detection of high velocity movement of the mobile communication device; and (5) Enhanced e-mail notification system providing advanced e-mail notification via (sender or recipient directed) texting to a mobile communication device.

Utilizing monolithic 3D IC technology described herein and in related application Ser. Nos. 12/903,862, 12/903,847, 12/904,103 and 13/041,405 significant power and cost could be saved. Most of the elements in MCD 1300 could be integrated in one 3D IC. Some of the MCD 1300 elements may be logic functions which could utilize monolithic 3D transistors such as, for example, RCAT, finfet, or Gate-Last. Some of the MCD 1300 elements are storage devices and could be integrated on a 3D non-volatile memory device, such as, for example, 3D NAND or 3D RRAM, or volatile memory such as, for example, 3D DRAM or SRAM formed from RCAT or gate-last transistors, as been described herein. Storage 1322 elements formed in monolithic 3D could be integrated on top or under a logic layer to reduce power and space. Keyboard 1317 could be integrated as a touch screen or combination of image sensor and some light projection and could utilize structures described in some of the above mentioned related applications. The network/communication interface 1325 could utilize another layer of silicon optimized for RF and gigahertz speed analog circuits or even may be integrated on substrates, such as GaN, that may be a better fit for such circuits. As more and more transistors might be integrated to achieve a high complexity 3D IC system there might be a need to use some embodiments of the invention such as what were called repair and redundancy so to achieve good product yield.

Some of the system elements including non-mobile elements, such as the 3rd Party Server 1338, might also make use of some embodiments of the 3D IC inventions including repair and redundancy to achieve good product yield for high complexity and large integration. Such large integration may reduce power and cost of the end product which is most attractive and most desired by the system end-use customers.

Some embodiments of the 3D IC invention could be used to integrate many of the MCD 1300 blocks or elements into one or a few devices. As various blocks get tightly integrated, much of the power required to transfer signals between these elements may be reduced and similarly costs associated with these connections may be saved. Form factor may be compacted as the space associated with the individual substrate and the associated connections may be reduced by use of some embodiments of the 3D IC invention. For mobile device these may be very important competitive advantages. Some of these blocks might be better processed in different process flow or wafer fab location. For example the DSP/CPU 1302 is a logic function that might use a logic process flow while the storage 1322 might better be done using a NAND Flash technology process flow or wafer fab. An important advantage of some of the embodiments of the monolithic 3D inventions may be to allow some of the layers in the 3D structure to be processed using a logic process flow while another layer in the 3D structure might utilize a memory process flow, and then some other function the modems of the GPS or local position system (LPS) detection component 1324 might use a high speed analog process flow or wafer fab. As those diverse functions may be structured in one device onto many different layers, these diverse functions could be very effectively and densely vertically interconnected.

FIG. 14A-D describes an embodiment of the invention, wherein sub-400° C. process steps may be utilized to form the shallow trench isolation (STI) regions that enable high quality oxide isolation between transistors and circuit elements. A high quality isolation, typically formed with oxide, between active transistor junctions may have a leakage current of less than 1 picoamp per micron at Vcc and 25° C., Vcc being the nominal power supply voltage. The process flow for the integrated circuit or structure may include the following steps that may occur in sequence from Step (A) to Step (D). When the same reference numbers are used in different drawing figures (for example, among FIG. 14A-D), they are used to indicate analogous, similar or identical structures to enhance the understanding of the present invention by clarifying the relationships between the structures and embodiments presented in the various diagrams—particularly in relating analogous, similar or identical functionality to different physical structures.

As illustrated in FIG. 14A (Step A), a silicon wafer 1402 suitable for integrated circuit or structure formation may be constructed.

As illustrated in FIG. 14B (Step B), a silicon nitride layer may be formed on top of silicon wafer 1402 using a process such as chemical vapor deposition (CVD) and may then be lithographically patterned. Following this, an etch process removing the regions of silicon nitride and the silicon wafer 1402 may be conducted to form trench 1410 and silicon nitride regions 1406. The silicon region 1408 may remain after these process steps. A silicon oxide (not shown) may be utilized as a stress relief layer between the silicon nitride regions 1406 and silicon wafer 1402. Etch resistant materials, such as, for example, amorphous carbon, may be utilized in place of or in addition to the silicon nitride layer and subsequently formed silicon nitride regions 1406.

As illustrated using FIG. 14C (Step C), a plasma-assisted radical thermal oxidation process, which has a process temperature typically less than about 400° C., may be conducted to form the oxide region 1412. The silicon nitride regions 1406 may prevent the silicon nitride covered surfaces of silicon region 1408 from becoming oxidized during this process. This high electron density plasma-assisted radical thermal oxidation process may repair some or all of the damages from the etch process of FIG. 14B.

As illustrated in FIG. 14D (Step D), an oxide fill material, such as, for example, a high-density plasma (HDP) process that produces dense oxide layers at low temperatures, less than about 400° C. Depositing a dense oxide avoids the requirement for a densification anneal that would need to be conducted at a temperature greater than about 400° C. A chemical mechanical polish (CMP) may be conducted to planarize the surface. Silicon nitride regions 1406 may be removed either with a CMP process or with a selective etch, such as hot phosphoric acid. The oxide fill layer after the CMP process is indicated as STI oxide fill 1414.

The process described using FIG. 14A-D can be conducted at less than 400° C., and this is advantageous for many 3D stacked architectures.

An additional embodiment of the invention is to utilize the underlying interconnection layer or layers to provide connections and connection paths for the overlying transistors. While the common practice in the IC industry is that interconnection layers are overlaying the transistors that they connect, the 3D IC technology may include the possibility of constructing connections underneath (below) the transistors as well. For example, some of the connections to, from, and in-between transistors in a layer of transistors may be provided by the interconnection layer or layers above the transistor layer; and some of the connections to, from, and in-between the transistors may be provided by the interconnection layer or layers below the transistor layer or layers. In general there is an advantage to have the interconnect closer to the transistors that they are connecting and using both sides of the transistors—both above and below—provides enhanced "closeness" to the transistors. In addition, there may be less interconnect routing congestion that would impede the efficient or possible connection of a transistor to transistors in other layers and to other transistors in the same layer.

The connection layers may, for example, include power delivery, heat removal, macro-cell connectivity, and routing between macro-cells. As illustrated in FIG. 15A-D, an exemplary illustration and description of connections below a layer of transistors and macro-cell formation and connection is shown. When the same reference numbers are used in different drawing figures (among FIGS. 15A-D), they may indicate analogous, similar or identical structures to enhance the understanding of the embodiments of the invention being discussed by clarifying the relationships between the structures and embodiments presented in the various diagrams—particularly in relating analogous, similar or identical functionality to different physical structures. The term macro-cell may include one or more logic cells.

Figure 15A:
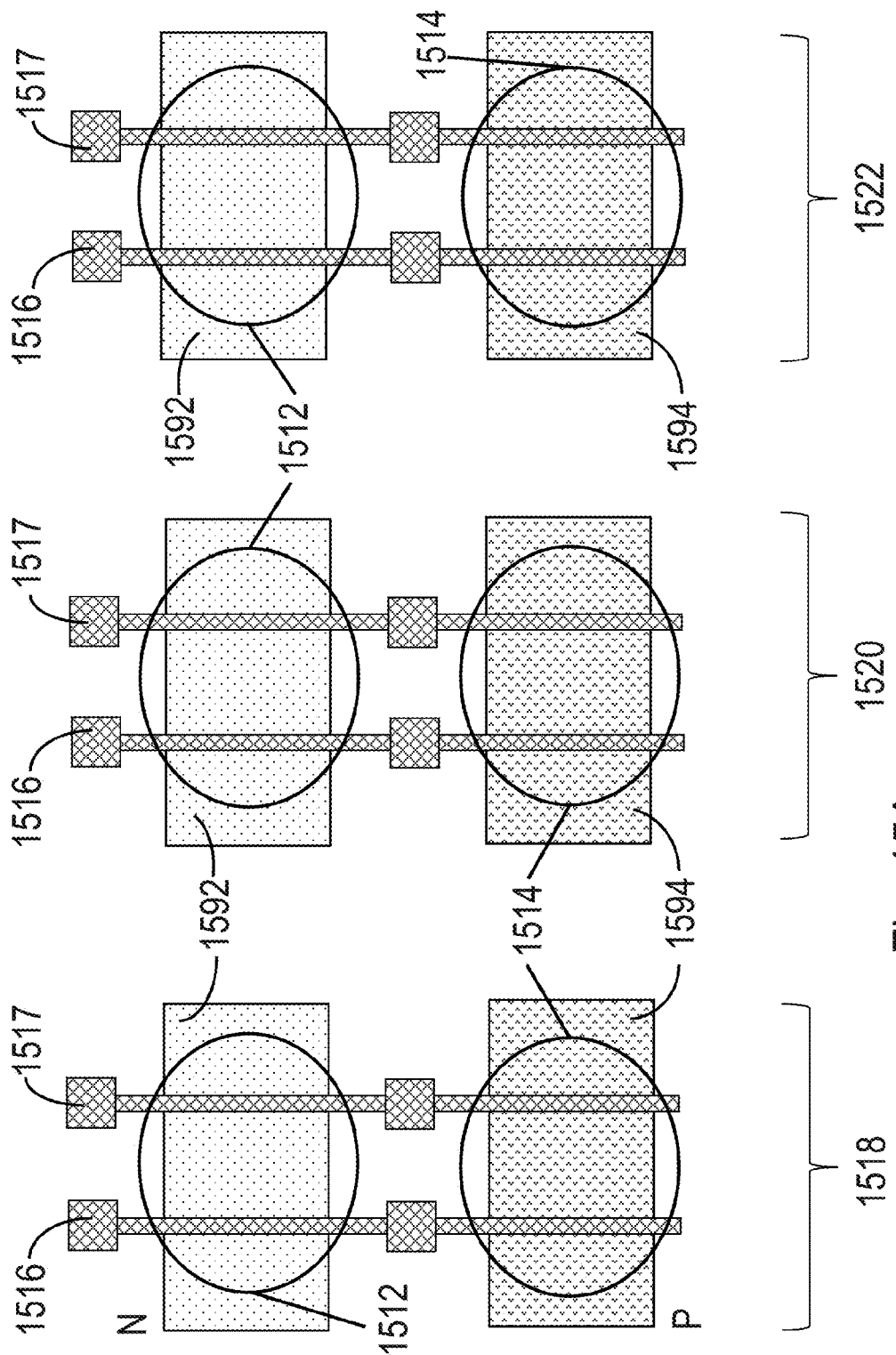
FIG. 15A-15D are exemplary drawing illustrations of layers of connections below a layer of transistors and macro-cell formation.

As illustrated in FIG. 15A, a repeating device or circuit structure, such as, for example, a gate-array like transistor structure, may be constructed in a layer, such as for example, monocrystalline silicon, as described elsewhere herein and in U.S. Patent Application Publication No. 20110121366, whose contents are incorporated by reference. FIG. 15A is an exemplary illustration of the top view of three of the repeating elements of the structure layer. The exemplary repeating elements of the structure may include a first element 1518, a second element 1520, and a third element 1522, and each element may include two transistor pairs, for example, N transistor pair 1512 and P transistor pair 1514. N transistor pair 1512 may include common diffusion 1592 and a portion of common gate 1516 and second common gate 1517. P transistor pair 1514 may include common diffusion 1594 and a portion of common gate 1516 and second common gate 1517. The structure of FIG. 15A can represent a small section of a gate-array in which the structure keeps repeating.

Figure 15B:
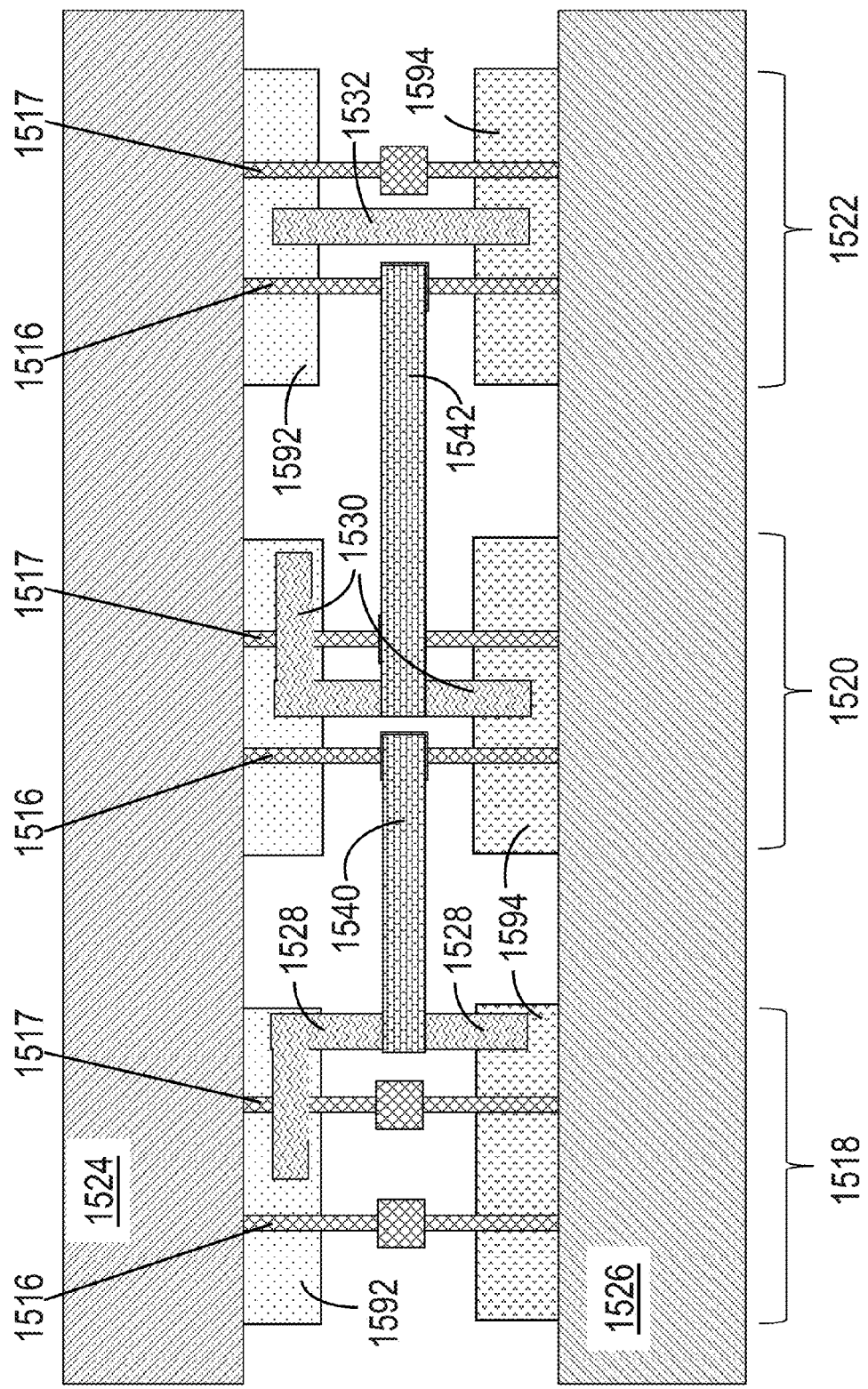

As illustrated in FIG. 15B, the interconnection layers underneath (below) the transistors of FIG. 15A may be constructed to provide connections (along with the vias of FIG. 15C) between the transistors of FIG. 15A. Underneath (below) the transistors may be defined as being in the direction of the TLVs (thru Layer Vias) or TSVs (Thru Silicon Vias) that are going through the layer of transistor structures and transistors referred to in the FIG. 15A discussion. The view of exemplary illustration FIG. 15B is from below the interconnection layers which are below the repeating device or circuit structure; however, the orientation of the repeating device or circuit structure is kept the same as FIG. 15A for clarity. The interconnection layers underneath may include a ground-'Vss' power grid 1524 and a power-'Vdd' power grid 1526. The interconnection layers underneath may include macro-cell construction connections such as NOR gate macro-cell connection 1528 for a NOR gate cell formation formed by the four transistors of first element 1518, NAND gate macro-cell connection 1530 for a NAND gate cell formation formed by the four transistors of second element 1520, and Inverter macro-gate cell connection 1532 for an Inverter gate cell formation formed by two of the four transistors of third element 1522. The interconnection layers may include routing connection 1540 which connects the output of the NOR gate of first element 1518 to the input of the NAND gate of second element 1520, and additional routing connection 1542 which connects the output of the NAND gate of second element 1520 to the input of the inverter gate of third element 1522. These macro-cells and the routing connections (or routing structures) are part of the logic cell and logic circuit construction. The connection material may include for example, copper, aluminum, and/or conductive carbon.

Figure 15C:
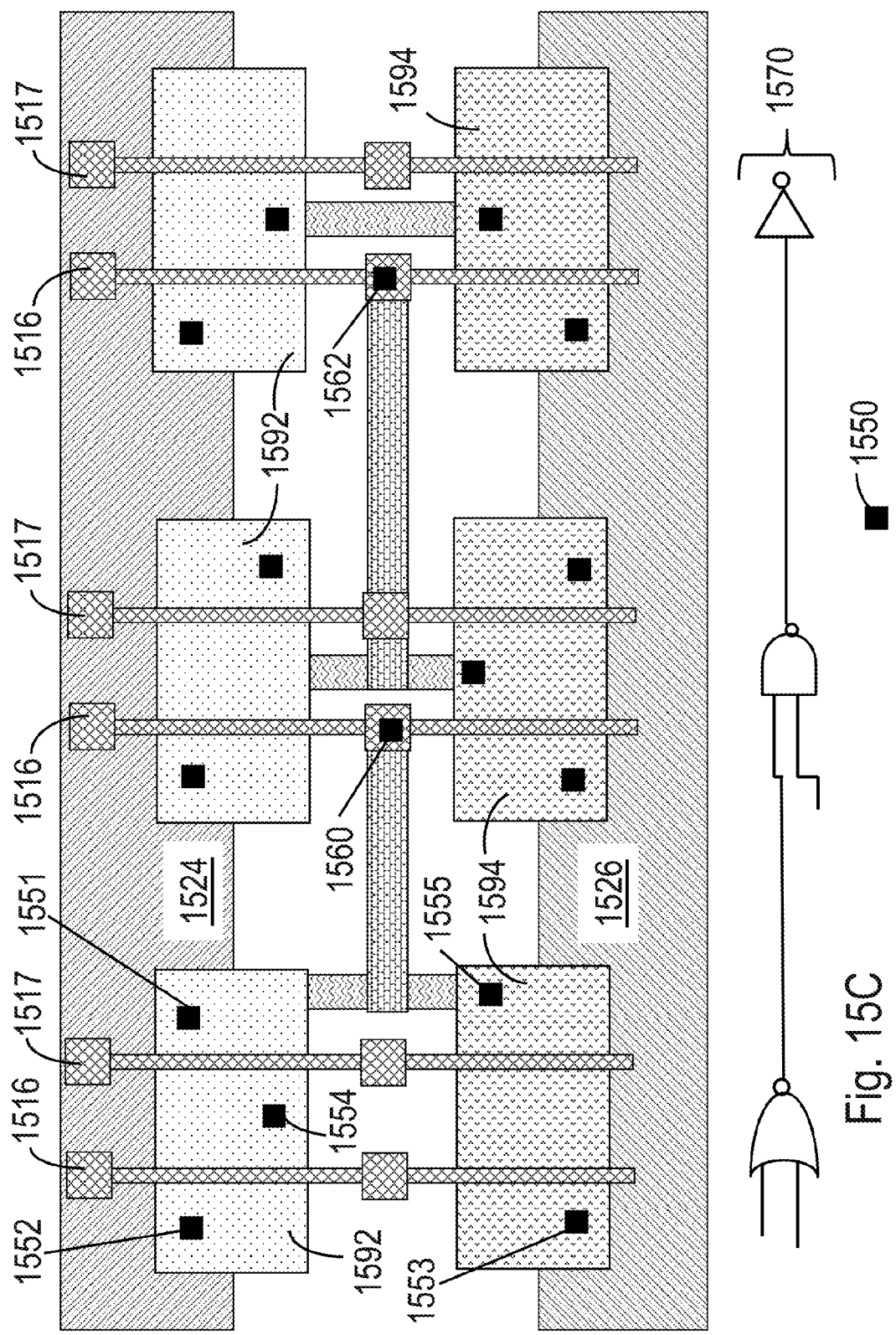

As illustrated in FIG. 15C, generic connections 1550 may be formed to electrically connect the transistors of FIG. 15A to the underlying connection layer or layers presented in FIG. 15B. Generic connections 1550 may also be called contacts as they represent the contact made between the interconnection layers and the transistors themselves, and may also be called TLVs (Thru Layer Vias), as described elsewhere herein. The diameter of the connections, such as, for example, generic connections 1550, may be less than 1 um and/or less than 100 nm, and the alignment of the connections to the underlying interconnection layer or layers or to the transistors may be less than 40 nm or even less than 10 nm using conventional industry lithography tools.

The process flow may involve first processing the connection layers such as presented in FIG. 15B and then overlying these connection layers by a transistor layer such as presented in FIG. 15A. These monolithic 3D transistors in the transistor layer could be made by any of the techniques presented herein or other techniques. After that the connections between the transistors and the underlying connection layers may be processed. For example, as illustrated in FIG. 15C generic connections 1550 may be specifically employed as power grid connections, such as Vss connection 1552 and second Vss connection 1551, and Vdd connection 1553. Further, generic connections 1550 may be specifically employed as macro-cell connections, such as macro-cell connection 1554 and second macro-cell connection 1555. Moreover, generic connections 1550 may be specifically employed as connections to routing, such as, for example, routing connection 1560 and second routing connection 1562. FIG. 15C also includes an illustration of the logic schematic 1570 represented by the physical illustrations of FIG. 15A, FIG. 15B and FIG. 15C.

Figure 15D:
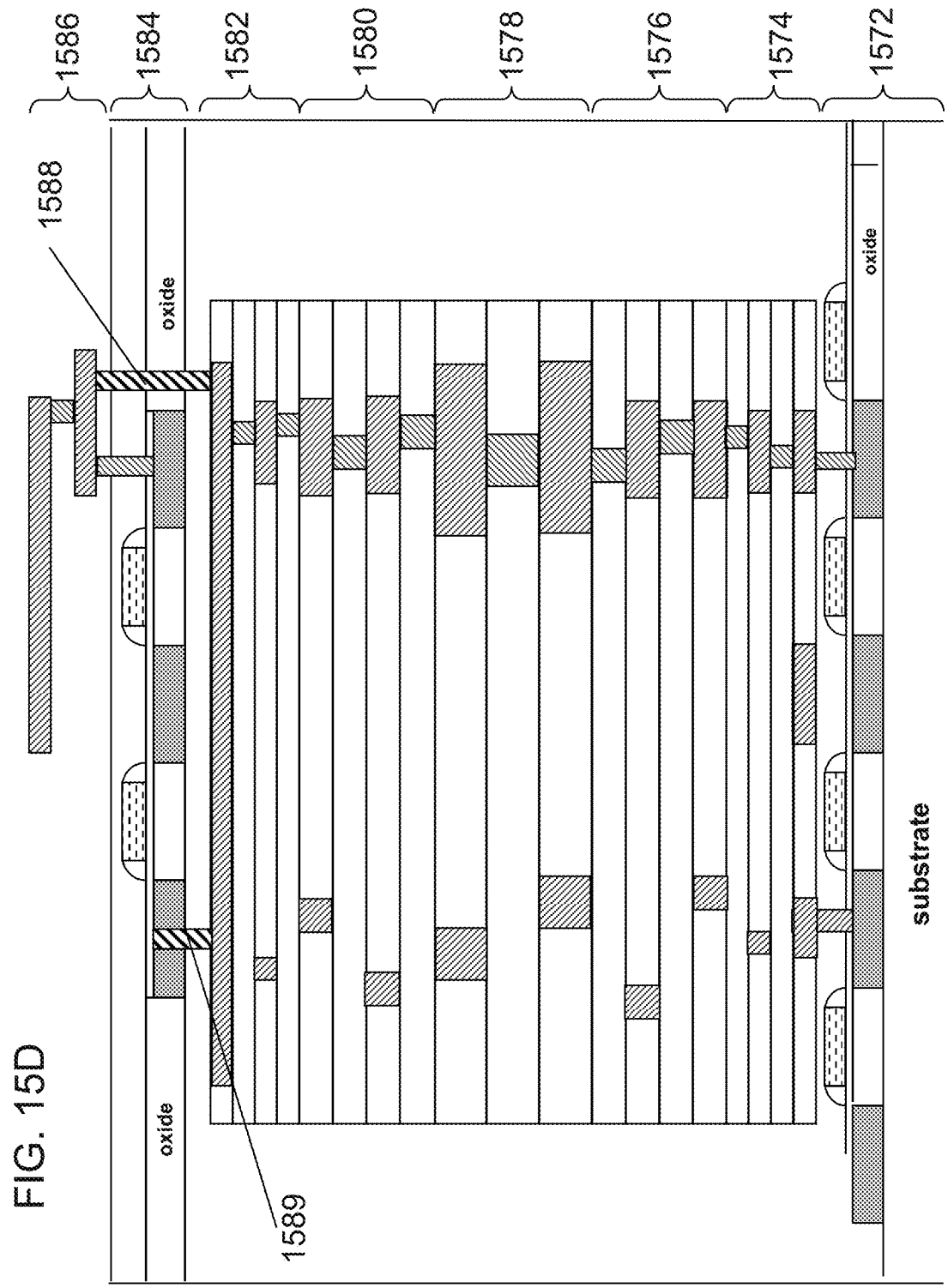

As illustrated in FIG. 15D, and with reference to the discussion of FIGS. 47A and 47B herein, thru silicon connection 1589, which may be the generic connections 1550 previously discussed, may provide connection from the transistor layer 1584 to the underlying interconnection layer 1582. Underlying interconnection layer 1582 may include one or more layers of '1×' thickness metals, isolations and spacing as described with respect to FIGS. 47A&B. Alternatively, thru silicon connection 1588, which may be the generic connections 1550 previously discussed, may provide connection from the transistor layer 1584 to the underlying interconnection layer 1582 by connecting to the above interconnection layer 1586 which connects to the transistor layer 1584. Further connection to the substrate transistor layer 1572 may utilize making a connection from underlying interconnection layer 1582 to 2× interconnection layer 1580, which may be connected to 4× interconnection layer 1578, which may be connected to substrate 2× interconnection layer 1576, which may be connected to substrate 1× interconnection layer 1574, which may connect to substrate transistor layer 1572. Underlying interconnection layer 1582, above interconnection layer 1586, 2× interconnection layer 1580, 4× interconnection layer 1578, substrate 2× interconnection layer 1576, and substrate 1× interconnection layer 1574 may include one or more interconnect layers, each of which may include metal interconnect lines, vias, and isolation materials. As described in detail in the FIGS. 47A&B of the incorporated reference U.S. Pat. No. 8,836,073 discussion, 1× layers may be thinner than 2× layers, and 2× layers may be thinner than 4× layers.

The design flow of a 3D IC that incorporates the "below-transistor" connections, such as are described for example, with respect to FIGS. 15A-D, would need to be modified accordingly. The chip power grid may need to be designed to include the below-transistors grid and connection of this grid to the overall chip power grid structure. The macro-cell library may need to be designed to include below-transistor connections. The Place and Route tool may need to be modified to make use of the below-transistor routing resources. These might include the power grid aspect, the macro-cell aspect, the allocation of routing resources underneath (below), and the number of layers underneath that are allocated for the routing task. Typically, at least two interconnection layers underneath may be allocated.

For the case of connecting below-transistor routing layers to the conventional above-transistor routing layers, each connection may pass through a generic connections 1550 to cross the transistor-forming layers. Such contacts may already exist for many nets that directly connect to transistor sources, drains, and gates; and hence, such nets can be relatively freely routed using both below- and above-transistors interconnection routing layers. Other nets that may not normally include generic connections 1550 in their structure may be routed on either side of the transistor layer but not both, as crossing the transistor layer will incur creating additional generic connections 1550; and hence, potentially congest the transistor layer.

Consequently, a good approach for routing in such a situation may be to use the below-transistor layers for short-distance wiring and for wiring library macros that tend to be short-distance by their nature. Macro outputs, on the other hand, frequently need to connect also to remote locations and hence should be available at contacts, such as generic connections 1550, to be used on both sides of the transistor layer. When routing, nets that are targeted for both below and above the transistor layer and that do not include contacts such as generic connections 1550 may need special prioritized handling that will split them into two or more parts and insert additional contact[s] in the transistor layer before proceeding to route the design. An additional advantage of the availability and use of an increased number of routing layers on both sides of the transistor layer is the router's greater ability to use relaxed routing rules while not increasing routing congestion. For example, relaxing routing rules such as wider traces, wherein 1.5× or more the width of those traces used for the same layer in one sided routing for the same process node could be utilized in the two sided routing (above and below transistor layer), any may result in reduced resistance; and larger metal spacing, wherein 1.5× or more the space of those spaces used for the same layer in one sided routing for the same process node, could be utilized in the two sided routing (above and below transistor layer), and may result in decreased crosstalk and capacitance.

Persons of ordinary skill in the art will appreciate that the illustrations in FIGS. 15A through 15C are exemplary only and are not drawn to scale. Such skilled persons will further appreciate that many variations are possible such as, for example, the interconnection layer or layer below or above the transistor layer may also be utilized for connection to other strata and transistor layers, not just the transistor layer that is between the above and below interconnection layer or layers. Furthermore, connections made directly underneath and to common diffusions, such as common diffusion 1592 and second common diffusion 1594 (and described, for example, in relation to FIG. 20P of the incorporated reference U.S. Pat. No. 8,836,073), may be problematic in some process flows and TLVs through the adjacent STI (shallow trench isolation) area with routing thru the first layer of interconnect above the transistor layer to the TLV may instead be utilized. Moreover, silicon connection 1589 may be more than just a diffusion connection such as Vss connection 1552, second Vss connection 1551, and Vdd connection 1553, such as, for example, macro-cell connection 1554, second macro-cell connection 1555, routing connection 1560, or second routing connection 1562. Furthermore, substrate transistor layer 1572 may also be a transistor layer above a lower transistor layer in a 3DIC stack. Many other modifications within the scope of the invention will suggest themselves to such skilled persons after reading this specification. Thus the invention is to be limited only by the appended claims.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

What is claimed is:

1. An Integrated Circuit device, comprising:
a first layer comprising first transistors; and
a second layer comprising second transistors overlaying said first layer,
wherein said first transistors are facing down and said second transistors are facing up, and
wherein said second layer comprises a through layer via of less than 300 nm diameter, and
wherein said second transistors are aligned to said first transistors with a less than 40 nm alignment error.

2. An Integrated Circuit device according to claim 1, wherein said second layer thickness is less than 2 microns.

3. An Integrated Circuit device according to claim 1, wherein said second layer comprises a region of oxide isolation, and
wherein said oxide isolation has a leakage current of less than one picoamp per micron at a device power supply voltage of 1.5 and at 25° C.

4. An Integrated Circuit device according to claim 1, wherein at least one of said second transistors is a FinFET transistor.

5. An Integrated Circuit device according to claim 1, wherein at least one of said second transistors is a fully depleted transistor.

6. An Integrated Circuit device according to claim 1, wherein at least one of said second transistors is a high-k metal gate transistor.

7. An Integrated Circuit device, comprising:
a first layer comprising first transistors;
a second layer comprising second transistors overlaying said first layer; and
a first metal layer providing interconnection for said first transistors, said first metal layer is disposed either between said first layer and said second layer, or underneath said first layer,
wherein said first metal layer comprises mostly aluminum or copper,
wherein at least one of said second transistors is aligned to said first transistor with a less than 40 nm alignment error,
wherein said second layer comprises a region of high quality oxide isolation, and
wherein said oxide isolation has a leakage current of less than one picoamp per micron at a device power supply voltage of 1.5 and at 25° C.

8. An Integrated Circuit device according to claim 7, wherein said first transistors are facing down and said second transistors are facing up.

9. An Integrated Circuit device according to claim 7, wherein said second layer thickness is less than 2 microns.

10. An Integrated Circuit device according to claim 7, wherein said second layer comprises at least one through layer via of less than 300 nm diameter.

11. An Integrated Circuit device according to claim 7, wherein at least one of said second transistors is a fully depleted transistor.

12. An Integrated Circuit device according to claim 7, wherein at least one of said second transistors is a high-k metal gate transistor.

13. An Integrated Circuit device, comprising:
a first layer comprising first transistors;
a second layer comprising second transistors overlaying said first layer; and
a first metal layer providing interconnection for said first transistors, said first metal layer is disposed either between said first layer and said second layer or underneath said first layer,
wherein said first metal layer comprises mostly aluminum or copper,
wherein at least one of said second transistors is aligned to said first transistor with a less than 40 nm alignment error, and
wherein said second transistor comprises silicided contacts.

14. An Integrated Circuit device according to claim 13, wherein said second layer comprises at least one through layer via of less than 300 nm diameter.

15. An Integrated Circuit device according to claim 13, wherein said first transistors are facing down and said second transistors are facing up.

16. An Integrated Circuit device according to claim 13, wherein at least one of said second transistors is a high-k metal gate transistor.

17. An Integrated Circuit device according to claim 13, wherein at least one of said second transistors is a FinFET transistor.

18. An Integrated Circuit device according to claim 13, wherein at least one of said second transistors is a fully depleted transistor.

19. An Integrated Circuit device according to claim 13, wherein said second layer comprises a region of oxide isolation, and
wherein said oxide isolation has a leakage current of less than one picoamp per micron at a device power supply voltage of 1.5 and at 25° C.

* * * * *